United States Patent
Kamada et al.

(10) Patent No.: US 12,219,862 B2
(45) Date of Patent: Feb. 4, 2025

(54) DISPLAY UNIT, DISPLAY MODULE, AND ELECTRONIC DEVICE

(71) Applicant: Semiconductor Energy Laboratory Co., Ltd., Atsugi (JP)

(72) Inventors: Taisuke Kamada, Niiza (JP); Ryo Hatsumi, Hadano (JP); Daisuke Kubota, Atsugi (JP); Naoaki Hashimoto, Sagamihara (JP); Tsunenori Suzuki, Yokohama (JP); Harue Osaka, Atsugi (JP); Satoshi Seo, Sagamihara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/592,944

(22) Filed: Mar. 1, 2024

(65) Prior Publication Data
US 2024/0206306 A1 Jun. 20, 2024

Related U.S. Application Data

(63) Continuation of application No. 18/134,638, filed on Apr. 14, 2023, now Pat. No. 11,963,430, which is a (Continued)

(30) Foreign Application Priority Data

Jul. 5, 2019 (JP) .................................. 2019-126332

(51) Int. Cl.
*H10K 65/00* (2023.01)
*H10K 39/32* (2023.01)
(Continued)

(52) U.S. Cl.
CPC ............. *H10K 65/00* (2023.02); *H10K 39/32* (2023.02); *H10K 50/16* (2023.02); *H10K 50/17* (2023.02);
(Continued)

(58) Field of Classification Search
CPC ........ H10K 65/00; H10K 39/32; H10K 50/16; H10K 50/17; H10K 50/865; H10K 59/12;
(Continued)

(56) References Cited

U.S. PATENT DOCUMENTS

| 5,107,175 A | 4/1992 | Hirano et al. |
| 5,124,204 A | 6/1992 | Yamashita et al. |

(Continued)

FOREIGN PATENT DOCUMENTS

| CN | 101676615 A | 3/2010 |
| CN | 109309105 A | 2/2019 |

(Continued)

OTHER PUBLICATIONS

Reineke.S et al., "White organic light-emitting diodes with fluorescent tube efficiency", Nature, May 14, 2009, vol. 459, pp. 234-239.

(Continued)

*Primary Examiner* — S M Sohel Imtiaz
(74) *Attorney, Agent, or Firm* — Eric J. Robinson; Robinson Intellectual Property Law Office, P.C.

(57) ABSTRACT

An object is to provide a highly reliable display unit having a function of sensing light. The display unit includes a light-receiving device and a light-emitting device. The light-receiving device includes an active layer between a pair of electrodes. The light-emitting device includes a hole-injection layer, a light-emitting layer, and an electron-transport layer between a pair of electrodes. The light-receiving device and the light-emitting device share one of the electrodes, and may further share another common layer (Continued)

between the pair of electrodes. The hole-injection layer is in contact with an anode and contains a first compound and a second compound. The electron-transport property of the electron-transport layer is low; hence, the light-emitting layer is less likely to have excess electrons. Here, the first compound is the material having a property of accepting electrons from the second compound.

11 Claims, 30 Drawing Sheets

Related U.S. Application Data continuation of application No. 16/914,530, filed on Jun. 29, 2020, now Pat. No. 11,659,758.

(51) Int. Cl.
| | |
|---|---|
| *H10K 50/16* | (2023.01) |
| *H10K 50/17* | (2023.01) |
| *H10K 50/86* | (2023.01) |
| *H10K 59/12* | (2023.01) |
| *H10K 59/40* | (2023.01) |
| *H10K 101/30* | (2023.01) |

(52) U.S. Cl.
CPC .......... *H10K 50/865* (2023.02); *H10K 59/12* (2023.02); *H10K 59/40* (2023.02); *H10K 2101/30* (2023.02)

(58) Field of Classification Search
CPC .... H10K 59/40; H10K 2101/30; H10K 30/40; H10K 39/34
See application file for complete search history.

(56) References Cited

U.S. PATENT DOCUMENTS

| | | | |
|---|---|---|---|
| 5,189,405 A | 2/1993 | Yamashita et al. |
| 5,315,377 A | 5/1994 | Isono et al. |
| 5,317,349 A | 5/1994 | Vanderwerf |
| 5,686,360 A | 11/1997 | Harvey, III et al. |
| 5,693,956 A | 12/1997 | Shi et al. |
| 5,757,126 A | 5/1998 | Harvey, III et al. |
| 5,771,562 A | 6/1998 | Harvey, III et al. |
| 5,811,177 A | 9/1998 | Shi et al. |
| 5,952,778 A | 9/1999 | Haskal et al. |
| 5,962,962 A | 10/1999 | Fujita et al. |
| 6,146,225 A | 11/2000 | Sheats et al. |
| 6,150,187 A | 11/2000 | Zyung et al. |
| 6,198,217 B1 | 3/2001 | Suzuki et al. |
| 6,198,220 B1 | 3/2001 | Jones et al. |
| 6,219,113 B1 | 4/2001 | Takahara |
| 6,268,695 B1 | 7/2001 | Affinito |
| 6,274,887 B1 | 8/2001 | Yamazaki et al. |
| 6,413,645 B1 | 7/2002 | Graff et al. |
| 6,771,021 B2 | 8/2004 | Cok |
| 6,847,163 B1 | 1/2005 | Tsutsui et al. |
| 6,965,195 B2 | 11/2005 | Yamazaki et al. |
| 6,987,613 B2 | 1/2006 | Pocius et al. |
| 7,182,481 B2 | 2/2007 | Shimura |
| 7,202,504 B2 | 4/2007 | Ikeda et al. |
| 7,245,429 B2 | 7/2007 | Yoshikawa et al. |
| 7,473,928 B1 | 1/2009 | Yamazaki et al. |
| 7,554,263 B2 | 6/2009 | Takahashi |
| 7,663,312 B2 | 2/2010 | Anandan |
| 7,692,199 B2 | 4/2010 | Arai |
| 7,722,965 B2 | 5/2010 | Juni et al. |
| 7,755,097 B2 | 7/2010 | Kim |
| 7,859,627 B2 | 12/2010 | Nishida et al. |
| 7,956,349 B2 | 6/2011 | Tsutsui et al. |
| 8,003,993 B2 | 8/2011 | Cho et al. |
| 8,004,003 B2 | 8/2011 | Kim |
| 8,042,975 B2 | 10/2011 | Shyu et al. |
| 8,496,341 B2 | 7/2013 | Kawata et al. |
| 8,686,630 B2 | 4/2014 | Hiyama et al. |
| 8,853,724 B2 | 10/2014 | Seo et al. |
| 2001/0035713 A1 | 11/2001 | Kimura |
| 2001/0053082 A1 | 12/2001 | Chipalkatti et al. |
| 2003/0007359 A1* | 1/2003 | Sugawara ................. F21V 5/00 362/326 |
| 2004/0217702 A1 | 11/2004 | Garner et al. |
| 2005/0142379 A1* | 6/2005 | Juni ..................... G02B 5/0278 428/323 |
| 2005/0199599 A1 | 9/2005 | Li et al. |
| 2005/0258436 A1 | 11/2005 | Arai |
| 2006/0007552 A1 | 1/2006 | Takakuwa et al. |
| 2006/0139953 A1 | 6/2006 | Chou et al. |
| 2006/0188746 A1 | 8/2006 | Iou |
| 2006/0237735 A1 | 10/2006 | Naulin et al. |
| 2006/0263636 A1* | 11/2006 | Ohsawa ................. H01L 51/009 428/917 |
| 2007/0222372 A1 | 9/2007 | Cok et al. |
| 2008/0018231 A1 | 1/2008 | Hirakata |
| 2008/0121918 A1 | 5/2008 | Denbaars et al. |
| 2008/0129184 A1 | 6/2008 | Nishida et al. |
| 2008/0129933 A1 | 6/2008 | Nishida et al. |
| 2008/0130122 A1 | 6/2008 | Egi et al. |
| 2008/0203893 A1* | 8/2008 | Sakai ....................... H01J 1/63 313/582 |
| 2008/0213931 A1 | 9/2008 | Asabe |
| 2008/0252223 A1* | 10/2008 | Toyoda ................ G09G 3/3225 315/169.3 |
| 2009/0008628 A1* | 1/2009 | Choi ..................... B82Y 20/00 257/E29.094 |
| 2009/0162623 A1 | 6/2009 | Foresti et al. |
| 2009/0267092 A1 | 10/2009 | Fukshima et al. |
| 2010/0006882 A1 | 1/2010 | Arai |
| 2010/0013372 A1 | 1/2010 | Oikawa et al. |
| 2010/0019664 A1 | 1/2010 | Mishima |
| 2010/0046236 A1 | 2/2010 | Nishiwaki |
| 2010/0090234 A1 | 4/2010 | Cho et al. |
| 2010/0110551 A1 | 5/2010 | Lamansky et al. |
| 2010/0295443 A1 | 11/2010 | Roberts et al. |
| 2011/0038028 A1 | 2/2011 | Dharmatilleke |
| 2011/0127510 A1 | 6/2011 | Seo et al. |
| 2011/0134647 A1 | 6/2011 | Nishida et al. |
| 2011/0147777 A1 | 6/2011 | Konno et al. |
| 2011/0205468 A1 | 8/2011 | Hirakata et al. |
| 2011/0210332 A1 | 9/2011 | Jintyou et al. |
| 2012/0097982 A1 | 4/2012 | Wakimoto et al. |
| 2012/0097991 A1 | 4/2012 | Ikeda et al. |
| 2012/0099331 A1 | 4/2012 | Yamazaki et al. |
| 2012/0126268 A1 | 5/2012 | Seo et al. |
| 2012/0133273 A1 | 5/2012 | Inoue et al. |
| 2012/0194062 A1 | 8/2012 | Osaka et al. |
| 2012/0204566 A1 | 8/2012 | Hartzell et al. |
| 2012/0228588 A1 | 9/2012 | Mitsuya |
| 2013/0134408 A1* | 5/2013 | Yamazaki ................ H01L 51/52 257/40 |
| 2014/0350366 A1* | 11/2014 | Akiyama ............... H01L 27/288 600/328 |
| 2015/0014651 A1* | 1/2015 | Choi ................... H01L 51/0058 257/40 |
| 2015/0243892 A1 | 8/2015 | Ogita et al. |
| 2016/0093678 A1* | 3/2016 | Seo ....................... H01L 51/504 257/89 |
| 2016/0248033 A1 | 8/2016 | Uesaka et al. |
| 2017/0062734 A1 | 3/2017 | Suzuki et al. |
| 2017/0141337 A1* | 5/2017 | Hamade .............. H01L 51/0059 |
| 2017/0222156 A1 | 8/2017 | Kawakami et al. |
| 2018/0017818 A1 | 1/2018 | Yamazaki et al. |
| 2018/0033993 A1 | 2/2018 | Seo et al. |
| 2019/0065815 A1* | 2/2019 | Park ....................... H01L 27/288 |
| 2021/0327979 A1 | 10/2021 | Kamada et al. |
| 2022/0173174 A1 | 6/2022 | Hatsumi et al. |

FOREIGN PATENT DOCUMENTS

| | | |
|---|---|---|
| JP | 08-083688 A | 3/1996 |
| JP | 2002-289352 A | 10/2002 |
| JP | 2002-299039 A | 10/2002 |

(56) References Cited

FOREIGN PATENT DOCUMENTS

| | | |
|---|---|---|
| JP | 2006-065305 A | 3/2006 |
| JP | 2007-173424 A | 7/2007 |
| JP | 2008-010317 A | 1/2008 |
| JP | 2008-066027 A | 3/2008 |
| JP | 2008-098083 A | 4/2008 |
| JP | 2010-225975 A | 10/2010 |
| JP | 2011-040479 A | 2/2011 |
| JP | 2012-186392 A | 9/2012 |
| JP | 2014-197522 A | 10/2014 |
| JP | 2016-015423 A | 1/2016 |
| JP | 2016-066597 A | 4/2016 |
| JP | 2017-038079 A | 2/2017 |
| JP | 2017-208173 A | 11/2017 |
| JP | 2018-088521 A | 6/2018 |
| JP | 2018-190804 A | 11/2018 |
| WO | WO-2010/110034 | 9/2010 |

OTHER PUBLICATIONS

Taiwanese Office Action (Application No. 100141657) Dated Dec. 21, 2015.
Okachi.T et al., "Determination of Charge-Carrier Mobility in Organic Light-Emitting Diodes by Impedance Spectroscopy in Presence of Localized States", Jpn. J. Appl. Phys. (Japanese Journal of Applied Physics), Dec. 19, 2008, vol. 47, No. 12, pp. 8965-8972, the Japan Society of Applied Physics.

* cited by examiner

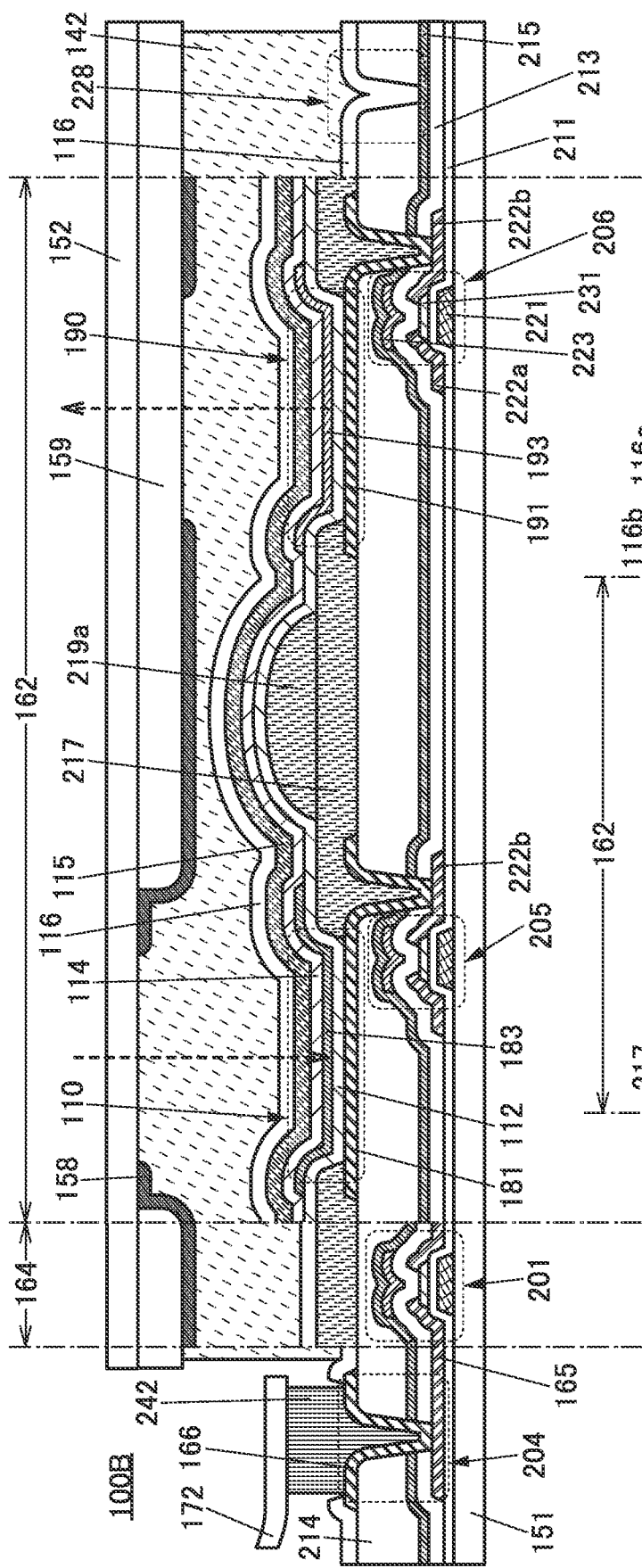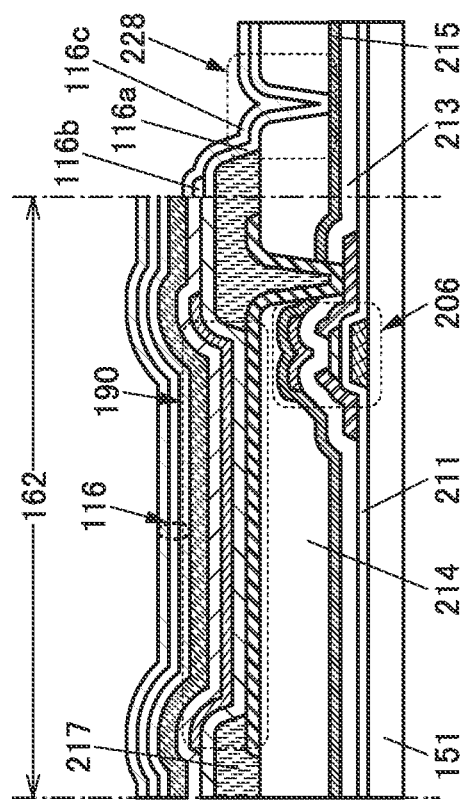

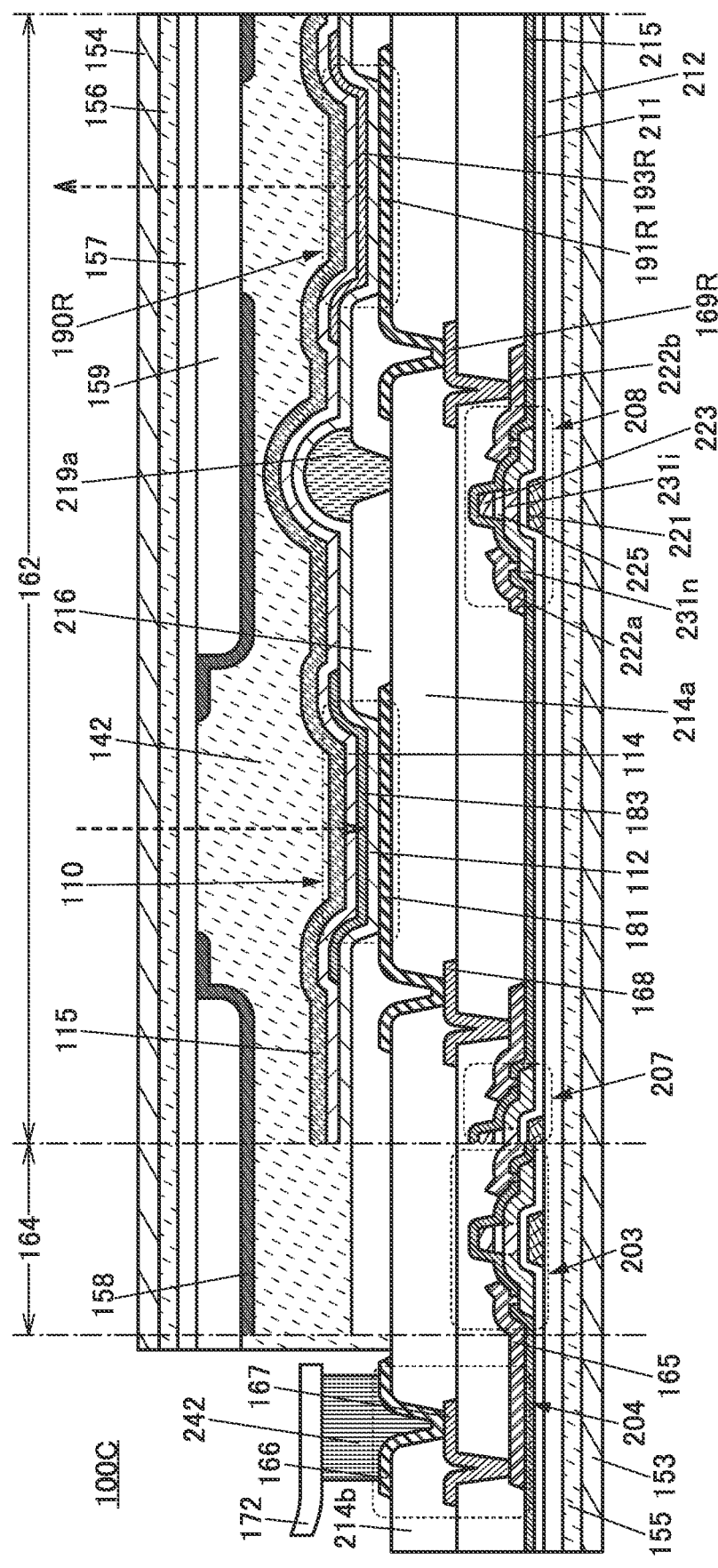

DISPLAY UNIT, DISPLAY MODULE, AND ELECTRONIC DEVICE

BACKGROUND OF THE INVENTION

1. Field of the Invention

One embodiment of the present invention relates to a display unit, a display module, and an electronic device. One embodiment of the present invention relates to a display unit including a light-receiving device (also referred to as a light-receiving element) and a light-emitting device (also referred to as a light-emitting element).

Note that one embodiment of the present invention is not limited to the above technical field. Examples of the technical field of one embodiment of the present invention include a semiconductor device, a display unit, a light-emitting unit, a power storage device, a memory device, an electronic device, a lighting device, an input device (such as a touch sensor), an input/output device (such as a touch panel), a method for driving any of them, and a method for manufacturing any of them.

2. Description of the Related Art

Recent display units have been expected to be applied to a variety of uses. Examples of uses for a large display unit include a television device for home use (also referred to as a TV or a television receiver), digital signage, and a public information display (PID). In addition, a smartphone and a tablet terminal including a touch panel are being developed as portable information terminals.

Light-emitting units including light-emitting devices have been developed as display units. Light-emitting devices utilizing electroluminescence (hereinafter referred to as EL; such devices are also referred to as EL devices or EL elements) have features such as ease of reduction in thickness and weight, high-speed response to input signals, and driving with low DC voltage, and have been used in display units. For example, Patent Document 1 discloses a flexible light-emitting unit using an organic EL device (also referred to as an organic EL element).

REFERENCE

[Patent Document 1] Japanese Published Patent Application No. 2014-197522

SUMMARY OF THE INVENTION

An object of one embodiment of the present invention is to provide a display unit having a function of sensing light. An object of one embodiment of the present invention is to provide a highly reliable display unit having a function of sensing light. An object of one embodiment of the present invention is to provide a highly convenient display unit. An object of one embodiment of the present invention is to provide a multifunctional display unit. An object of one embodiment of the present invention is to provide a display unit with high display quality. An object of one embodiment of the present invention is to provide a display unit having high light sensitivity. An object of one embodiment of the present invention is to provide a novel display unit.

Note that the description of these objects does not preclude the existence of other objects. One embodiment of the present invention does not need to achieve all these objects. Other objects can be derived from the descriptions of the specification, the drawings, and the claims.

One embodiment of the present invention is a display unit including a light-receiving device and a light-emitting device. The light-receiving device includes a first pixel electrode, an active layer, and a common electrode. The light-emitting device includes a second pixel electrode, a hole-injection layer, a light-emitting layer, an electron-transport layer, and the common electrode. The active layer is positioned over the first pixel electrode and contains a first organic compound. The light-emitting layer is positioned over the second pixel electrode and contains a second organic compound different from the first organic compound. The common electrode includes a portion overlapping with the first pixel electrode with the active layer therebetween, and a portion overlapping with the second pixel electrode with the light-emitting layer therebetween. The hole-injection layer is in contact with the anode, which is one of the second pixel electrode and the common electrode. The hole-injection layer contains a first compound and a second compound. The electron-transport layer contains an electron-transport material. The first compound has a property of accepting electrons from the second compound. The second compound has a HOMO level higher than or equal to −5.7 eV and lower than or equal to −5.4 eV. The electron-transport material has a HOMO level higher than or equal to −6.0 eV, and has an electron mobility higher than or equal to $1 \times 10^{-7}$ cm$^2$/Vs and lower than or equal to $5 \times 10^{-5}$ cm$^2$ when the square root of electric field strength [V/cm] is 600. The light-receiving device further preferably includes the hole-injection layer. It is preferred that the hole-injection layer be positioned over the first pixel electrode and the second pixel electrode, and include a portion overlapping with the active layer and a portion overlapping with the light-emitting layer.

One embodiment of the present invention is a display unit including a light-receiving device and a light-emitting device. The light-receiving device includes a first pixel electrode, an active layer, and a common electrode. The light-emitting device includes a second pixel electrode, a light-emitting layer, an electron-transport layer, and the common electrode. The active layer is positioned over the first pixel electrode and contains a first organic compound. The light-emitting layer is positioned over the second pixel electrode and contains a second organic compound different from the first organic compound. The common electrode includes a portion overlapping with the first pixel electrode with the active layer therebetween, and a portion overlapping with the second pixel electrode with the light-emitting layer therebetween. The electron-transport layer contains an electron-transport material and a first substance. The first substance is a metal, a metallic salt, a metal oxide, or an organometallic complex. The electron-transport layer includes a first region and a second region. The concentration of the first substance in the first region is different from the concentration of the first substance in the second region. When the first region is positioned closer to the light-emitting layer than the second region is, the concentration of the first substance is preferably higher than in the first region than in the second region. It is preferred that the electron-transport material have a HOMO level higher than or equal to −6.0 eV, and have an electron mobility higher than or equal to $1 \times 10^{-7}$ cm$^2$/Vs and lower than or equal to $5 \times 10^{-5}$ cm$^2$ when the square root of electric field strength [V/cm] is 600. The light-emitting device further preferably includes a hole-injection layer. It is preferred that the hole-injection layer be in contact with the anode, which is one of the second pixel electrode and the common electrode, and contain a first compound and a second compound. The first compound preferably has a property of accepting electrons from the second compound. The second compound preferably has a HOMO level higher than or equal to −5.7 eV and lower than or equal to −5.4 eV.

The light-receiving device further preferably includes the electron-transport layer. It is preferred that the electron-transport layer be positioned over the first pixel electrode and the second pixel electrode, and include a portion overlapping with the active layer and a portion overlapping with the light-emitting layer.

The light-receiving device and the light-emitting device preferably further include a common layer. It is preferable that the common layer be positioned over the first pixel electrode and the second pixel electrode, and include a portion overlapping with the active layer and a portion overlapping with the light-emitting layer.

The light-emitting device further preferably includes a first hole-transport layer. The first hole-transport layer preferably contains a third compound. It is preferred that the HOMO level of the third compound be lower than or equal to the HOMO level of the second compound, and that the difference in the HOMO level between the third compound and the second compound be 0.2 eV or less. The second compound and the third compound each preferably include at least one of a carbazole skeleton, a dibenzofuran skeleton, a dibenzothiophene skeleton, and an anthracene skeleton.

The light-emitting device further preferably includes a second hole-transport layer. The second hole-transport layer preferably contains a fourth compound. The HOMO level of the fourth compound is preferably lower than that of the third compound. The second compound, the third compound, and the fourth compound each preferably include at least one of a carbazole skeleton, a dibenzofuran skeleton, a dibenzothiophene skeleton, and an anthracene skeleton.

The first substance is preferably an organometallic complex containing an alkali metal or an alkaline earth metal. The first substance is preferably an organometallic complex including a ligand containing nitrogen and oxygen, and an alkali metal or an alkaline earth metal. The first substance is preferably an organometallic complex including a quinolinol ligand, and an alkali metal or an alkaline earth metal.

The light-emitting device preferably emits blue light.

The light-emitting device is preferably a fluorescent device.

The display unit of one embodiment of the present invention preferably further includes a resin layer, a light-blocking layer, and a substrate. The resin layer and the light-blocking layer are preferably positioned between the common electrode and the substrate, For example, the resin layer preferably has an opening overlapping with the light-receiving device. The resin layer preferably includes a portion overlapping with the light-emitting device. The light-blocking layer preferably includes a portion between the common electrode and the resin layer. The light-blocking layer preferably covers at least part of the opening and at least part of a side surface of the resin layer exposed in the opening.

Alternatively, it is preferable that the resin layer have an island shape and include a portion overlapping with the light-emitting device. The light-blocking layer preferably include a portion between the common electrode and the resin layer. At least part of light passing through the substrate enters the light-receiving device without via the resin layer. The light-blocking layer preferably covers at least part of a side surface of the resin layer.

The display unit of one embodiment of the present invention preferably further includes an adhesive layer. The adhesive layer is preferably positioned between the common electrode and the substrate. The resin layer and the light-blocking layer are preferably positioned between the adhesive layer and the substrate. The adhesive layer preferably includes a first portion overlapping with the light-receiving device and a second portion overlapping with the light-emitting device. The first portion is preferably thicker than the second portion.

The display unit of one embodiment of the present invention preferably has flexibility.

One embodiment of the present invention is a module including the display unit having any of the above structures. For example, the module is provided with a connector such as a flexible printed circuit (FPC) or a tape carrier package (TCP) or is mounted with an integrated circuit (IC) by a chip on glass (COG) method, a chip on film (COF) method, or the like. One embodiment of the present invention is an electronic device including the aforementioned module and at least one of an antenna, a battery, a housing, a camera, a speaker, a microphone, and an operation button.

One embodiment of the present invention can provide a display unit having a function of sensing light. One embodiment of the present invention can provide a highly reliable display unit having a function of sensing light. One embodiment of the present invention can provide a highly convenient display unit. One embodiment of the present invention can provide a multifunctional display unit. One embodiment of the present invention can provide a display unit with high display quality. One embodiment of the present invention can provide a display unit having high light sensitivity. One embodiment of the present invention can provide a novel display unit.

Note that the description of these effects does not preclude the existence of other effects. One embodiment of the present invention does not need to have all these effects. Other effects can be derived from the descriptions of the specification, the drawings, and the claims.

BRIEF DESCRIPTION OF THE DRAWINGS

In the accompanying drawings:

FIGS. 15A and 15B are cross-sectional views each illustrating an example of a display unit;

FIG. 16 is a cross-sectional view illustrating an example of a display unit;

DETAILED DESCRIPTION OF THE INVENTION

Figure 1A:
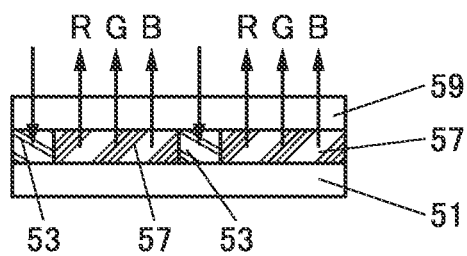
FIGS. 1A to 1D are cross-sectional views illustrating examples of display units.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Note that in structures of the present invention described below, the same portions or portions having similar functions are denoted by the same reference numerals in different drawings, and the description thereof is not repeated. The same hatching pattern is used for portions having similar functions, and the portions are not denoted by specific reference numerals in some cases.

The position, size, range, or the like of each component illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be replaced with the term "conductive film". As another example, the term "insulating film" can be replaced with the term "insulating layer".

Embodiment 1

In this embodiment, a display unit of one embodiment of the present invention will be described with reference to FIGS. 1A to 1I to FIGS. 18A to 18D.

In a display unit of this embodiment, a display portion includes light-receiving devices and light-emitting devices. In the display unit of this embodiment, the light-emitting devices are arranged in a matrix in the display portion, and an image can be displayed on the display portion. Moreover, the light-receiving devices are arranged in a matrix in the display portion, so that the display portion also functions as a light-receiving portion. The light-receiving portion can be used as an image sensor or a touch sensor. That is, by sensing light with the light-receiving portion, an image can be taken and the approach or contact of an object (e.g., a finger or a stylus) can be detected. Furthermore, in the display unit of this embodiment, the light-emitting devices can be used as a light source of the sensor. Accordingly, a light-receiving portion and a light source do not need to be provided separately from the display unit; hence, the number of components of an electronic device can be reduced.

In the display unit of this embodiment, when an object reflects light emitted from the light-emitting device included in the display portion, the light-receiving device can sense the reflected light; thus, imaging and touch (including near touch) detection are possible even in a dark place.

The display unit of this embodiment has a function of displaying images using the light-emitting devices. That is, the light-emitting device functions as a display device.

As the light-emitting device, an EL device such as an organic light-emitting diode (OLED) and a quantum-dot light-emitting diode (QLED) is preferably used. Examples of a light-emitting substance included in the EL device include a substance exhibiting fluorescence (a fluorescent material), a substance exhibiting phosphorescence (a phosphorescent material), an inorganic compound (e.g., a quantum dot material), and a substance exhibiting thermally activated delayed fluorescence (a thermally activated delayed fluorescent (TADF) material). Alternatively, an LED such as a micro-LED can be used as the light-emitting device.

The display unit of this embodiment has a function of sensing light using the light-receiving device.

When the light-receiving device is used as an image sensor, the display unit of this embodiment can capture an image using the light-receiving device. For example, the display unit of this embodiment can be used as a scanner.

For example, data on a fingerprint, a palm print, an iris, or the like can be acquired with the image sensor. That is, a biological authentication sensor can be incorporated into the display unit of this embodiment. When the display unit incorporates a biological authentication sensor, the number of components of an electronic device can be reduced as compared to the case where a biological authentication sensor is provided separately from a display unit; thus, the size and weight of the electronic device can be reduced.

In addition, data on facial expression, eye movement, change of the pupil diameter, or the like of the user can be acquired with the image sensor. By analysis of the data, data on the user's physical and mental state can be acquired. Changing the output contents of one or both of display and sound on the basis of the data allows the user to safely use a device for virtual reality (VR), augmented reality (AR), or mixed reality (MR), for example.

When the light-receiving device is used as the touch sensor, the display unit of this embodiment can detect the approach or contact of an object with the use of the light-receiving device.

As the light-receiving device, a PN photodiode or a PIN photodiode can be used, for example. The light-receiving device functions as a photoelectric conversion device that senses light entering the light-receiving device and generates electric charge. The amount of generated electric charge depends on the amount of incident light.

It is particularly preferable to use an organic photodiode including a layer containing an organic compound as the light-receiving device. An organic photodiode, which is easily made thin, lightweight, and large in area and has a high degree of freedom for shape and design, can be used in a variety of display units.

In one embodiment of the present invention, an organic EL device is used as the light-emitting device, and an organic photodiode is used as the light-receiving device. The organic EL device and the organic photodiode can be formed over one substrate. Thus, the organic photodiode can be incorporated into the display unit including the organic EL device.

If all the layers of the organic EL device and the organic photodiode are formed separately, the number of film formation steps becomes extremely large. Since a large number of layers in the organic photodiode can be common to the layers in the organic EL device, forming the common layers concurrently can prevent the increase in the number of film formation steps. Even when the number of film formation steps is the same, reducing the number of layers formed only in either device can suppress the influence of deviation of a film formation pattern and the influence of dust (including small foreign substances called particles) attached to a deposition mask (e.g., a metal mask), for example. Thus, the yield of the manufacturing process of the display unit can be increased.

For example, one of a pair of electrodes (a common electrode) can be a layer shared by the light-receiving device and the light-emitting device. As another example, at least one of a hole-injection layer, a hole-transport layer, an electron-transport layer, and an electron-injection layer is preferably a layer shared by the light-receiving device and the light-emitting device. As another example, an active layer of the light-receiving device and a light-emitting layer of the light-emitting device are separately formed, and the other layers can be shared by the light-emitting device and the light-receiving device. When the light-receiving device and the light-emitting device include common layers in such a manner, the number of film formation steps and the number of masks can be reduced, thereby reducing the number of manufacturing steps and the manufacturing cost of the display unit.

Note that a layer shared by the light-receiving device and the light-emitting device may have a different function depending on which device the layer is in. In this specification, the name of a component is based on its function in the light-emitting device. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device.

A display unit of one embodiment of the present invention includes a light-receiving device and a light-emitting device in a display portion. The light-receiving device includes a first pixel electrode, an active layer, and a common electrode. The light-emitting device includes a second pixel electrode, a light-emitting layer, and the common electrode. The active layer is positioned over the first pixel electrode and contains a first organic compound. The light-emitting layer is positioned over the second pixel electrode and contains a second organic compound different from the first organic compound. The common electrode includes a portion overlapping with the first pixel electrode with the active layer therebetween, and a portion overlapping with the second pixel electrode with the light-emitting layer therebetween.

The light-emitting device preferably further includes a hole-injection layer and an electron-transport layer. In that case, the hole-injection layer is in contact with the anode, which is one of the second pixel electrode and the common electrode. The hole-injection layer contains a first compound and a second compound. The electron-transport layer contains an electron-transport material. The first compound has a property of accepting electrons from the second compound. The second compound has a HOMO level higher than or equal to −5.7 eV and lower than or equal to −5.4 eV. The electron-transport material has a HOMO level higher than or equal to −6.0 eV, and has an electron mobility higher than or equal to $1\times10^{-7}$ cm$^2$/Vs and lower than or equal to $5\times10^{-5}$ cm$^2$ when the square root of electric field strength [V/cm] is 600.

Alternatively, the light-emitting device preferably further includes an electron-transport layer. In that case, the electron-transport layer contains an electron-transport material and a first substance. The first substance is a metal, a metallic salt, a metal oxide, or an organometallic complex. The electron-transport layer includes a first region and a second region. The concentration of the first substance in the first region is different from the concentration of the first substance in the second region. For example, when the first region is positioned closer to the light-emitting layer than the second region is, the concentration of the first substance is preferably higher than in the first region than in the second region. It is preferred that the electron-transport material have a HOMO level higher than or equal to −6.0 eV, and have an electron mobility higher than or equal to $1\times10^{-7}$ cm$^2$/Vs and lower than or equal to $5\times10^{-5}$ cm$^2$ when the square root of electric field strength [V/cm] is 600.

In the light-emitting device of one embodiment of the present invention, holes are likely to be injected into the light-emitting layer and electrons are less likely to be injected into the light-emitting layer. Holes are easily injected from the anode side and the amount of electrons injected into the light-emitting layer from the cathode side is controlled, whereby the light-emitting layer can be prevented from having excess electrons. Moreover, injection of electrons into the light-emitting layer over time increases luminance, and the luminance increase can cancel out initial decay. Using a light-emitting device with little initial decay and an extremely long driving lifetime results in high reliability. Note that the light-emitting device used in the display unit of one embodiment of the present invention will be described in detail in Embodiment 2.

In the display unit of one embodiment of the present invention, light emitted from the light-emitting device is extracted through a display surface, and light with which the light-receiving device is irradiated passes through the display surface. The display unit preferably includes a light-blocking layer on the display surface side of the light-emitting device and the light-receiving device. Light emitted from the light-emitting device is preferably extracted to the outside of the display unit through an opening in the light-blocking layer (or a region where the light-blocking layer is not provided). The light-receiving device is preferably irradiated with light passing through an opening in the light-blocking layer (or a region where the light-blocking layer is not provided).

The light-receiving device senses light that is emitted from the light-emitting device and then reflected by an object. However, in some cases, light emitted from the light-emitting device is reflected inside the display unit and enters the light-receiving device without via an object. Such stray light ends up as noise in light detection, which is a factor reducing the signal-to-noise ratio (S/N ratio). Providing the light-blocking layer on the display surface side of the light-emitting device and the light-receiving device can reduce the influence of stray light. Thus, noise can be reduced, and the sensitivity of the sensor using the light-receiving device can be increased.

As the light-blocking layer is positioned closer to the light-emitting device, stray light from the light-emitting device inside the display unit can be reduced and the sensitivity of the sensor can be increased. Furthermore, as the light-blocking layer is positioned closer to the light-emitting device, the amount of contrast reduction and chromaticity change at the time when the display unit is seen from the oblique direction can be reduced, and viewing angle characteristics of display can be more favorable. On the other hand, as the light-blocking layer is positioned further from the light-emitting device, the area of the imaging range of the light-receiving device can be smaller, and the imaging resolution can be higher.

In view of the above, in one embodiment of the present invention, a component (e.g., a resin layer) is provided on a surface where the light-blocking layer is formed, to cause a difference between the distance from the light-blocking layer to the light-receiving device and the distance from the light-blocking layer to the light-emitting device. Adjusting the layout and thickness of the component can increase the distance from the light-blocking layer to the light-receiving device and reduce the distance from the light-blocking layer to the light-emitting device. Accordingly, noise of the sensor can be reduced, the imaging resolution can be increased, and viewing angle dependence of display can be reduced. Thus, both the display quality and imaging quality of the display unit can be increased.

Specifically, it is preferred that the display unit of one embodiment of the present invention include a resin layer, a light-blocking layer, and a substrate. The resin layer and the light-blocking layer are preferably positioned between the common electrode and the substrate.

At least part of light emitted from the light-emitting device is extracted to the outside of the substrate through the resin layer. At least part of light passing through the substrate enters the light-receiving device without via the resin layer. For example, the resin layer has an opening overlapping with the light-receiving device. Alternatively, the resin layer is provided to have an island shape in a region overlapping with the light-emitting device.

The resin layer is provided at the position overlapping with the light-emitting device and is not provided at the position overlapping with the light-receiving device. Thus, the distance from the light-blocking layer to the light-emitting device is shorter than the distance from the light-blocking layer to the light-receiving device. Consequently, both the display quality and imaging quality of the display unit can be increased.

FIGS. 1A to 1D are cross-sectional views of display units of one embodiment of the present invention.

A display unit 50A illustrated in FIG. 1A includes a layer 53 including light-receiving devices and a layer 57 including light-emitting devices, between a substrate 51 and a substrate 59.

Figure 1B:
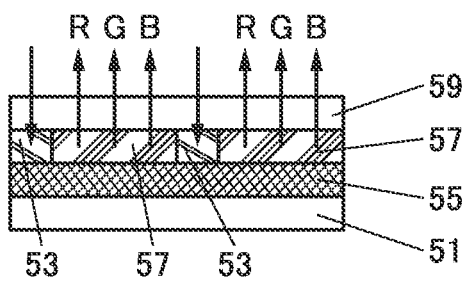

A display unit 50B illustrated in FIG. 1B includes the layer 53 including light-receiving devices, a layer 55 including transistors, and the layer 57 including light-emitting devices, between the substrate 51 and the substrate 59.

In the display unit 50A and the display unit 50B, red (R) light, green (G) light, and blue (B) light are emitted from the layer 57 including light-emitting devices.

The display unit of one embodiment of the present invention includes a plurality of pixels arranged in a matrix. One pixel includes at least one subpixel. One subpixel includes one light-emitting device. For example, a pixel can include three subpixels (e.g., three colors of R, G, and B or three colors of yellow (Y), cyan (C), and magenta (M)) or four subpixels (e.g., four colors of R, G, B, and white (W) or four colors of R, G, B, and Y). The pixel also includes a light-receiving device. The light-receiving device may be provided in all the pixels or in some of the pixels. In addition, one pixel may include a plurality of light-receiving devices.

The layer 55 including transistors preferably includes a first transistor and a second transistor. The first transistor is electrically connected to the light-receiving device. The second transistor is electrically connected to the light-emitting device.

Figure 1C:
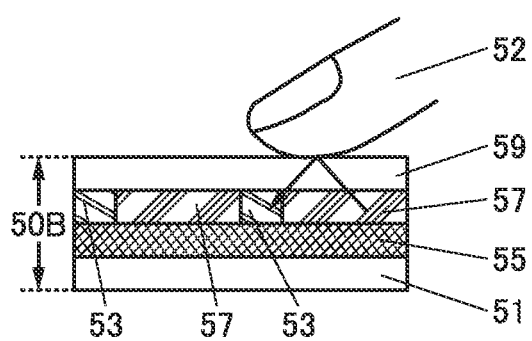

The display unit of one embodiment of the present invention may have a function of sensing an object such as a finger that is touching the display unit. For example, after light emitted from the light-emitting device in the layer 57 including light-emitting devices is reflected by a finger 52 that touches the display unit 50B as illustrated in FIG. 1C, the light-receiving device in the layer 53 including light-receiving devices senses the reflected light. Thus, the touch of the finger 52 on the display unit 50B can be detected.

Figure 1D:
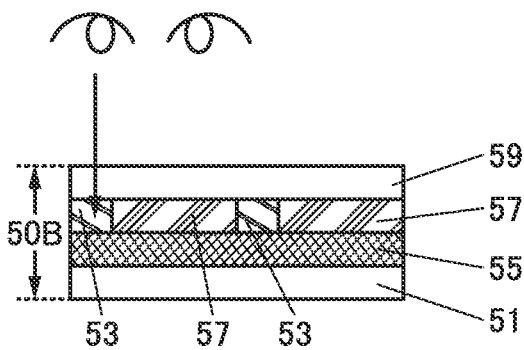

The display unit of one embodiment of the present invention may have a function of sensing an object that is approaching (but is not touching) the display unit 50B as illustrated in FIG. 1D or capturing an image of such an object.

[Pixel]

FIGS. 1E to 1I illustrate examples of pixels.

Figure 1E:
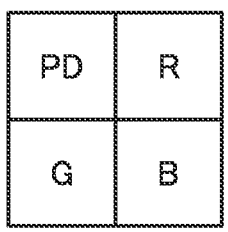
FIGS. 1E to 1I are top views illustrating examples of pixels.
Figure 1F:
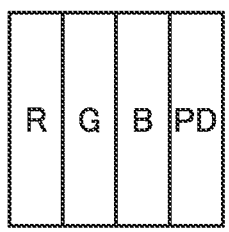
Figure 1G:
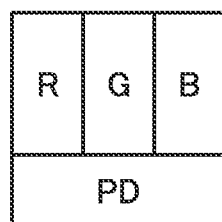
Figure 1H:
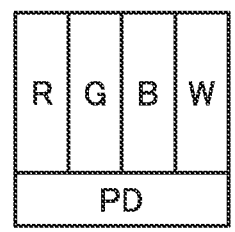

The pixel illustrated in each of FIGS. 1E to 1G includes three subpixels (three light-emitting devices) of R, G, and B and a light-receiving device PD. FIG. 1E illustrates an example in which the three subpixels and the light-receiving device PD are arranged in a 2×2 matrix. FIG. 1F illustrates an example in which the three subpixels and the light-receiving device PD are arranged horizontally in one line. FIG. 1G illustrates an example in which the three subpixels are arranged horizontally in one line and the light-receiving device PD is placed beneath the subpixels. Note that each of the pixels in FIGS. 1E to 1G can be said to consist of four subpixels, among which three subpixels are used to perform display and one subpixel is used to sense light. The pixel illustrated in FIG. 1H includes four subpixels (four light-emitting devices) of R, G, B, and W and the light-receiving device PD.

Figure 1I:
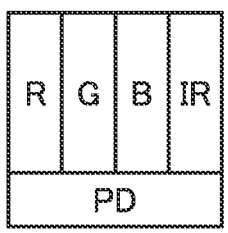

The pixel illustrated in FIG. 1I includes three subpixels of R, G, and B, a light-emitting device IR that emits infrared light, and the light-receiving device PD. Here, the light-receiving device PD preferably has a function of sensing infrared light. The light-receiving device PD may have a function of sensing both visible light and infrared light. The wavelength of light that the light-receiving device PD senses can be determined depending on the application of the sensor.

The detailed structures of the light-emitting device and the light-receiving device included in the display unit of one embodiment of the present invention will be described below with reference to FIG. 2 to FIGS. 12A and 12B.

The display unit of one embodiment of the present invention can have any of the following structures: a top-emission structure in which light is emitted in a direction opposite to the substrate where the light-emitting device is formed, a bottom-emission structure in which light is emitted toward the substrate where the light-emitting device is formed, and a dual-emission structure in which light is emitted toward both surfaces.

FIG. 2 to FIGS. 12A and 12B show top-emission display units as examples.

Although this embodiment mainly describes a display unit including a light-emitting device that emits visible light and a light-receiving device that senses visible light, the display unit may also include a light-emitting device that emits infrared light. The light-receiving device may be configured to sense infrared light or sense both visible light and infrared light.

[Display Unit 10]

Figure 2:
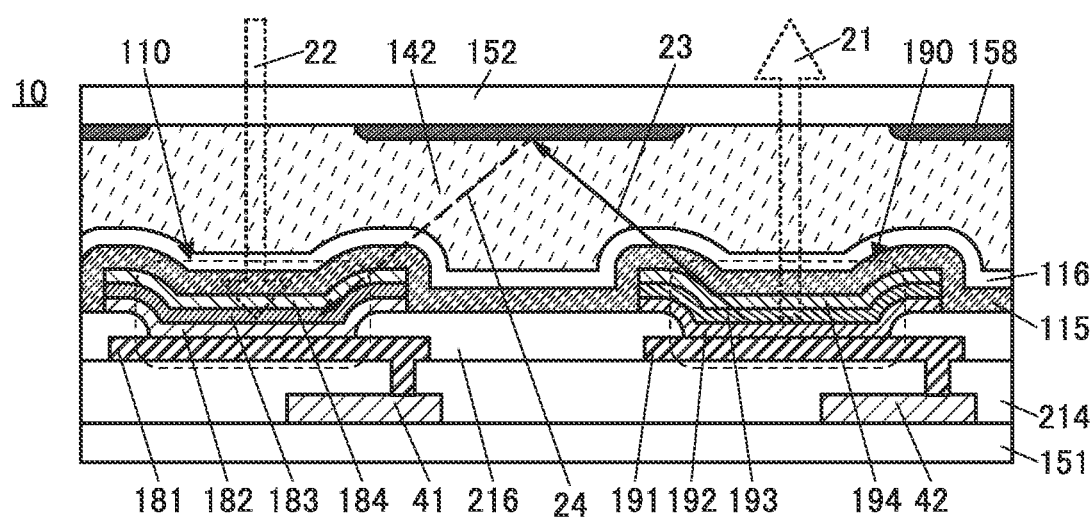
FIG. 2 is a cross-sectional view illustrating an example of a display unit.

FIG. 2 is a cross-sectional view of a display unit 10.

The display unit 10 includes a light-receiving device 110 and a light-emitting device 190.

The light-emitting device 190 includes a pixel electrode 191, a buffer layer 192, a light-emitting layer 193, a buffer layer 194, and a common electrode 115. The light-emitting layer 193 contains an organic compound. The light-emitting device 190 has a function of emitting visible light. Note that the display unit 10 may also include a light-emitting device having a function of emitting infrared light. In this embodiment, the case where the pixel electrode 191 functions as an anode and the common electrode 115 functions as a cathode is described as an example.

The light-receiving device 110 includes a pixel electrode 181, a buffer layer 182, an active layer 183, a buffer layer 184, and the common electrode 115. The active layer 183 contains an organic compound. The light-receiving device 110 has a function of sensing visible light. Note that the light-receiving device 110 may also have a function of sensing infrared light. This embodiment describes the light-receiving device 110 in which the pixel electrode 181 functions as an anode and the common electrode 115 functions as a cathode to match the electrodes of the light-emitting device 190. In other words, the light-receiving device 110 is driven by application of reverse bias between the pixel electrode 181 and the common electrode 115, whereby the display unit 10 can sense light incident on the light-receiving device 110, generate electric charge, and extract it as current.

The pixel electrode 181, the pixel electrode 191, the buffer layer 182, the buffer layer 192, the active layer 183, the light-emitting layer 193, the buffer layer 184, the buffer layer 194, and the common electrode 115 may each have a single-layer structure or a stacked-layer structure.

The pixel electrode 181 and the pixel electrode 191 are positioned over an insulating layer 214. The pixel electrode 181 and the pixel electrode 191 can be formed using the same material in the same step. An end portion of the pixel electrode 181 and an end portion of the pixel electrode 191 are covered with a partition 216. The pixel electrode 181 and the pixel electrode 191 are electrically isolated (electrically separated) from each other by the partition 216.

An organic insulating film is suitable for the partition 216. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins. The partition 216 is a layer that transmits visible light. Although the details will be described later, a partition 217 that blocks visible light may be provided instead of the partition 216.

The buffer layer 182 is positioned over the pixel electrode 181. The active layer 183 overlaps with the pixel electrode 181 with the buffer layer 182 therebetween. The buffer layer 184 is positioned over the active layer 183. The active layer 183 overlaps with the common electrode 115 with the buffer layer 184 therebetween. The buffer layer 182 can include a hole-transport layer. The buffer layer 184 can include an electron-transport layer.

The buffer layer 192 is positioned over the pixel electrode 191. The light-emitting layer 193 overlaps with the pixel electrode 191 with the buffer layer 192 therebetween. The buffer layer 194 is positioned over the light-emitting layer 193. The light-emitting layer 193 overlaps with the common electrode 115 with the buffer layer 194 therebetween. The buffer layer 192 can include one or both of a hole-injection layer and a hole-transport layer. The buffer layer 194 can include one or both of an electron-injection layer and an electron-transport layer.

The common electrode 115 is a layer shared by the light-receiving device 110 and the light-emitting device 190.

The material, thickness, and the like of the pair of electrodes can be the same between the light-receiving device 110 and the light-emitting device 190. Thus, the manufacturing cost of the display unit can be reduced, and the manufacturing process of the display unit can be simplified.

The display unit 10 includes the light-receiving device 110, the light-emitting device 190, a transistor 41, a transistor 42, and the like between a pair of substrates (a substrate 151 and a substrate 152).

In the light-receiving device 110, the buffer layer 182, the active layer 183, and the buffer layer 184, which are positioned between the pixel electrode 181 and the common electrode 115, can each be referred to as an organic layer (a layer containing an organic compound). The pixel electrode 181 preferably has a function of reflecting visible light. The common electrode 115 has a function of transmitting visible light. Note that in the case where the light-receiving device 110 is configured to sense infrared light, the common electrode 115 has a function of transmitting infrared light. Furthermore, the pixel electrode 181 preferably has a function of reflecting infrared light.

The light-receiving device 110 has a function of sensing light. Specifically, the light-receiving device 110 is a photoelectric conversion device that receives light 22 incident from the outside of the display unit 10 and converts the light 22 into an electric signal. The light 22 can also be expressed as light that is emitted from the light-emitting device 190 and then reflected by an object. The light 22 may enter the light-receiving device 110 through a lens described later.

In the light-emitting device 190, the buffer layer 192, the light-emitting layer 193, and the buffer layer 194, which are positioned between the pixel electrode 191 and the common electrode 115, can be collectively referred to as an EL layer. Note that the EL layer includes at least a light-emitting layer. The pixel electrode 191 preferably has a function of reflecting visible light. The common electrode 115 has a function of transmitting visible light. Note that when the display unit 10 includes a light-emitting device that emits infrared light, the common electrode 115 has a function of transmitting infrared light. Furthermore, the pixel electrode 191 preferably has a function of reflecting infrared light.

The light-emitting device included in the display unit of this embodiment preferably employs a microcavity structure. Therefore, one of the pair of electrodes of the light-emitting device is preferably an electrode having properties of transmitting and reflecting visible light (a transflective electrode), and the other is preferably an electrode having a property of reflecting visible light (a reflective electrode). When the light-emitting device has a microcavity structure, light obtained from the light-emitting layer can be resonated between the electrodes, whereby light emitted from the light-emitting device can be intensified.

Note that the transflective electrode can have a stacked-layer structure of a reflective electrode and an electrode having a property of transmitting visible light (also referred to as a light-transmitting electrode). In this specification and the like, the reflective electrode functioning as part of a transflective electrode may be referred to as a pixel electrode or a common electrode, and the light-transmitting electrode may be referred to as an optical adjustment layer; in some cases, the light-transmitting electrode (optical adjustment layer) can also be regarded as having a function of a pixel electrode or a common electrode.

The light-transmitting electrode has a visible light transmittance of higher than or equal to 40%. For example, the light-emitting device preferably includes an electrode having a visible light (light at wavelengths greater than or equal to 400 nm and less than 750 nm) transmittance of higher than or equal to 40%. The visible light reflectivity of the transflective electrode is higher than or equal to 10% and less than or equal to 95%, preferably higher than or equal to 30% and lower than or equal to 80%. The visible light reflectivity of the reflective electrode is higher than or equal to 40% and lower than or equal to 100%, preferably higher than or equal to 70% and lower than or equal to 100%. These electrodes preferably have a resistivity of $1\times10^{-2}$ (2 cm or less. Note that in the case where a light-emitting device that emits infrared light is used in the display unit, the infrared light (light at wavelengths from 750 nm 1300 nm) transmittance and reflectivity of these electrodes are preferably in the above ranges.

The buffer layer 192 or the buffer layer 194 may function as an optical adjustment layer. By changing the thickness of the buffer layer 192 or the buffer layer 194, light of a specific color can be intensified and taken out from each light-emitting device. Note that when the transflective electrode has a stacked-layer structure of a reflective electrode and a light-transmitting electrode, the optical path length between the pair of electrodes represents the optical path length between a pair of reflective electrodes.

The light-emitting device 190 has a function of emitting visible light. Specifically, the light-emitting device 190 is an electroluminescent device that emits light toward the substrate 152 (see emitted light 21) when voltage is applied between the pixel electrode 191 and the common electrode 115.

It is preferable that the light-emitting layer 193 be formed not to overlap with the light-receiving device 110. Accordingly, it is possible to prevent the light-emitting layer 193 from absorbing the light 22, thereby increasing the amount of light with which the light-receiving device 110 is irradiated.

The pixel electrode 181 is electrically connected to a source or a drain of the transistor 41 through an opening provided in the insulating layer 214.

The pixel electrode 191 is electrically connected to a source or a drain of the transistor 42 through an opening provided in the insulating layer 214. The transistor 42 has a function of controlling the driving of the light-emitting device 190.

The transistor 41 and the transistor 42 are on and in contact with the same layer (the substrate 151 in FIG. 2).

At least part of a circuit electrically connected to the light-receiving device 110 is preferably formed using the same material in the same steps as a circuit electrically connected to the light-emitting device 190. Thus, the thickness of the display unit can be reduced and the manufacturing process can be simplified, compared to the case where the two circuits are separately formed.

The light-receiving device 110 and the light-emitting device 190 are preferably covered with a protective layer 116. In FIG. 2, the protective layer 116 is provided on and in contact with the common electrode 115. Providing the protective layer 116 can inhibit entry of impurities such as water into the light-receiving device 110 and the light-emitting device 190, thereby increasing the reliability of the light-receiving device 110 and the light-emitting device 190. The protective layer 116 and the substrate 152 are attached to each other with an adhesive layer 142.

A light-blocking layer 158 is provided on a surface of the substrate 152 on the substrate 151 side. The light-blocking layer 158 has an opening at the position overlapping with the light-emitting device 190 and an opening at the position overlapping with the light-receiving device 110. Note that in this specification and the like, the position overlapping with the light-emitting device 190 refers specifically to a position overlapping with a light-emitting region of the light-emitting device 190. Similarly, the position overlapping with the light-receiving device 110 refers specifically to a position overlapping with a light-receiving region of the light-receiving device 110.

Here, the light-receiving device 110 senses light that is emitted from the light-emitting device 190 and then reflected by an object. However, in some cases, light emitted from the light-emitting device 190 is reflected inside the display unit 10 and enters the light-receiving device 110 without via an object. The light-blocking layer 158 can reduce the influence of such stray light. For example, in the case where the light-blocking layer 158 is not provided, light 23 emitted from the light-emitting device 190 is reflected by the substrate 152 and reflected light 24 enters the light-receiving device 110 in some cases. Providing the light-blocking layer 158 can inhibit entry of the reflected light 24 into the light-receiving device 110. Thus, noise can be reduced, and the sensitivity of the sensor using the light-receiving device 110 can be increased.

For the light-blocking layer 158, a material that blocks light from the light-emitting device can be used. The light-blocking layer 158 preferably absorbs visible light. As the light-blocking layer 158, a black matrix can be formed using a metal material or a resin material containing pigment (e.g., carbon black) or dye, for example. The light-blocking layer 158 may have a stacked-layer structure of a red color filter, a green color filter, and a blue color filter.

[Display Unit 10A]

Figure 3A:
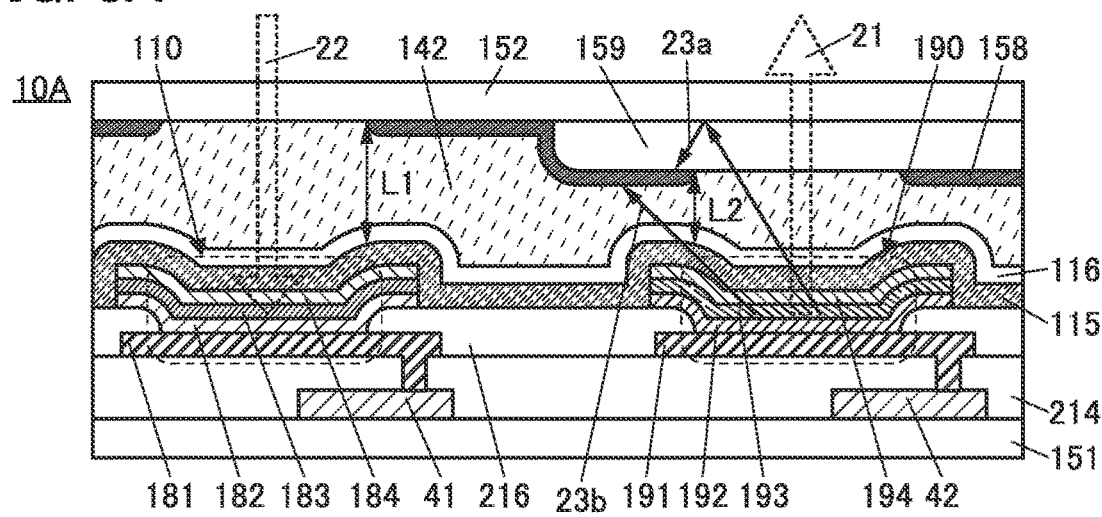
FIG. 3A is a cross-sectional view illustrating an example of a display unit.

FIG. 3A is a cross-sectional view of a display unit 10A. Note that in the following description of display units, the description of components similar to those of the above-described display unit may be omitted.

The display unit 10A is different from the display unit 10 in including a resin layer 159.

The resin layer 159 is provided on a surface of the substrate 152 on the substrate 151 side. The resin layer 159 is provided at the position overlapping with the light-emitting device 190 and is not provided at the position overlapping with the light-receiving device 110.

Figure 3B:
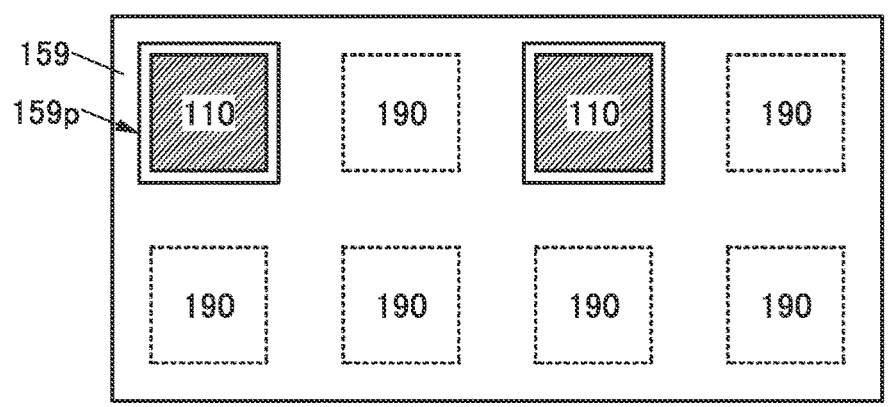
FIGS. 3B and 3C illustrate examples of a top-view layout of a resin layer.
Figure 3C:
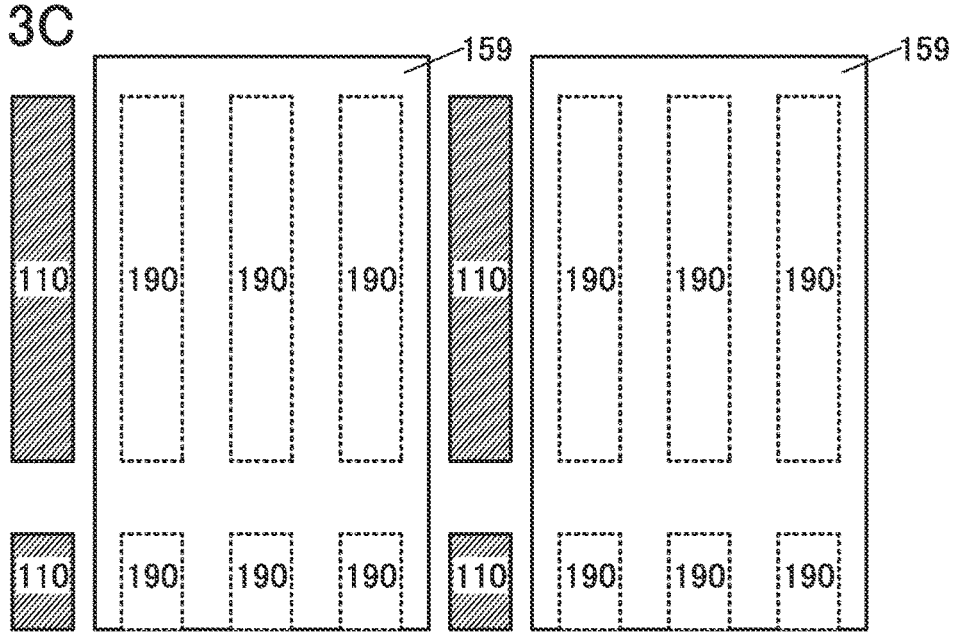

The resin layer 159 can be provided at the position overlapping with the light-emitting device 190 and have an opening 159p at the position overlapping with the light-receiving device 110, as illustrated in FIG. 3B, for example. As another example, as illustrated in FIG. 3C, an island-shaped resin layer 159 can be provided at the position overlapping with the light-emitting device 190 but not at the position overlapping with the light-receiving device 110. The light-blocking layer 158 is provided on surfaces of the substrate 152 and the resin layer 159 on the substrate 151 side. The light-blocking layer 158 has an opening at the position overlapping with the light-emitting device 190 and an opening at the position overlapping with the light-receiving device 110.

For example, the light-blocking layer 158 can absorb stray light 23a that has passed through the resin layer 159 and has been reflected by the surface of the substrate 152 on the substrate 151 side. Moreover, the light-blocking layer 158 can absorb stray light 23b before the stray light 23b reaches the resin layer 159. Thus, stray light incident on the light-receiving device 110 can be reduced. Consequently, noise can be reduced, and the sensitivity of the sensor using the light-receiving device 110 can be increased. It is particularly preferable that the light-blocking layer 158 be positioned close to the light-emitting device 190, in which case stray light can be further reduced. This is preferable also in terms of display quality, because the light-blocking layer 158 provided close to the light-emitting device 190 can reduce viewing angle dependence of display.

Providing the light-blocking layer 158 can control the range where the light-receiving device 110 senses light. When the light-blocking layer 158 is positioned apart from the light-receiving device 110, the imaging range is narrowed, and the imaging resolution can be increased. In the case where the resin layer 159 has an opening, the light-blocking layer 158 preferably covers at least part of the opening and at least part of a side surface of the resin layer 159 exposed in the opening.

In the case where the resin layer 159 is provided in an island shape, the light-blocking layer 158 preferably covers at least part of a side surface of the resin layer 159.

Since the light-blocking layer 158 is provided along the shape of the resin layer 159 in such a manner, the distance from the light-blocking layer 158 to the light-emitting device 190 (specifically, the light-emitting region of the light-emitting device 190) is shorter than the distance from the light-blocking layer 158 to the light-receiving device 110 (specifically, the light-receiving region of the light-receiving device 110). Accordingly, noise of the sensor can be reduced, the imaging resolution can be increased, and view-ing angle dependence of display can be reduced. Thus, both the display quality and imaging quality of the display unit can be increased.

The resin layer 159 transmits light emitted from the light-emitting device 190. Examples of materials for the resin layer 159 include an acrylic resin, a polyimide resin, an epoxy resin, a polyamide resin, a polyimide-amide resin, a siloxane resin, a benzocyclobutene-based resin, a phenol resin, and precursors of these resins. Note that a component provided between the substrate 152 and the light-blocking layer 158 is not limited to the resin layer and may be an inorganic insulating film or the like. As the component becomes thicker, a larger difference occurs between the distance from the light-blocking layer to the light-receiving device and the distance from the light-blocking layer to the light-emitting device. An organic insulating film made of a resin or the like is suitable for the component because it is easily formed to have a large thickness.

In order to compare the distance from the light-blocking layer 158 to the light-receiving device 110 and the distance from the light-blocking layer 158 to the light-emitting device 190, it is possible to use, for example, the shortest distance L1 from an end portion of the light-blocking layer 158 on the light-receiving device 110 side to the common electrode 115 and the shortest distance L2 from an end portion of the light-blocking layer 158 on the light-emitting device 190 side to the common electrode 115. With the shortest distance L2 smaller than the shortest distance L1, generation of stray light from the light-emitting device 190 can be suppressed, and the sensitivity of the sensor using the light-receiving device 110 can be increased. Furthermore, viewing angle dependence of display can be reduced. With the shortest distance L1 larger than the shortest distance L2, the imaging range of the light-receiving device 110 can be narrowed, and the imaging resolution can be increased.

In addition, when the adhesive layer 142 is provided such that a portion overlapping with the light-receiving device 110 is made thicker than a portion overlapping with the light-emitting device 190, a difference can be made between the distance from the light-blocking layer 158 to the light-receiving device 110 and the distance from the light-blocking layer 158 to the light-emitting device 190.

Figure 4A:
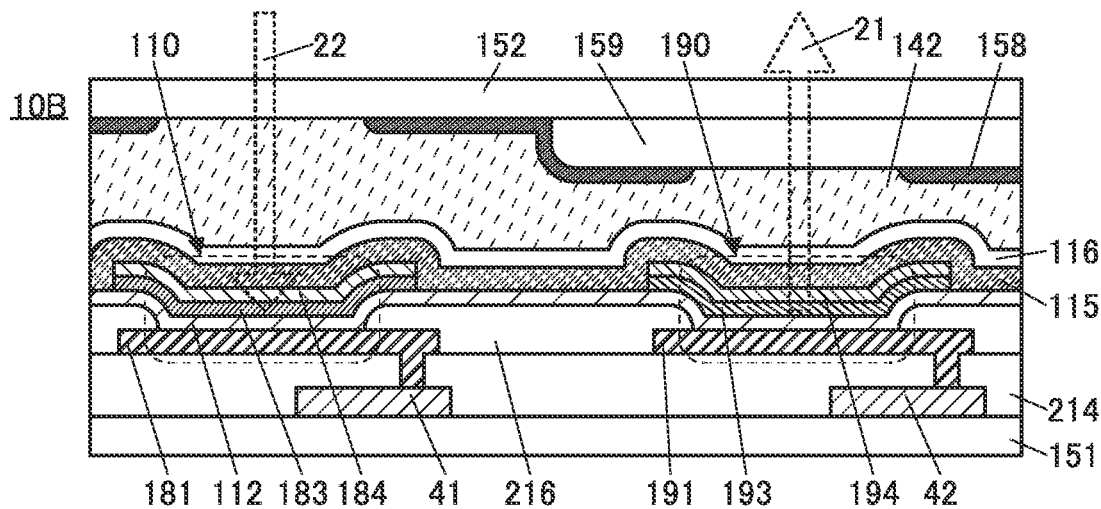
FIGS. 4A and 4B are cross-sectional views each illustrating an example of a display unit.

[Display Unit 10B] FIG. 4A is a cross-sectional view of a display unit 10B.

The display unit 10B is different from the display unit 10A in that the display unit 10B includes neither the buffer layer 182 nor the buffer layer 192 but includes a common layer 112.

The common layer 112 is positioned over the partition 216, the pixel electrode 181, and the pixel electrode 191. The common layer 112 is shared by the light-receiving device 110 and the light-emitting device 190. The common layer 112 may have a single-layer structure or a stacked-layer structure.

As the common layer 112, one or both of a hole-injection layer and a hole-transport layer can be formed, for example. A function of the common layer 112 in the light-emitting device 190 may be different from its function in the light-receiving device 110. For example, when the common layer 112 includes a hole-injection layer, the hole-injection layer functions as a hole-injection layer in the light-emitting device 190 and functions as a hole-transport layer in the light-receiving device 110.

It is preferred that at least one of the layers other than the active layer and the light-emitting layer be shared by the light-receiving device and the light-emitting device, in which case the number of steps of manufacturing the display unit can be reduced.

[Display Unit 10C]

Figure 4B:
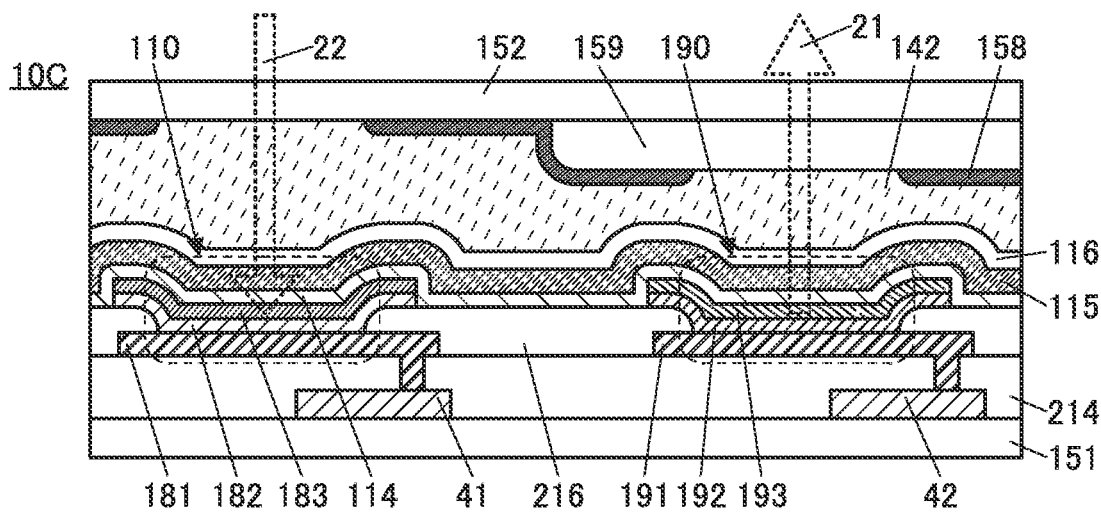

FIG. 4B is a cross-sectional view of a display unit 10C.

The display unit 10C is different from the display unit 10A in that the display unit 10C includes neither the buffer layer 184 nor the buffer layer 194 but includes a common layer 114.

The common layer 114 is positioned over the partition 216, the active layer 183, and the light-emitting layer 193. The common layer 114 is shared by the light-receiving device 110 and the light-emitting device 190. The common layer 114 may have a single-layer structure or a stacked-layer structure.

As the common layer 114, one or both of an electron-injection layer and an electron-transport layer can be formed, for example. A function of the common layer 114 in the light-emitting device 190 may be different from its function in the light-receiving device 110. For example, when the common layer 114 includes an electron-injection layer, the electron-injection layer functions as an electron-injection layer in the light-emitting device 190 and functions as an electron-transport layer in the light-receiving device 110.

It is preferred that at least one of the layers other than the active layer and the light-emitting layer be shared by the light-receiving device and the light-emitting device, in which case the number of steps of manufacturing the display unit can be reduced.

[Display Unit 10D]

Figure 5A:
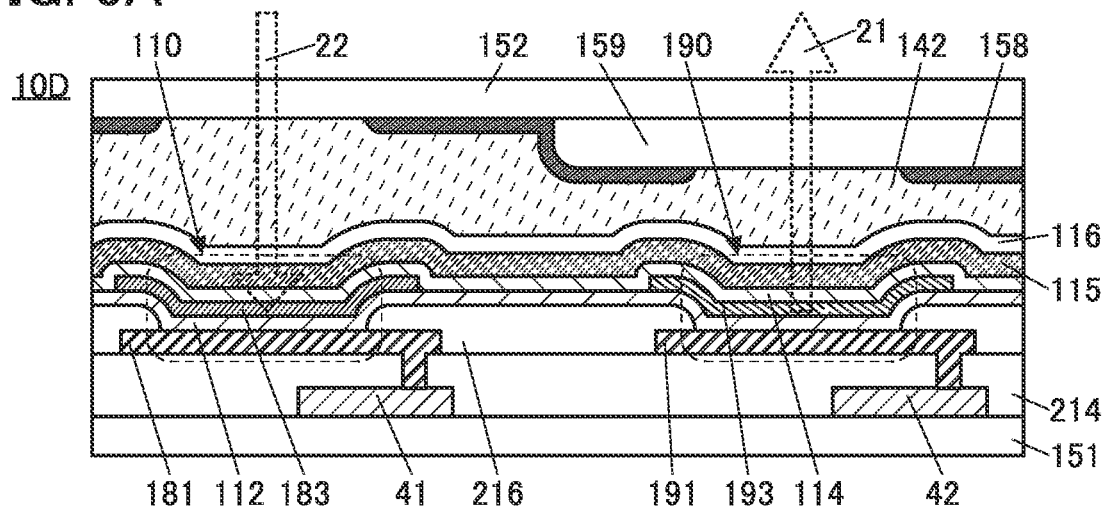
FIGS. 5A to 5C are cross-sectional views each illustrating an example of a display unit.

FIG. 5A is a cross-sectional view of a display unit 10D.

The display unit 10D is different from the display unit 10A in that the display unit 10D does not include the buffer layer 182, the buffer layer 192, the buffer layer 184, and the buffer layer 194 and includes the common layer 112 and the common layer 114.

In the display unit of this embodiment, an organic compound is used for the active layer 183 of the light-receiving device 110. In the light-receiving device 110, the layers other than the active layer 183 can be common to the layers in the light-emitting device 190 (EL device). Therefore, the light-receiving device 110 can be formed concurrently with the formation of the light-emitting device 190 only by adding a step of forming the active layer 183 in the manufacturing process of the light-emitting device 190. The light-emitting device 190 and the light-receiving device 110 can be formed over one substrate. Accordingly, the light-receiving device 110 can be incorporated into the display unit without a significant increase in the number of manufacturing steps.

The display unit 10D shows an example in which the light-receiving device 110 and the light-emitting device 190 have a common structure except that the active layer 183 of the light-receiving device 110 and the light-emitting layer 193 of the light-emitting device 190 are separately formed. Note that the structures of the light-receiving device 110 and the light-emitting device 190 are not limited thereto. The light-receiving device 110 and the light-emitting device 190 may include a separately formed layer other than the active layer 183 and the light-emitting layer 193 (see the display units 10A, 10B, and 10C). The light-receiving device 110 and the light-emitting device 190 preferably include at least one layer used in common (common layer). Thus, the light-receiving device 110 can be incorporated into the display unit without a significant increase in the number of manufacturing steps.

[Display Unit 10E]

Figure 5B:
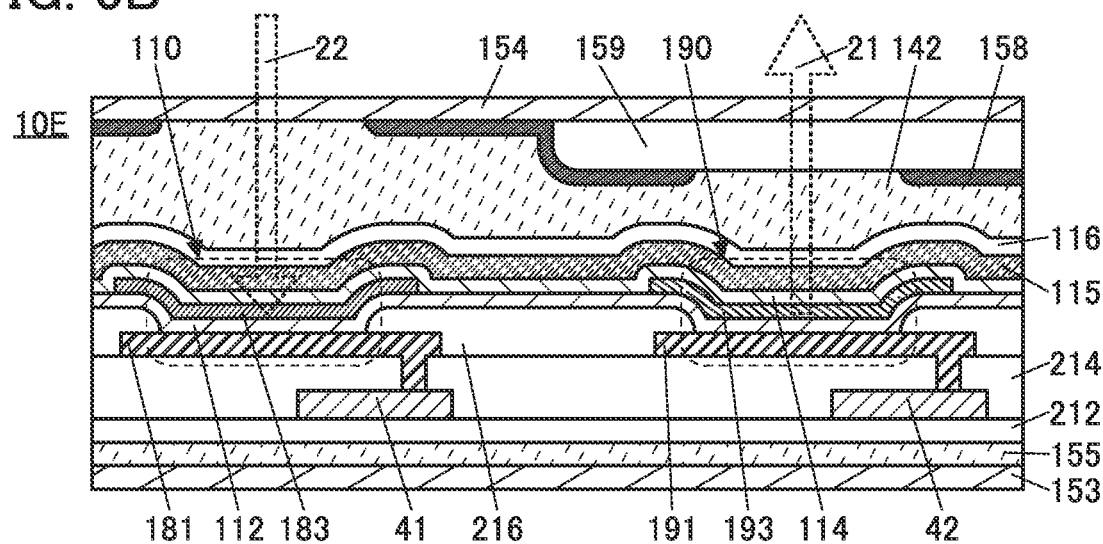

FIG. 5B is a cross-sectional view of a display unit 10E.

The display unit 10E differs from the display unit 10D in that the display unit 10E includes neither the substrate 151 nor the substrate 152 and includes a substrate 153, a substrate 154, an adhesive layer 155, and an insulating layer 212.

The substrate 153 and the insulating layer 212 are attached to each other with the adhesive layer 155. The substrate 154 and the protective layer 116 are attached to each other with the adhesive layer 142.

The display unit 10E is formed in such a manner that the insulating layer 212, the transistor 41, the transistor 42, the light-receiving device 110, the light-emitting device 190, and the like that are formed over a formation substrate are transferred onto the substrate 153. The substrate 153 and the substrate 154 are preferably flexible. Accordingly, the flexibility of the display unit 10E can be increased. For example, a resin is preferably used for the substrate 153 and the substrate 154.

For the substrate 153 and the substrate 154, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used for one or both of the substrates 153 and 154.

As the substrate included in the display unit of this embodiment, a film having high optical isotropy may be used. Examples of the film having high optical isotropy include a triacetyl cellulose (TAC, also referred to as cellulose triacetate) film, a cycloolefin polymer (COP) film, a cycloolefin copolymer (COC) film, and an acrylic film.

[Display Units 10F, 10G, and 10H]

Figure 5C:
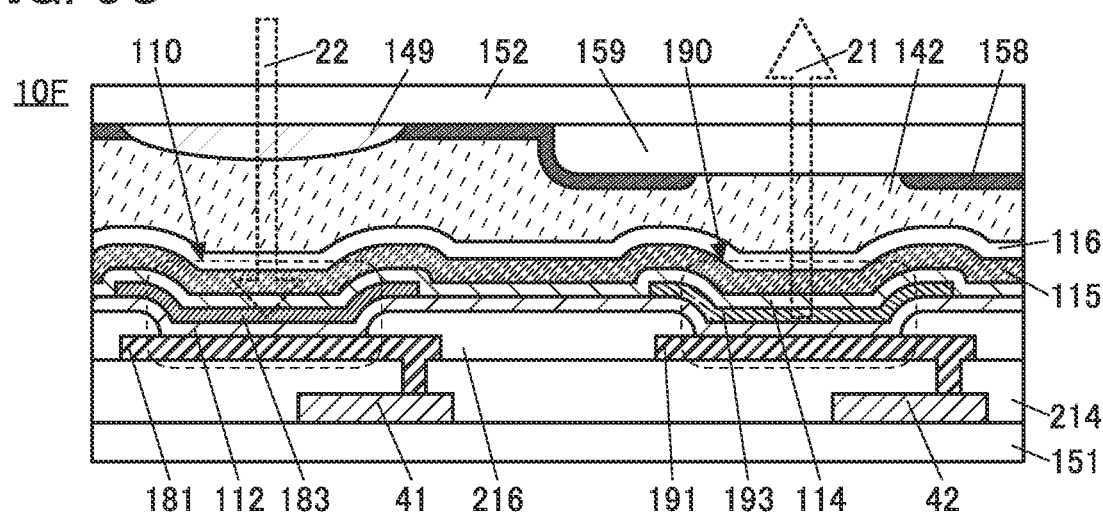
Figure 6A:
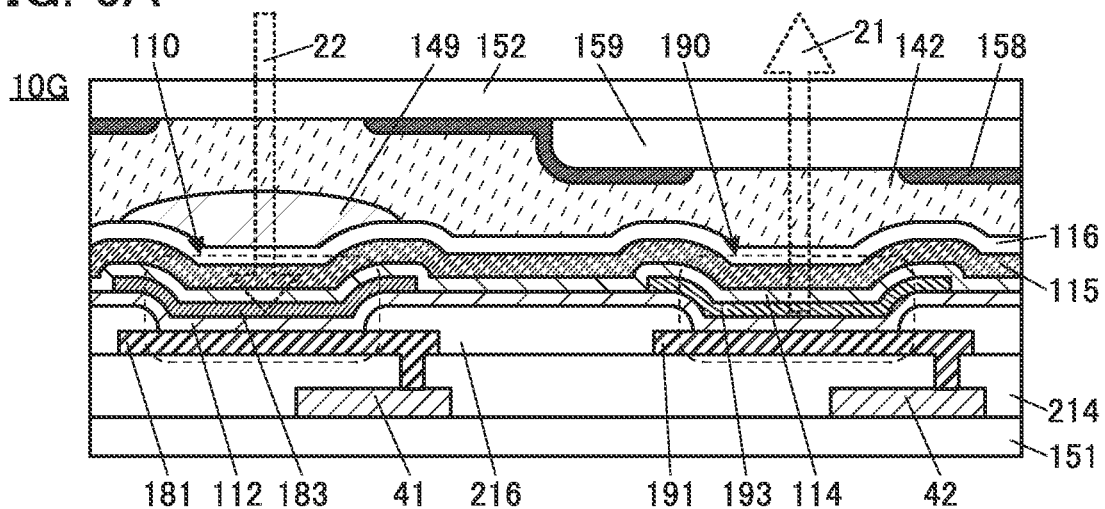
FIGS. 6A to 6C are cross-sectional views each illustrating an example of a display unit.
Figure 6B:
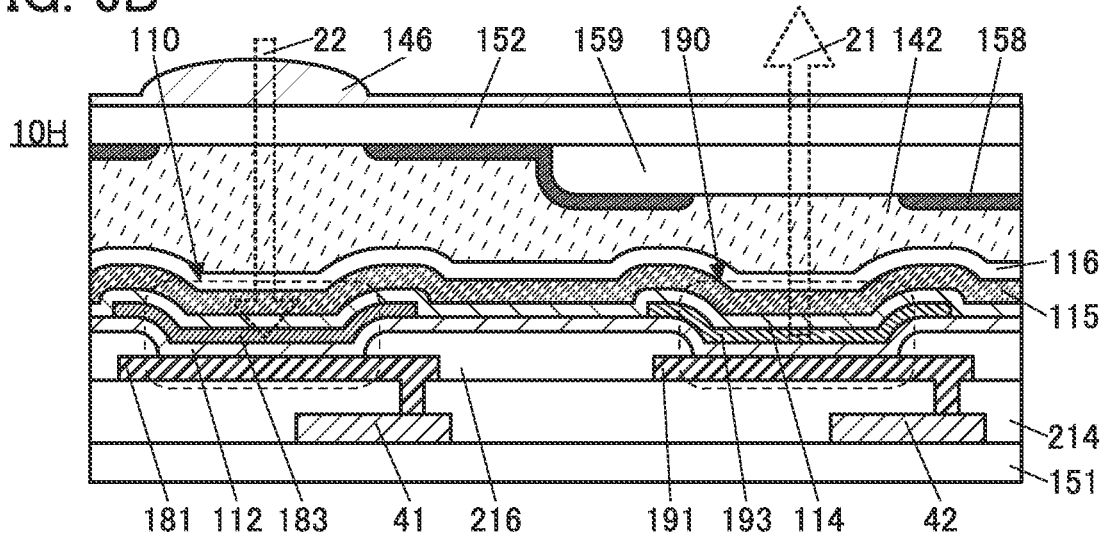

FIG. 5C is a cross-sectional view of a display unit 10F. FIG. 6A is a cross-sectional view of a display unit 10G. FIG. 6B is a cross-sectional view of a display unit 10H.

The display unit 10F includes a lens 149 in addition to the components of the display unit 10D.

The display unit of this embodiment may include the lens 149. The lens 149 is provided at the position overlapping with the light-receiving device 110. In the display unit 10F, the lens 149 is provided in contact with the substrate 152. The lens 149 included in the display unit 10F has a convex surface facing the substrate 151.

In the case where the light-blocking layer 158 and the lens 149 are formed on the same surface of the substrate 152, their formation order is not limited. FIG. 5C illustrates an example in which the lens 149 is formed first; alternatively, the light-blocking layer 158 may be formed first. In FIG. 5C, an end portion of the lens 149 is covered with the light-blocking layer 158.

In the display unit 10F, the light 22 enters the light-receiving device 110 through the lens 149. With the lens 149, the imaging range of the light-receiving device 110 can be narrowed as compared to the case where the lens 149 is not provided, thereby inhibiting overlap between the imaging ranges of the adjacent light-receiving devices 110. Thus, a clear image with little blurring can be captured. Given that the imaging range of the light-receiving device 110 does not change, the lens 149 allows the size of a pinhole (corresponding to the size of an opening in the light-blocking layer 158 that overlaps with the light-receiving device 110 in FIG. 5C) to be increased, compared to the case where the lens 149 is not provided. Hence, providing the lens 149 can increase the amount of light entering the light-receiving device 110.

Like the display unit 10F, the display unit 10G illustrated in FIG. 6A has a structure in which the light 22 enters the light-receiving device 110 through the lens 149.

In the display unit 10G, the lens 149 is provided in contact with a top surface of the protective layer 116. The lens 149 included in the display unit 10G has a convex surface facing the substrate 152.

In the display unit 10H illustrated in FIG. 6B, a lens array 146 is provided on the display surface side of the substrate 152. A lens included in the lens array 146 is provided at the position overlapping with the light-receiving device 110. The light-blocking layer 158 is preferably provided on the surface of the substrate 152 on the substrate 151 side.

As a method for forming the lens used in the display unit of this embodiment, a lens such as a microlens may be formed directly over the substrate or the light-receiving device, or a lens array formed separately, such as a microlens array, may be attached to the substrate.

The lens preferably has a refractive index of greater than or equal to 1.3 and less than or equal to 2.5. The lens can be formed using at least one of an inorganic material and an organic material. For example, a material containing a resin can be used for the lens. Moreover, a material containing at least one of an oxide and a sulfide can be used for the lens.

Specifically, a resin containing chlorine, bromine, or iodine, a resin containing a heavy metal atom, a resin having an aromatic ring, a resin containing sulfur, and the like can be used for the lens. Alternatively, a material containing a resin and nanoparticles of a material having a higher refractive index than the resin can be used for the lens. Titanium oxide, zirconium oxide, and the like can be used for the nanoparticles.

In addition, cerium oxide, hafnium oxide, lanthanum oxide, magnesium oxide, niobium oxide, tantalum oxide, titanium oxide, yttrium oxide, zinc oxide, an oxide containing indium and tin, an oxide containing indium, gallium, and zinc, and the like can be used for the lens. Alternatively, zinc sulfide and the like can be used for the lens.

[Display Unit 10J]

Figure 6C:
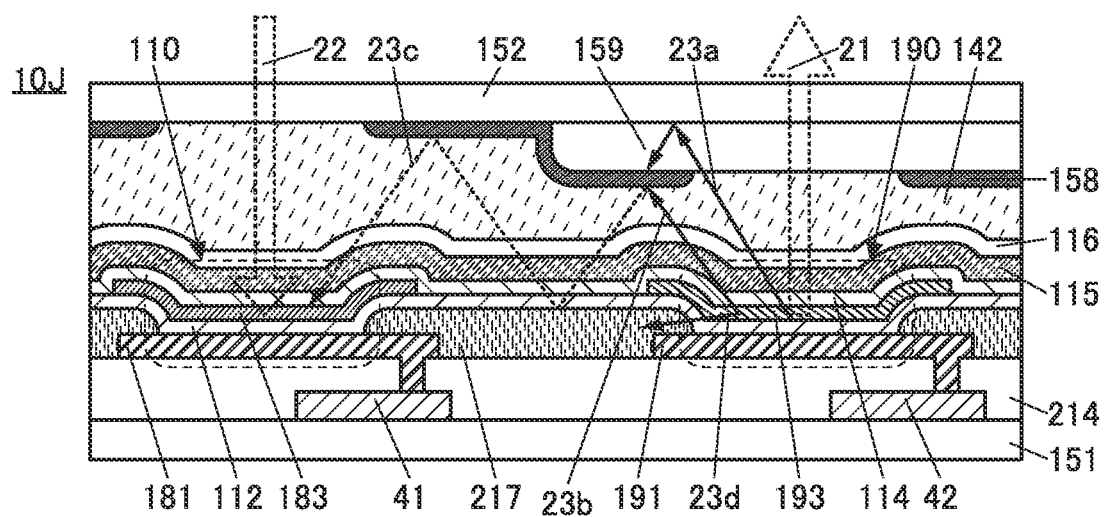

FIG. 6C is a cross-sectional view of a display unit 10J.

The display unit 10J is different from the display unit 10D in that the display unit 10J does not include the partition 216 that transmits visible light but includes the partition 217 that blocks visible light.

The partition 217 preferably absorbs light emitted from the light-emitting device 190. As the partition 217, a black matrix can be formed using a resin material containing a pigment or dye, for example. Moreover, the partition 217 can be formed of a colored insulating layer by using a brown resist material.

In the display unit 10D (FIG. 5A), in some cases, light emitted from the light-emitting device 190 is reflected by the substrate 152 and the partition 216, and the reflected light enters the light-receiving device 110. In other cases, light emitted from the light-emitting device 190 passes through the partition 216 and is reflected by the transistor, a wiring, or the like, and thus the reflected light enters the light-receiving device 110. In the display unit 10J, such reflected light can be prevented from entering the light-receiving device 110 because light is absorbed by the partition 217. Hence, noise can be reduced, and the sensitivity of the sensor using the light-receiving device 110 can be increased.

The partition 217 preferably absorbs at least a wavelength of light that is sensed by the light-receiving device 110. For example, in the case where the light-receiving device 110 senses green light emitted from the light-emitting device 190, the partition 217 preferably absorbs at least green light. For example, when the partition 217 includes a red color filter, the partition 217 can absorb green light and thus reflected light can be prevented from entering the light-receiving device 110.

Although the light-blocking layer 158 can absorb most of the stray light 23b before the stray light 23b reaches the resin layer 159, part of the stray light 23b may be reflected and enter the partition 217. When the partition 217 is configured to absorb the stray light 23b, the stray light 23b can be prevented from entering the transistor, the wiring, or the like. Thus, stray light 23c can be prevented from reaching the light-receiving device 110. With a larger number of times the stray light 23b strikes the light-blocking layer 158 and the partition 217, the amount of absorbed light can be increased and the amount of the stray light 23c reaching the light-receiving device 110 can be extremely small. The resin layer 159 is preferably thick, in which case the number of times the stray light 23b strikes the light-blocking layer 158 and the partition 217 can be increased.

Since the partition 217 absorbs light, stray light 23d that enters the partition 217 directly from the light-emitting device 190 can be absorbed by the partition 217. This also demonstrates that providing the partition 217 can reduce the amount of stray light incident on the light-receiving device 110.

[Display Unit 10K]

Figure 7A:
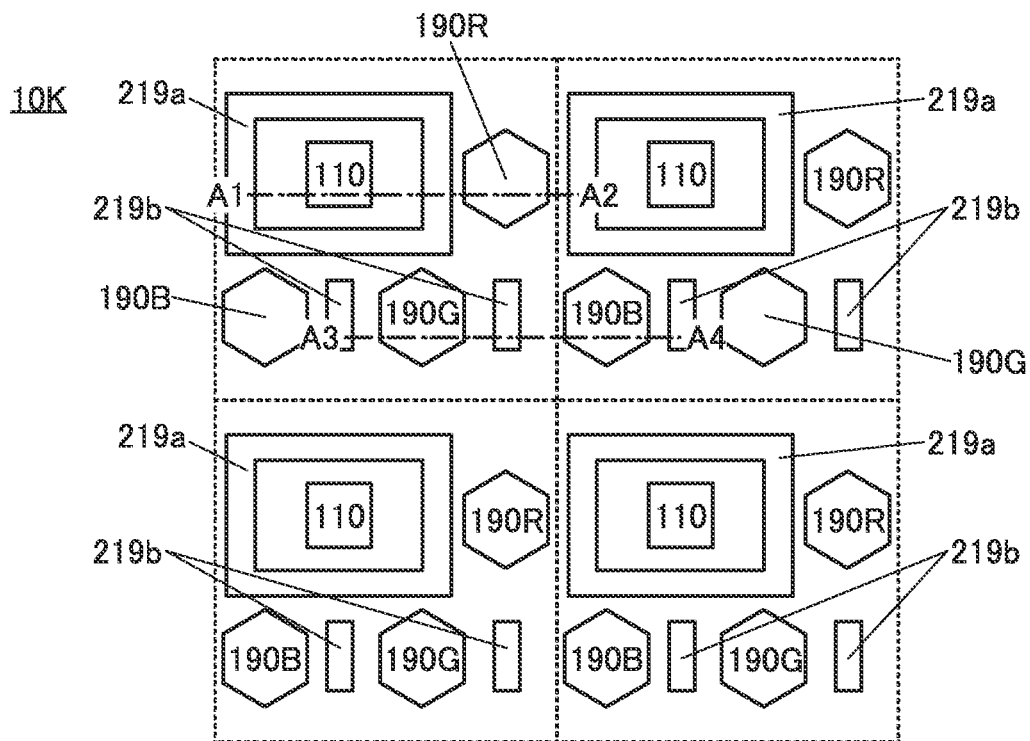
FIG. 7A is a top view illustrating an example of a display unit.
Figure 7B:
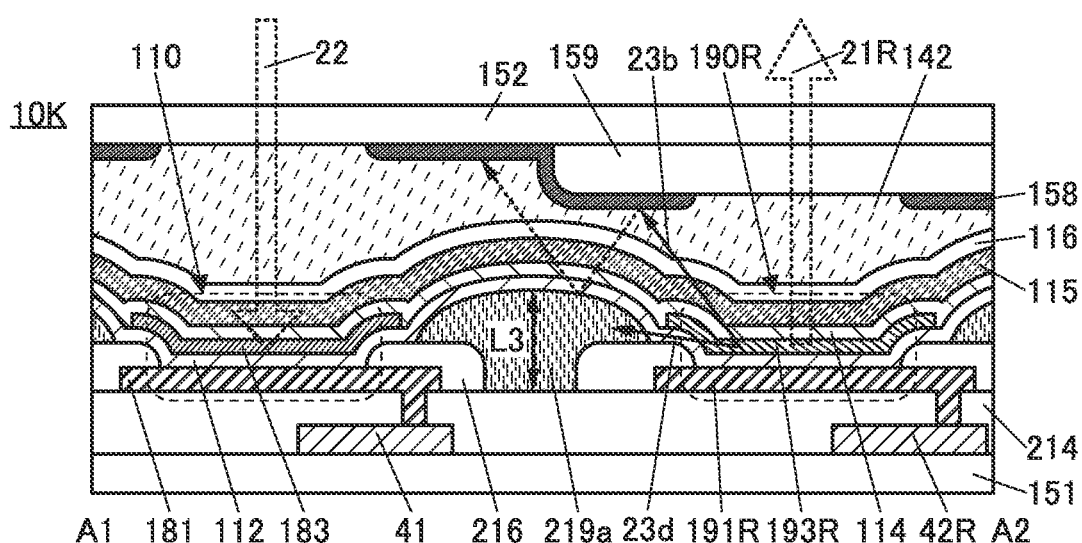
FIG. 7B is a cross-sectional view illustrating an example of the display unit.
Figure 8A:
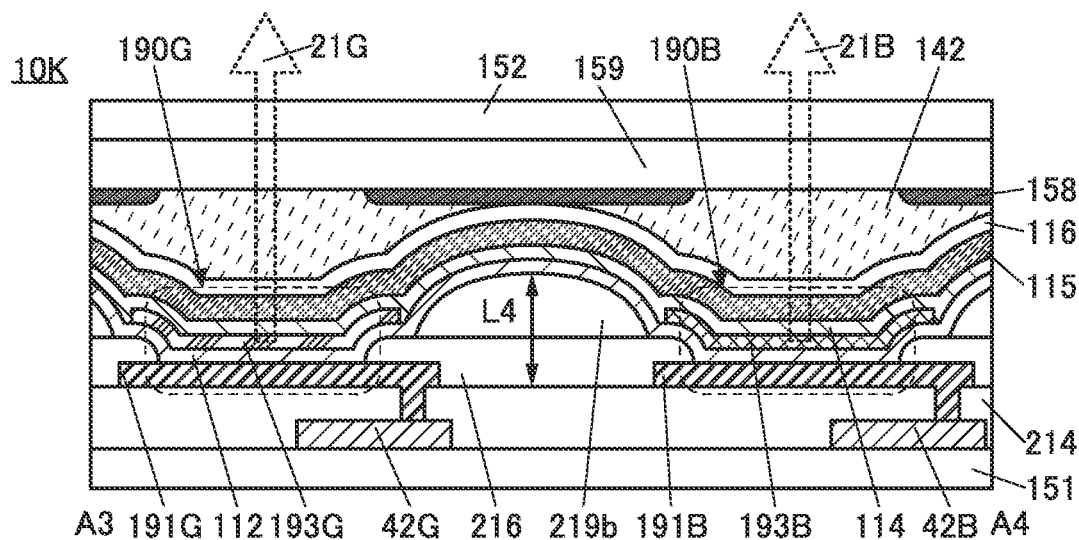
FIGS. 8A and 8B are cross-sectional views each illustrating an example of a display unit.

FIG. 7A is a top view of a display unit 10K. FIG. 7B is a cross-sectional view along the dashed-dotted line A1-A2 in FIG. 7A. FIG. 8A is a cross-sectional view along the dashed-dotted line A3-A4 in FIG. 7A.

In FIG. 7A, a portion surrounded by a dotted frame corresponds to one pixel. One pixel includes the light-receiving device 110, a red light-emitting device 190R, a green light-emitting device 190G, and a blue light-emitting device 190B.

There is no particular limitation on the top surface shapes of the light-receiving device 110 and the light-emitting devices 190R, 190G, and 190B. In the pixel layout illustrated in FIG. 7A, a hexagonal close-packed arrangement is employed. The hexagonal close-packed arrangement is preferable because the fill factors of the light-receiving device 110 and the light-emitting devices 190R, 190G, and 190 can be increased. In the top view, the light-emitting region of the light-receiving device 110 is quadrilateral, and the light-emitting region of each of the light-emitting devices 190R, 190G, and 190B is hexagonal.

In the top view (also referred to as plan view), the light-receiving device 110 is provided on the inner side of a frame-shaped light-blocking layer 219a. The four sides of the light-receiving device 110 are completely surrounded by the light-blocking layer 219a, thereby inhibiting entry of stray light into the light-receiving device 110. Note that the frame-shaped light-blocking layer 219a may have a gap (also referred to as a space, a disconnected portion, or a missing portion).

In the top view, a spacer 219b is provided between the green light-emitting device 190G and the blue light-emitting device 190B.

As illustrated in FIG. 7B and FIG. 8A, the display unit 10K includes the light-receiving device 110, the red light-emitting device 190R, the green light-emitting device 190G, and the blue light-emitting device 190B.

The light-emitting device 190R includes a pixel electrode 191R, the common layer 112, a light-emitting layer 193R, the common layer 114, and the common electrode 115. The light-emitting layer 193R contains an organic compound that emits red light 21R. The light-emitting device 190R has a function of emitting red light.

The light-emitting device 190G includes a pixel electrode 191G, the common layer 112, a light-emitting layer 193G, the common layer 114, and the common electrode 115. The light-emitting layer 193G contains an organic compound that emits green light 21G. The light-emitting device 190G has a function of emitting green light.

The light-emitting device 190B includes a pixel electrode 191B, the common layer 112, a light-emitting layer 193B, the common layer 114, and the common electrode 115. The light-emitting layer 193B contains an organic compound that emits blue light 21B. The light-emitting device 190B has a function of emitting blue light.

The light-receiving device 110 includes the pixel electrode 181, the common layer 112, the active layer 183, the common layer 114, and the common electrode 115. The active layer 183 contains an organic compound. The light-receiving device 110 has a function of sensing visible light.

In the display unit 10K, the light-receiving device 110, the light-emitting device 190R, the light-emitting device 190G, the light-emitting device 190B, the transistor 41, a transistor 42R, a transistor 42G, a transistor 42B, and the like are provided between a pair of substrates (the substrate 151 and the substrate 152).

End portions of the pixel electrodes 181, 191R, 191G, and 191B are covered with the partition 216.

The pixel electrode 181 is electrically connected to the source or the drain of the transistor 41 through an opening provided in the insulating layer 214. The pixel electrode 191R is electrically connected to a source or a drain of the transistor 42R through an opening provided in the insulating layer 214. Similarly, the pixel electrode 191G is electrically connected to a source or a drain of the transistor 42G through an opening provided in the insulating layer 214. The pixel electrode 191B is electrically connected to a source or a drain of the transistor 42B through an opening provided in the insulating layer 214.

The light-receiving device 110 and the light-emitting devices 190R, 190G, and 190B are covered with the protective layer 116.

The resin layer 159 is provided on a surface of the substrate 152 on the substrate 151 side. The resin layer 159 is provided at the positions overlapping with the light-emitting devices 190R, 190G, and 190B and is not provided at the position overlapping with the light-receiving device 110.

The light-blocking layer 158 is provided on the surfaces of the substrate 152 and the resin layer 159 on the substrate 151 side. The light-blocking layer 158 has openings at the positions overlapping with the light-emitting devices 190R, 190G, and 190B and at the position overlapping with the light-receiving device 110.

In the top view, a frame-shaped opening is provided in the partition 216. In FIG. 7B, the partition 216 has an opening between the light-receiving device 110 and the light-emitting device 190R. The light-blocking layer 219a is provided to cover the opening. The light-blocking layer 219a preferably covers the opening of the partition 216 and a side surface of the partition 216 exposed in the opening. Furthermore, the light-blocking layer 219a preferably covers at least part of a top surface of the partition 216.

Although the light-blocking layer 219a can be provided over the partition 216 that does not have an opening, there is a possibility that stray light passes through the partition 216 and enters the light-receiving device 110. When the partition 216 has an opening and the light-blocking layer 219a is provided to fill the opening, stray light that passes through the partition 216 is absorbed by the light-blocking layer 219a in the opening of the partition 216. This can inhibit entry of stray light into to the light-receiving device 110.

The light-blocking layer 219a preferably has a forward tapered shape. This can improve the coverage of the light-blocking layer 219a with the films provided thereover (e.g., the common layer 112, the common layer 114, the common electrode 115, and the protective layer 116).

The light-blocking layer 219a preferably absorbs at least a wavelength of light that is sensed by the light-receiving device 110. For example, in the case where the light-receiving device 110 senses green light emitted from the light-emitting device 190G, the light-blocking layer 219a preferably absorbs at least green light. For example, when the light-blocking layer 219a includes a red color filter, the light-blocking layer 219a can absorb green light and thus reflected light can be prevented from entering the light-receiving device 110. The light-blocking layer 219a may be a black matrix formed using a resin material containing a pigment or dye, for example. The light-blocking layer 219a may have a stacked-layer structure of a red color filter, a green color filter, and a blue color filter. Alternatively, as the light-blocking layer 219a, a colored insulating layer may be formed using a brown resist material.

For example, when the light-receiving device 110 senses green light emitted from the light-emitting device 190G, in some cases, light emitted from the light-emitting device 190G is reflected by the substrate 152 and the partition 216, and the reflected light enters the light-receiving device 110. In other cases, light emitted from the light-emitting device 190G passes through the partition 216 and is reflected by the transistor, the wiring, or the like, and thus the reflected light enters the light-receiving device 110. In the display unit 10K, such reflected light can be prevented from entering the light-receiving device 110 because light is absorbed by the light-blocking layer 158 and the light-blocking layer 219a. Hence, noise can be reduced, and the sensitivity of the sensor using the light-receiving device 110 can be increased.

For example, the light-blocking layer 158 can absorb most of the stray light 23b before the stray light 23b reaches the resin layer 159. Furthermore, even when part of the stray light 23b is reflected by the light-blocking layer 158, the light-blocking layer 219a absorbs the stray light 23b, thereby inhibiting entry of the stray light 23b into the transistor, the wiring, or the like. Thus, stray light can be prevented from reaching the light-receiving device 110. With a larger number of times the stray light 23b strikes the light-blocking layer 158 and the light-blocking layer 219a, the amount of absorbed light can be increased and the amount of stray light reaching the light-receiving device 110 can be extremely small. The resin layer 159 is preferably thick, in which case the number of times the stray light 23b strikes the light-blocking layer 158 and the light-blocking layer 219a can be increased. The thick resin layer 159 is also preferable in terms of display quality, because a shorter distance from the light-blocking layer 158 to the light-emitting device of each color can reduce viewing angle dependence of display.

Since the light-blocking layer 219a absorbs light, the stray light 23d that enters the light-blocking layer 219a directly from the light-emitting device can be absorbed by the light-blocking layer 219a. This also demonstrates that providing the light-blocking layer 219a can reduce the amount of stray light incident on the light-receiving device 110.

Providing the light-blocking layer 158 can control the range where the light-receiving device 110 senses light. When the distance from the light-blocking layer 158 to the light-receiving device 110 is long, the imaging range is narrowed, and the imaging resolution can be increased.

The spacer 219b is positioned over the partition 216, and is positioned between the light-emitting device 190G and the light-emitting device 190B in the top view. A top surface of the spacer 219b is preferably closer to the light-blocking layer 158 than a top surface of the light-blocking layer 219a is. When a thickness L3 of the light-blocking layer 219a is greater than or equal to a total thickness L4 of the partition 216 and the spacer 219b, the inside of the frame-shaped light-blocking layer 219a is not sufficiently filled with the adhesive layer 142 in some cases, which might reduce the reliability of the light-receiving device 110 or even the reliability of the display unit 10K. Therefore, the total thickness L4 of the partition 216 and the spacer 219b is preferably larger than the thickness L3 of the light-blocking layer 219a. Thus, the inside of the light-blocking layer 219a can be easily filled with the adhesive layer 142. As illustrated in FIG. 8A, the light-blocking layer 158 may be in contact with the protective layer 116 (or the common electrode 115) in a portion where the spacer 219b and the light-blocking layer 158 overlap with each other.

[Display Unit 10L]

Figure 8B:
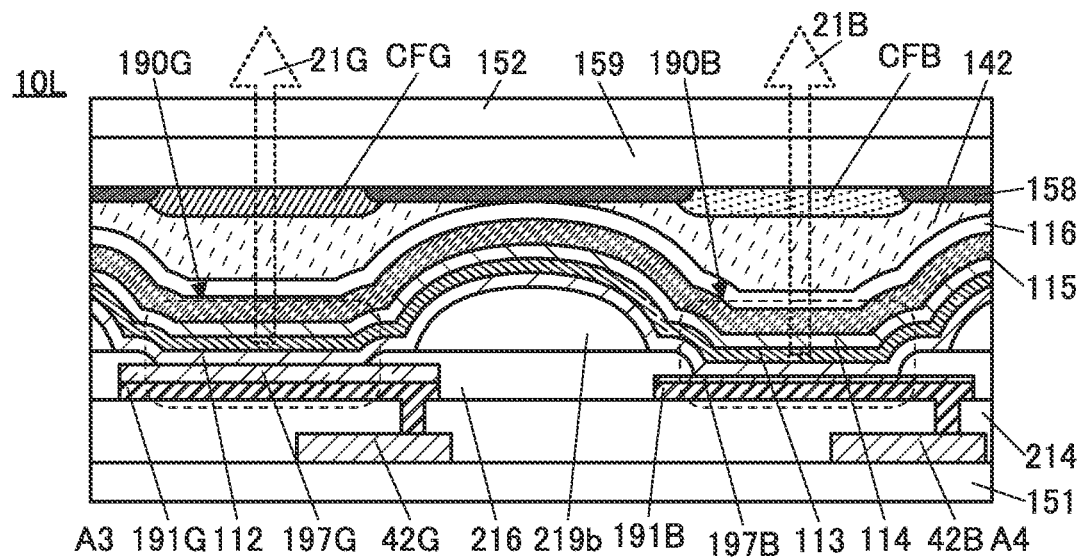

FIG. 8B is a cross-sectional view of a display unit 10L.

In the display unit 10L, the light-emitting devices 190R, 190G, and 190B include the same light-emitting layer. FIG. 8B corresponds to a cross-sectional view along the dashed-dotted line A3-A4 in FIG. 7A.

The light-emitting device 190G in FIG. 8B includes the pixel electrode 191G, an optical adjustment layer 197G, the common layer 112, the light-emitting layer 113, the common layer 114, and the common electrode 115. The light-emitting device 190B in FIG. 8B includes the pixel electrode 191B, an optical adjustment layer 197B, the common layer 112, the light-emitting layer 113, the common layer 114, and the common electrode 115. The common layer 112, the light-emitting layer 113, and the common layer 114 are common components between the light-emitting devices 190R, 190G, and 190B. The light-emitting layer 113 includes, for example, the light-emitting layer 193R that emits red light, the light-emitting layer 193G that emits green light, and the light-emitting layer 193B that emits blue light.

Although the common layer 112, the light-emitting layer 113, and the common layer 114 are shown as the EL layer in FIG. 8B, this embodiment is not limited thereto. The light-emitting device may have a single structure (FIG. 18A) in which one EL layer is provided between the pixel electrode and the common electrode, or a tandem structure (FIG. 18B) in which a plurality of EL layers are provided between the electrodes.

The light-emitting layer 113 is shared by the light-emitting devices that emit light of different colors. Light emitted from the light-emitting device 190G is extracted as the green light 21G through a coloring layer CFG. Light emitted from the light-emitting device 190B is extracted as the blue light 21B through a coloring layer CFB.

The light-emitting device 190G and the light-emitting device 190B have the same structure except that they include optical adjustment layers with different thicknesses.

A reflective electrode is used as the pixel electrode 191G and the pixel electrode 191B. As the optical adjustment layer, a light-transmitting electrode over the reflective electrode can be used. The thickness of the optical adjustment layer 197 preferably varies between the light-emitting devices of different colors. The light-emitting device 190G illustrated in FIG. 8B has been optically adjusted using the optical adjustment layer 197G so that the optical path length between the pixel electrode 191G and the common electrode 115 intensifies green light. Similarly, the light-emitting device 190B has been optically adjusted using the optical adjustment layer 197B so that the optical path length between the pixel electrode 191B and the common electrode 115 intensifies blue light.

[Display Unit 10M]

Figure 9A:
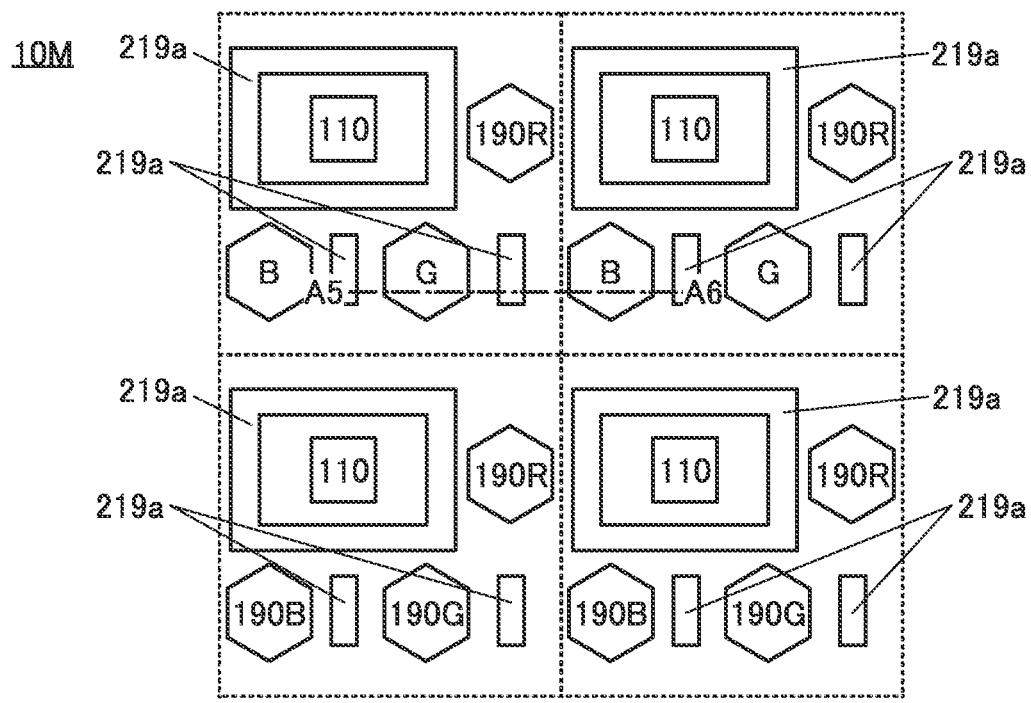
FIG. 9A is a top view illustrating an example of a display unit.
Figure 9B:
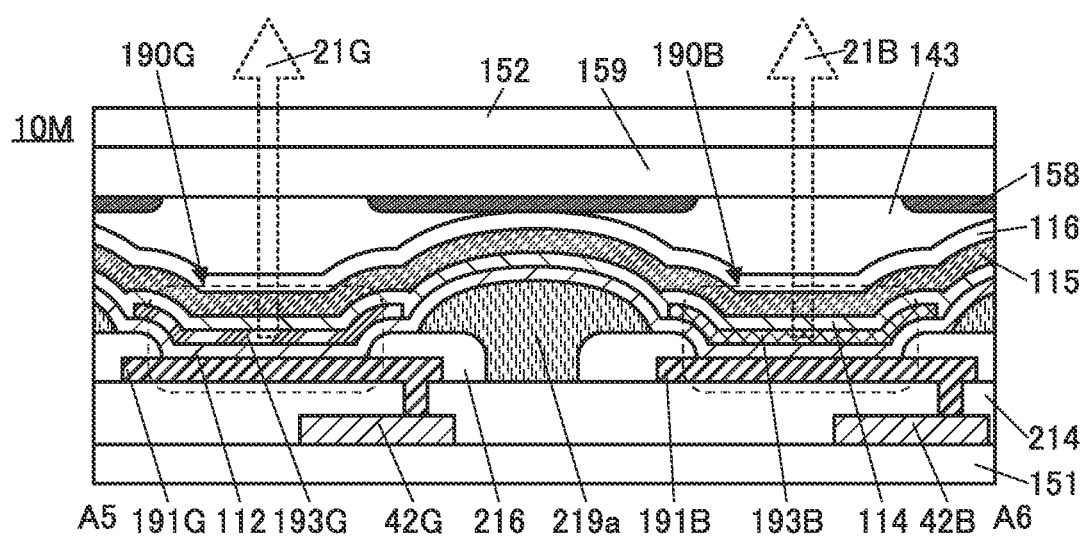
FIG. 9B is a cross-sectional view illustrating an example of the display unit.

FIG. 9A is a top view of a display unit 10M. FIG. 9B is a cross-sectional view along the dashed-dotted line A5-A6 in FIG. 9A.

The display unit 10M illustrated in FIGS. 9A and 9B is different from the display unit 10K illustrated in FIGS. 7A, 7B, and 8A in including the light-blocking layer 219a between the green light-emitting device 190G and the blue light-emitting device 190B and employing a hollow sealing structure in which a space 143 is filled with an inert gas.

As in the display unit 10M, the light-blocking layer 219a may be provided both between the light-emitting device 190R and the light-receiving device 110 and between the light-emitting device 190G and the light-emitting device 190B.

[Display unit 10N]

Figure 10A:
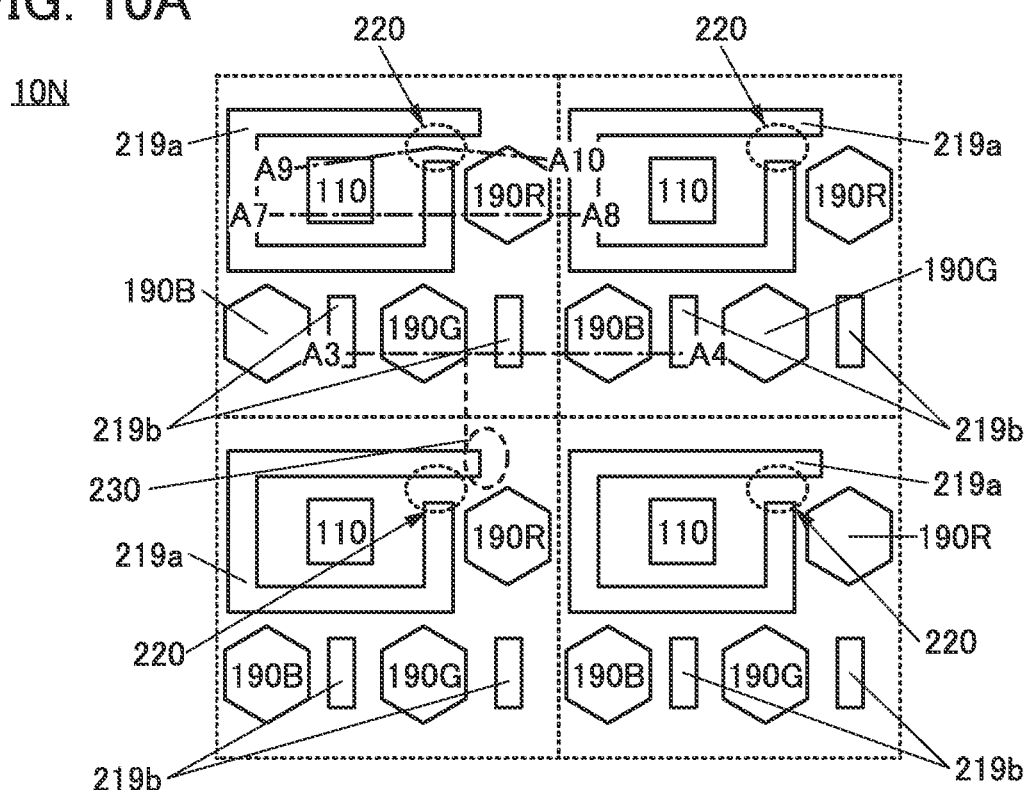
FIG. 10A is a top view illustrating an example of a display unit.
Figure 10B:
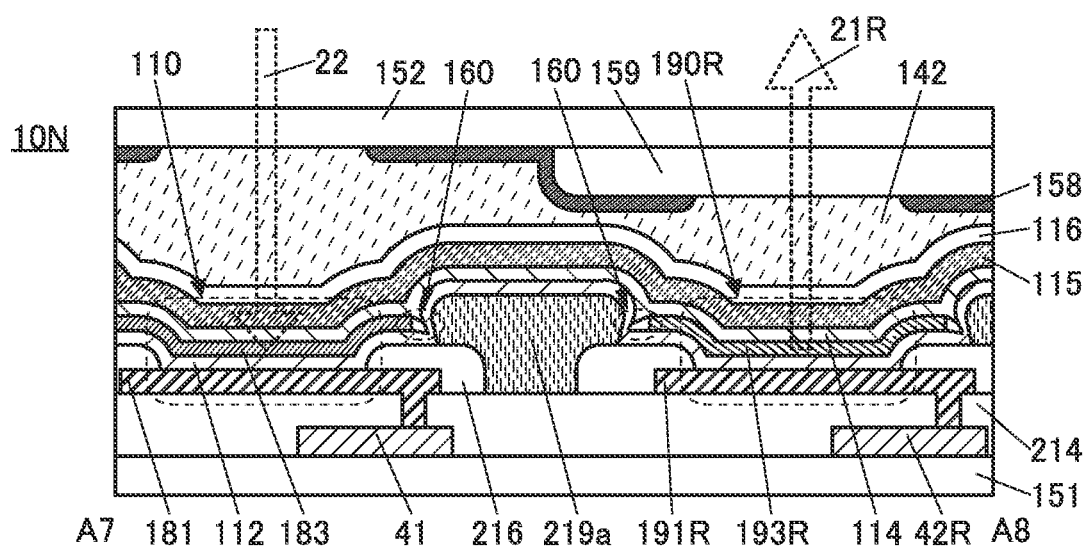
FIG. 10B is a cross-sectional view illustrating an example of the display unit.
Figure 11A:
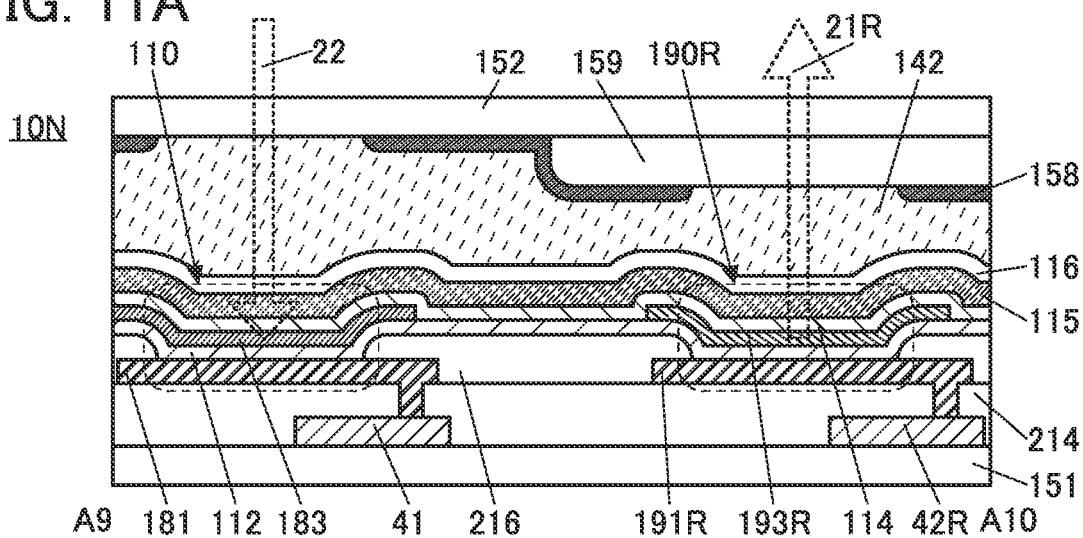
FIGS. 11A and 11B are cross-sectional views each illustrating an example of a display unit.

FIG. 10A is a top view of a display unit 10N. FIG. 10B is a cross-sectional view along the dashed-dotted line A7-A8 in FIG. 10A. FIG. 11A is a cross-sectional view along the dashed-dotted line A9-A10 in FIG. 10A.

As a cross-sectional structure of the display unit 10N (FIG. 10A) along the dashed-dotted line A3-A4, a structure similar to that of the display unit 10K (FIG. 8A) can be employed. Alternatively, a structure similar to that of the display unit 10M (FIG. 9B) may be employed.

The top surface shape and the cross-sectional shape of the light-blocking layer 219a in the display unit 10N are different from those in the display unit 10K (FIGS. 7A and 7B).

In the top view (also referred to as plan view), the light-blocking layer 219a surrounds the four sides of the light-receiving device 110 and has one end and the other end apart from each other. A gap 220 (also referred to as space, disconnected portion, or missing portion) of the light-blocking layer 219a is positioned close to the red light-emitting device 190R. In the case where only a light-emitting device that emits light of a specific color is used as a light source for sensing, the gap 220 of the light-blocking layer 219a is preferably positioned close to a light-emitting device different from the light-emitting device used for the sensing. For example, the display unit 10N is preferably configured to perform sensing with the use of the green light-emitting device 190G or the blue light-emitting device 190B. Thus, an influence of noise in the sensing can be suppressed. Moreover, in the case where sensing is performed using the green light-emitting device 190G, it is preferred that one end of the light-blocking layer 219a extend toward the red light-emitting device 190R more than toward the green light-emitting device 190G, as shown in a region 230. Accordingly, stray light from the green light-emitting device 190G can be prevented from entering the light-receiving device 110 through the gap 220.

The partition 216 has an opening between the light-receiving device 110 and the light-emitting device 190R.

The light-blocking layer 219a is provided to cover the opening. The light-blocking layer 219a preferably covers the opening of the partition 216 and a side surface of the partition 216 exposed in the opening. Furthermore, the light-blocking layer 219a preferably covers at least part of the top surface of the partition 216.

The light-blocking layer 219a may have an inversely tapered shape. The organic film and the common electrode 115 that are provided over the inversely tapered light-blocking layer 219a may be thin around a side surface of the light-blocking layer 219a. Furthermore, a space 160 is sometimes generated around the side surface of the light-blocking layer 219a.

Here, if the light-blocking layer 219a surrounds all the four sides of the light-receiving device 110 in the top view, the common electrode 115 might be broken by the light-blocking layer 219a and separated into a portion on the inner side of the light-blocking layer 219a and a portion on the outer side thereof. In view of this, the gap 220 is provided by making the light-blocking layer 219a have a top surface shape such that the light-blocking layer 219a surrounds the four sides of the light-receiving device 110 and its one end is apart from the other end; hence, separation of the common electrode 115 can be inhibited. Consequently, a display defect in the display unit 10N can be inhibited.

FIG. 11A is a cross-sectional view including the gap 220 of the light-blocking layer 219a.

In the top view, the partition 216 has an opening that surrounds the four sides of the light-receiving device 110 and has one end and the other end apart from each other in a manner similar to the top surface shape of the light-blocking layer 219a. In the gap 220 of the light-blocking layer 219a, the common layer 112, the common layer 114, the common electrode 115, and the protective layer 116 are provided in this order over the partition 216.

[Display Unit 10P]

Figure 11B:
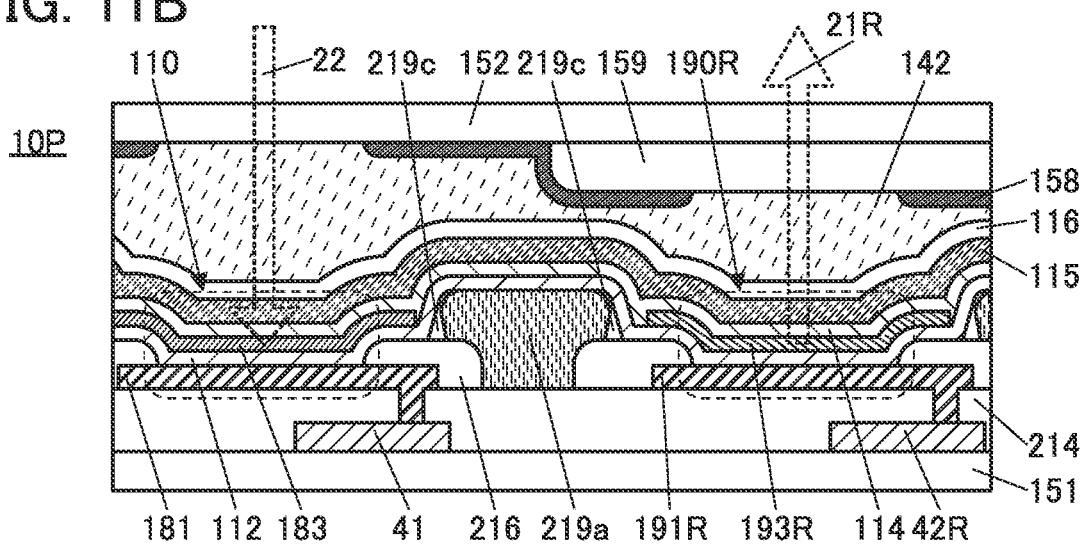

FIG. 11B is a cross-sectional view of a display unit 10P.

The display unit 10P is different from the display unit 10N in including a sidewall 219c in contact with a side surface of the light-blocking layer 219a.

In the display unit 10P, the top surface of the light-blocking layer 219a may have a frame shape as illustrated in FIG. 7A or may have the gap 220 as illustrated in FIG. 10A.

Providing the sidewall 219c in contact with the side surface of the inversely tapered light-blocking layer 219a makes it possible to improve the coverage of the light-blocking layer 219a with the organic film, the common electrode 115, and the like and increase the display quality of the display unit. Improvement of the coverage of the light-blocking layer 219a with the common electrode 115 can prevent breakage or even thickness reduction of the common electrode 115, thereby inhibiting display luminance unevenness due to a voltage drop of the common electrode 115.

The sidewall 219c can be formed using a material that can be used for the partition 216.

[Display Unit 10Q]

Figure 12A:
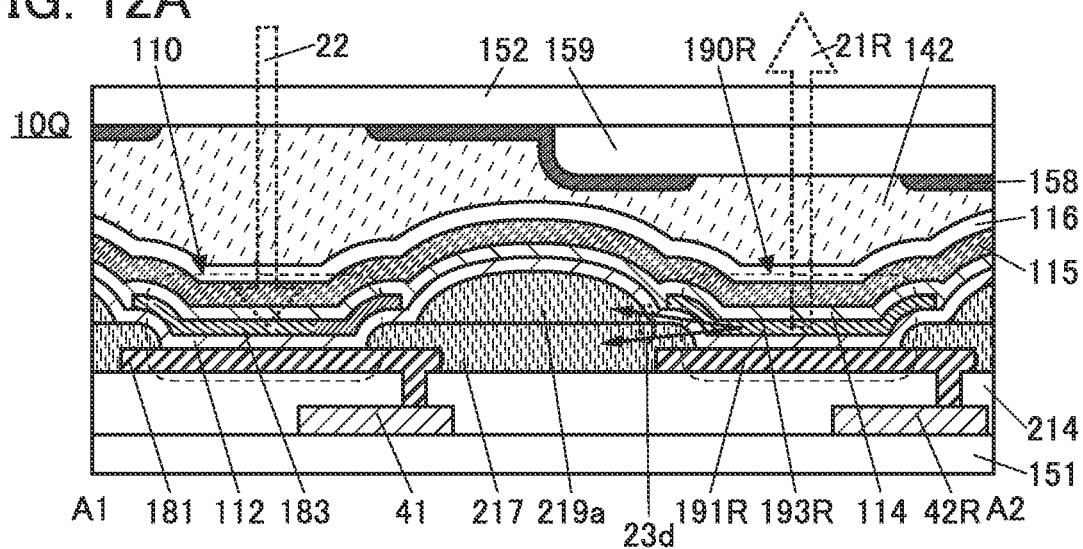
FIGS. 12A and 12B are cross-sectional views illustrating an example of a display unit.
Figure 12B:
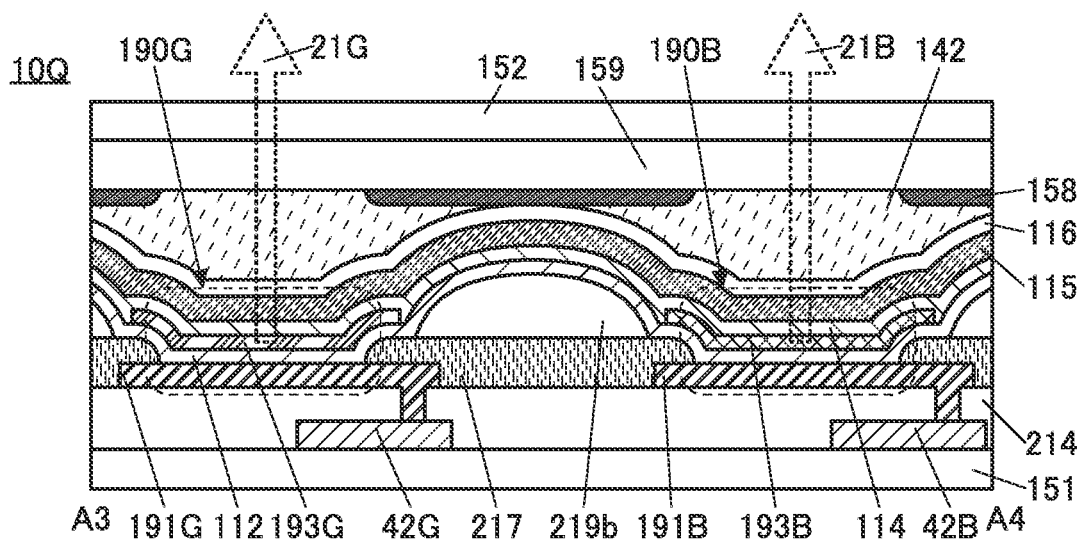

FIGS. 12A and 12B are cross-sectional views of a display unit 10Q. The display unit 10Q can have a top surface structure similar to that of the display unit 10K (FIG. 7A). FIG. 12A is a cross-sectional view along the dashed-dotted line A1-A2 in FIG. 7A. FIG. 12B is a cross-sectional view taken along the dashed-dotted line A3-A4 in FIG. 7A.

The display unit 10Q differs from the display unit 10K mainly in that the display unit 10Q does not include the partition 216 and includes the partition 217.

The light-blocking layer 219a is positioned over the partition 217. Unlike the partition 216, the partition 217 can absorb light emitted from the light-emitting device; hence, an opening does not need to be formed in the partition 217. The stray light 23d that enters the partition 217 from the light-emitting device is absorbed by the partition 217. The stray light 23d that enters the light-blocking layer 219a from the light-emitting device is absorbed by the light-blocking layer 219a.

The spacer 219b is positioned between the light-emitting device 190G and the light-emitting device 190B. The top surface of the spacer 219b is preferably closer to the light-blocking layer 158 than the top surface of the light-blocking layer 219a is. When the spacer 219b is thinner than the light-blocking layer 219a, the inside of the frame-shaped light-blocking layer 219a is not sufficiently filled with the adhesive layer 142 in some cases, which might reduce the reliability of the light-receiving device 110 or even the reliability of the display unit 10Q. Therefore, the spacer 219b is preferably thicker than the light-blocking layer 219a. Thus, the inside of the light-blocking layer 219a can be easily filled with the adhesive layer 142. As illustrated in FIG. 12B, the light-blocking layer 158 may be in contact with the protective layer 116 (or the common electrode 115) in a portion where the spacer 219b and the light-blocking layer 158 overlap with each other.

A more detailed structure of the display unit of one embodiment of the present invention will be described below with reference to FIG. 13, FIG. 14, FIGS. 15A and 15B, FIG. 16, and FIGS. 17A and 17B.

[Display Unit 100A]

Figure 13:
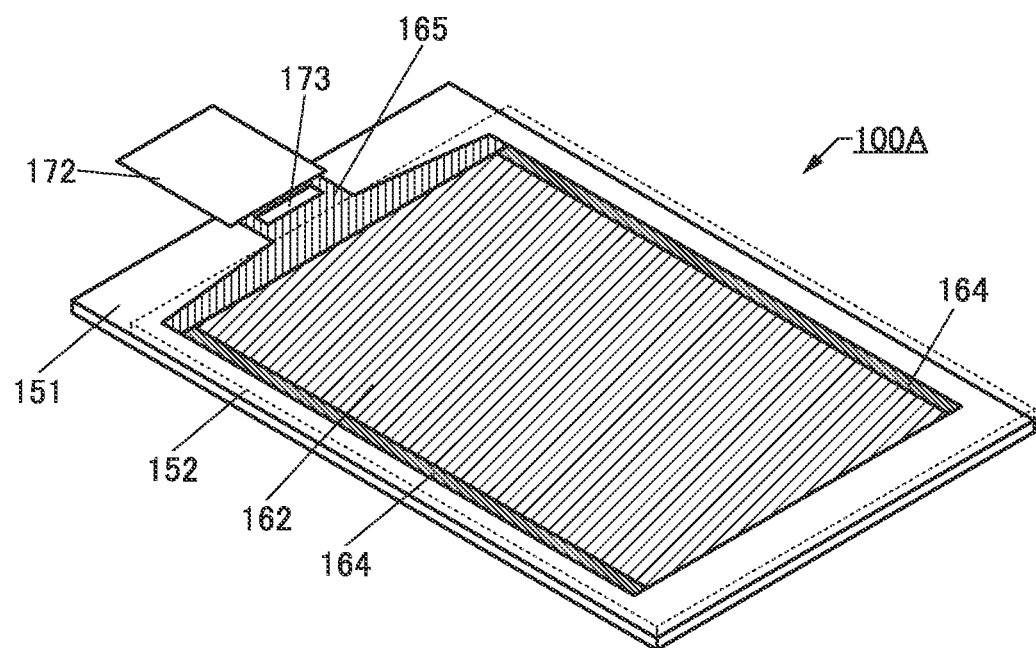
FIG. 13 is a perspective view illustrating an example of a display unit.
Figure 14:
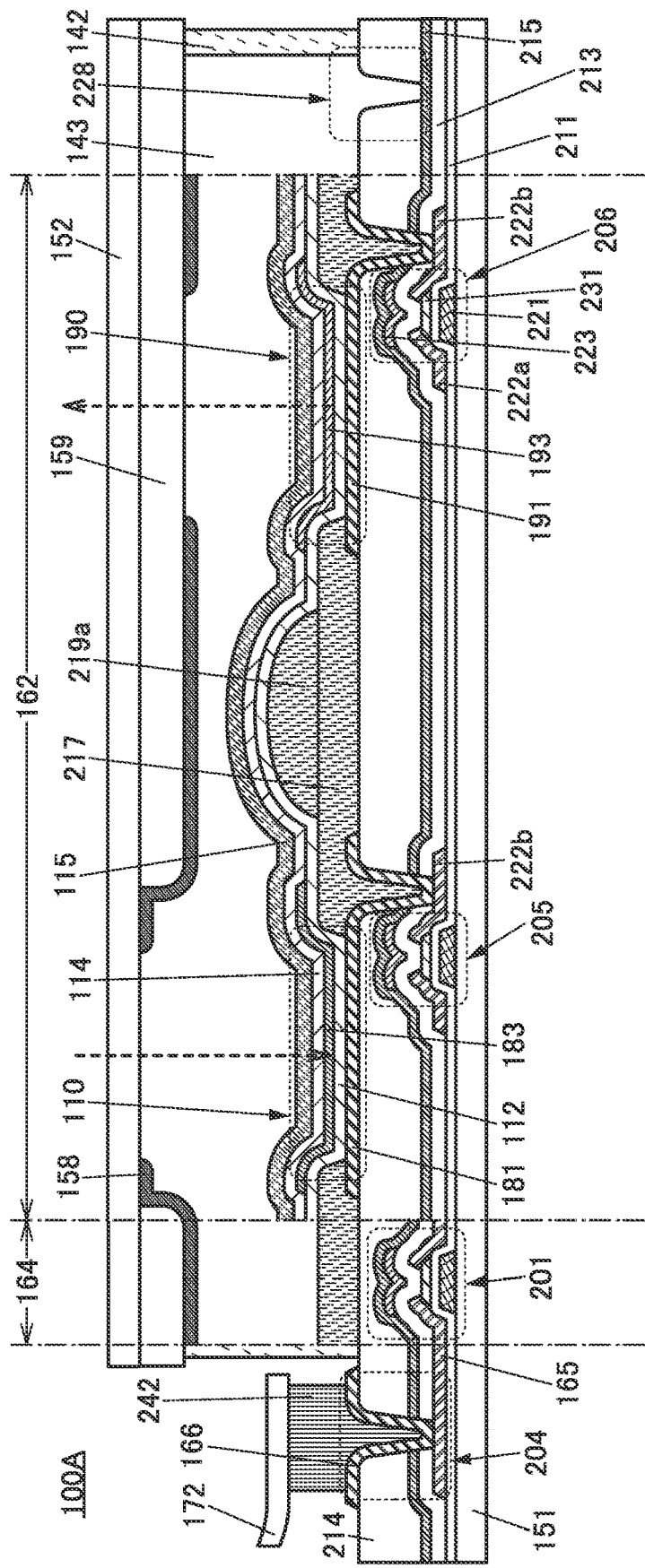
FIG. 14 is a cross-sectional view illustrating an example of a display unit.

FIG. 13 is a perspective view of a display unit 100A, and FIG. 14 is a cross-sectional view of the display unit 100A.

In the display unit 100A, the substrate 152 and the substrate 151 are attached to each other. In FIG. 13, the substrate 152 is denoted by a dashed line.

The display unit 100A includes a display portion 162, a circuit 164, a wiring 165, and the like. FIG. 13 illustrates an example in which an integrated circuit (IC) 173 and an FPC 172 are mounted on the display unit 100A. Thus, the structure illustrated in FIG. 13 can be regarded as a display module including the display unit 100A, the IC, and the FPC.

As the circuit 164, a scan line driver circuit can be used, for example.

The wiring 165 has a function of supplying a signal and power to the display portion 162 and the circuit 164. The signal and power are input to the wiring 165 from the outside through the FPC 172 or from the IC 173.

FIG. 13 illustrates an example in which the IC 173 is provided over the substrate 151 by a chip on glass (COG) method, a chip on film (COF) method, or the like. An IC including a scan line driver circuit, a signal line driver circuit, or the like can be used as the IC 173, for example. Note that the display unit 100A and the display module are not necessarily provided with an IC. The IC may be mounted on the FPC by a COF method or the like.

FIG. 14 illustrates an example of cross sections of part of a region including the FPC 172, part of the circuit 164, part of the display portion 162, and part of a region including an end portion of the display unit 100A.

The display unit 100A in FIG. 14 includes a transistor 201, a transistor 205, a transistor 206, the light-emitting device 190, the light-receiving device 110, and the like between the substrate 151 and the substrate 152.

The resin layer 159 and the insulating layer 214 adhere to each other with the adhesive layer 142. A solid sealing structure, a hollow sealing structure, or the like can be employed to seal the light-emitting device 190 and the light-receiving device 110. In FIG. 14, a hollow sealing structure is employed in which the space 143 surrounded by the substrate 152, the adhesive layer 142, and the substrate 151 is filled with an inert gas (e.g., nitrogen or argon). The adhesive layer 142 may be provided to overlap with the light-emitting device 190 and the light-receiving device 110. The space 143 surrounded by the substrate 152, the adhesive layer 142, and the substrate 151 may be filled with a resin different from that of the adhesive layer 142.

The light-emitting device 190 has a stacked-layer structure in which the pixel electrode 191, the common layer 112, the light-emitting layer 193, the common layer 114, and the common electrode 115 are stacked in this order from the insulating layer 214 side. The pixel electrode 191 is connected to a conductive layer 222b included in the transistor 206 through an opening provided in the insulating layer 214. An end portion of the pixel electrode 191 is covered with the partition 217. The pixel electrode 191 contains a material that reflects visible light, and the common electrode 115 contains a material that transmits visible light.

The light-receiving device 110 has a stacked-layer structure in which the pixel electrode 181, the common layer 112, the active layer 183, the common layer 114, and the common electrode 115 are stacked in this order from the insulating layer 214 side. The pixel electrode 181 is electrically connected to the conductive layer 222b included in the transistor 205 through an opening provided in the insulating layer 214. An end portion of the pixel electrode 181 is covered with the partition 217. The pixel electrode 181 contains a material that reflects visible light, and the common electrode 115 contains a material that transmits visible light.

Light from the light-emitting device 190 is emitted toward the substrate 152. Light enters the light-receiving device 110 through the substrate 152 and the space 143. For the substrate 152, a material having a high visible-light-transmitting property is preferably used.

The pixel electrode 181 and the pixel electrode 191 can be formed using the same material in the same step. The common layer 112, the common layer 114, and the common electrode 115 are used in both the light-receiving device 110 and the light-emitting device 190. The light-receiving device 110 and the light-emitting device 190 can have common components except the active layer 183 and the light-emitting layer 193. Thus, the light-receiving device 110 can be incorporated into the display unit 100A without a significant increase in the number of manufacturing steps.

The resin layer 159 and the light-blocking layer 158 are provided on a surface of the substrate 152 on the substrate 151 side. The resin layer 159 is provided at the position overlapping with the light-emitting device 190 and is not provided at the position overlapping with the light-receiving device 110. The light-blocking layer 158 is provided to cover the surface of the substrate 152 on the substrate 151 side, a side surface of the resin layer 159, and a surface of the resin layer 159 on the substrate 151 side. The light-blocking layer 158 has an opening at the position overlapping with the light-receiving device 110 and an opening at the position overlapping with the light-emitting device 190. Providing the light-blocking layer 158 can control the range where the light-receiving device 110 senses light. Moreover, providing the light-blocking layer 158 can inhibit direct entry of light into the light-receiving device 110 from the light-emitting device 190 without via an object. Hence, a sensor with less noise and high sensitivity can be obtained. Providing the resin layer 159 allows the distance from the light-blocking layer 158 to the light-emitting device 190 to be shorter than the distance from the light-blocking layer 158 to the light-receiving device 110. Accordingly, viewing angle dependence of display can be reduced while noise of the sensor is reduced. Thus, both the display quality and imaging quality can be increased.

The structures of the partition 217 and the light-blocking layer 219a in the display unit 100A are similar to those in the display unit 10Q (FIG. 12A).

The partition 217 covers an end portion of the pixel electrode 181 and an end portion of the pixel electrode 191. The light-blocking layer 219a is provided over the partition 217. The light-blocking layer 219a is positioned between the light-receiving device 110 and the light-emitting device 190. The partition 217 and the light-blocking layer 219a preferably absorb the wavelength of light that the light-receiving device 110 senses. This can reduce stray light entering the light-receiving device 110.

The transistor 201, the transistor 205, and the transistor 206 are formed over the substrate 151. These transistors can be fabricated using the same material in the same step.

An insulating layer 211, an insulating layer 213, an insulating layer 215, and the insulating layer 214 are provided in this order over the substrate 151. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors, in which case the insulating layer can function as a barrier layer. Such a structure can effectively inhibit diffusion of impurities into the transistors from the outside and increase the reliability of the display unit.

An inorganic insulating film is preferably used as each of the insulating layers 211, 213, and 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

An organic insulating film often has a lower barrier property than an inorganic insulating film. Therefore, the organic insulating film preferably has an opening in the vicinity of an end portion of the display unit 100A. This can inhibit entry of impurities from the end portion of the display unit 100A through the organic insulating film. Alternatively, the organic insulating film may be formed so that its end portions is positioned on the inner side compared to the end portion of the display unit 100A, to prevent the organic insulating film from being exposed at the end portion of the display unit 100A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 14, an opening is formed in the insulating layer 214. This can inhibit entry of impurities into the display portion 162 from the outside through the insulating layer 214 even when an organic insulating film is used as the insulating layer 214. Consequently, the reliability of the display unit 100A can be increased.

Each of the transistors 201, 205, and 206 includes a conductive layer 221 functioning as a gate, the insulating layer 211 functioning as a gate insulating layer, a conductive layer 222a and the conductive layer 222b functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display unit of this embodiment. For example, a planar transistor, a staggered transistor, or an inverted staggered transistor can be used. A top-gate transistor or a bottom-gate transistor can be used. Alternatively, gates may be provided above and below a semiconductor layer where a channel is formed.

The transistors 201, 205, and 206 employ a structure in which the semiconductor layer where a channel is formed is positioned between two gates. The two gates may be connected to each other and supplied with the same signal to operate the transistor. Alternatively, the threshold voltage of the transistor may be controlled by supplying a potential for controlling the threshold voltage to one of the two gates and a potential for driving to the other.

There is no particular limitation on the crystallinity of a semiconductor material used in the transistor, and an amorphous semiconductor or a semiconductor having crystallinity (a microcrystalline semiconductor, a polycrystalline semiconductor, a single crystal semiconductor, or a semiconductor partly including crystal regions) can be used. It is preferable to use a semiconductor having crystallinity, in which case degradation of the transistor characteristics can be suppressed.

The semiconductor layer of the transistor preferably contains a metal oxide (also referred to as an oxide semiconductor). Alternatively, the semiconductor layer of the transistor may contain silicon. Examples of silicon include amorphous silicon and crystalline silicon (e.g., low-temperature polysilicon and single crystal silicon).

The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide are In:M:Zn=1:1:1, 1:1:1.2, 2:1:3, 3:1:2, 4:2:3, 4:2:4.1, 5:1:3, 5:1:6, 5:1:7, 5:1:8, 6:1:6, and 5:2:5 and a composition in the vicinity of any of the above atomic ratios. Note that the vicinity of the atomic ratio includes ±30% of an intended atomic ratio.

For example, in the case of describing an atomic ratio of In:Ga:Zn=4:2:3 or a composition in the vicinity thereof, the case is included in which with the atomic proportion of In being 4, the atomic proportion of Ga is greater than or equal to 1 and less than or equal to 3 and the atomic proportion of Zn is greater than or equal to 2 and less than or equal to 4. In the case of describing an atomic ratio of In:Ga:Zn=5:1:6 or a composition in the vicinity thereof, the case is included in which with the atomic proportion of In being 5, the atomic proportion of Ga is greater than 0.1 and less than or equal to 2 and the atomic proportion of Zn is greater than or equal to 5 and less than or equal to 7. In the case of describing an atomic ratio of In:Ga:Zn=1:1:1 or a composition in the vicinity thereof, the case is included in which with the atomic proportion of In being 1, the atomic proportion of Ga is greater than 0.1 and less than or equal to 2 and the atomic proportion of Zn is greater than 0.1 and less than or equal to 2.

The transistor included in the circuit 164 and the transistor included in the display portion 162 may have the same structure or different structures. One structure or two or more kinds of structures may be employed for a plurality of transistors included in the circuit 164. Similarly, one structure or two or more kinds of structures may be employed for a plurality of transistors included in the display portion 162.

A connection portion 204 is provided in a region of the substrate 151 where the substrate 152 does not overlap. In the connection portion 204, the wiring 165 is electrically connected to the FPC 172 through a conductive layer 166 and a connection layer 242. On the top surface of the connection portion 204, the conductive layer 166 obtained by processing the same conductive film as the pixel electrode 181 is exposed. Thus, the connection portion 204 and the FPC 172 can be electrically connected to each other through the connection layer 242.

A variety of optical members can be arranged on the outer surface of the substrate 152. Examples of the optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film suppressing generation of a scratch caused by the use, an impact-absorbing layer, or the like may be arranged on the outer surface of the substrate 152.

For each of the substrates 151 and 152, glass, quartz, ceramic, sapphire, a resin, or the like can be used. When the substrates 151 and 152 are formed using a flexible material, the flexibility of the display unit can be increased.

As the adhesive layer, a variety of curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. A two-component-mixture-type resin may be used. An adhesive sheet or the like may be used.

As the connection layer 242, an anisotropic conductive film (ACF), an anisotropic conductive paste (ACP), or the like can be used.

The light-emitting device 190 can have a top-emission structure, a bottom-emission structure, a dual-emission structure, or the like. A conductive film that transmits visible light is used as the electrode through which light is extracted. A conductive film that reflects visible light is preferably used as the electrode through which light is not extracted.

The light-emitting device 190 includes at least the light-emitting layer 193. In addition to the light-emitting layer 193, the light-emitting device 190 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like. For example, the common layer 112 preferably includes one or both of a hole-injection layer and a hole-transport layer. For example, the common layer 114 preferably includes one or both of an electron-transport layer and an electron-injection layer.

The hole-injection layer injects holes from an anode to the hole-transport layer and contains a material with a high hole-injection property. As the material with a high hole-injection property, an aromatic amine compound and a composite material containing a hole-transport material and an acceptor material (electron-accepting material) can be used.

In the light-emitting device, the hole-transport layer transports holes that are injected from the anode by the hole-injection layer, to the light-emitting layer. In the light-receiving device, the hole-transport layer transports holes that are generated in the active layer on the basis of incident light, to the anode. The hole-transport layer contains a hole-transport material. The hole-transport material preferably has a hole mobility of $1 \times 10^{-6}$ cm$^2$/Vs or higher. Note that any other substance can also be used as long as the substance has a hole-transport property higher than an electron-transport property. As the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferable.

In the light-emitting device, the electron-transport layer transports electrons that are injected from the cathode by the electron-injection layer, to the light-emitting layer. In the light-receiving device, the electron-transport layer transports electrons that are generated in the active layer on the basis of incident light, to the cathode. The electron-transport layer contains an electron-transport material. The electron-transport material preferably has an electron mobility of $1 \times 10^{-6}$ cm$^2$/Vs or higher. Note that any other substance can also be used as long as the substance has an electron-transport property higher than a hole-transport property. As the electron-transport material, any of the following materials having a high electron-transport property can be used, for example: a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a π-electron deficient heteroaromatic compound such as a nitrogen-containing heteroaromatic compound.

The electron-injection layer injects electrons from the cathode to the electron-transport layer and contains a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

Either a low molecular compound or a high molecular compound can be used for the common layer 112, the light-emitting layer 193, and the common layer 114, and an inorganic compound may also be contained. The layers included in the common layer 112, the light-emitting layer 193, and the common layer 114 can be formed by any of the following methods, for example: an evaporation method (including a vacuum evaporation method), a transfer method, a printing method, an inkjet method, and a coating method.

The light-emitting layer 193 contains a light-emitting substance. The light-emitting layer 193 can contain one or more kinds of light-emitting substances. As the light-emitting substance, a substance whose emission color is blue, violet, bluish violet, green, yellowish green, yellow, orange, red, or the like is appropriately used. Alternatively, a substance that emits infrared light can be used as the light-emitting substance.

The active layer 183 of the light-receiving device 110 contains a semiconductor. Examples of the semiconductor include an inorganic semiconductor such as silicon and an organic semiconductor including an organic compound. This embodiment shows an example in which an organic semiconductor is used as the semiconductor included in the active layer. The use of an organic semiconductor is preferable because the light-emitting layer 193 of the light-emitting device 190 and the active layer 183 of the light-receiving device 110 can be formed by the same method (e.g., a vacuum evaporation method) and thus the same manufacturing apparatus can be used.

Examples of an n-type semiconductor material included in the active layer 183 are electron-accepting organic semiconductor materials such as fullerene (e.g., $C_{60}$ and $C_{70}$) and derivatives thereof. Examples of a p-type semiconductor material included in the active layer 183 are electron-donating organic semiconductor materials such as copper(II) phthalocyanine (CuPc), tetraphenyldibenzoperiflanthene (DBP), and zinc phthalocyanine (ZnPc). As a p-type semiconductor material, tin phthalocyanine (SnPc) may be used.

For example, the active layer 183 is preferably formed by co-evaporation of an n-type semiconductor and a p-type semiconductor.

As materials for the gates, the source, and the drain of a transistor and conductive layers functioning as wirings and electrodes included in the display unit, any of metals such as aluminum, titanium, chromium, nickel, copper, yttrium, zirconium, molybdenum, silver, tantalum, and tungsten, or an alloy containing any of these metals as its main component can be used. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; an alloy material containing any of these metal materials; or a nitride of the metal material (e.g., titanium nitride). In the case of using the metal material or the alloy material (or the nitride thereof), the thickness is preferably set small enough to be able to transmit light. Alternatively, a stacked film of any of the above materials can be used as the conductive layers. For example, a stacked film of indium tin oxide and an alloy of silver and magnesium is preferably used, in which case the conductivity can be increased. The above materials can also be used for conductive layers functioning as wirings and electrodes included in the display unit and the conductive layers of the display device (the conductive layers functioning as the pixel electrode and the common electrode).

Examples of insulating materials that can be used for the insulating layers include a resin material such as an acrylic resin and an epoxy resin, and an inorganic insulating material such as silicon oxide, silicon oxynitride, silicon nitride oxide, silicon nitride, and aluminum oxide.

[Display Unit 100B]

FIG. 15A is a cross-sectional view of a display unit 100B.

The display unit 100B differs from the display unit 100A mainly in that the display unit 100B includes the protective layer 116 and has a solid sealing structure.

Providing the protective layer 116 that covers the light-receiving device 110 and the light-emitting device 190 can inhibit entry of impurities such as water into the light-receiving device 110 and the light-emitting device 190, thereby increasing the reliability of the light-receiving device 110 and the light-emitting device 190.

In the region 228 in the vicinity of an end portion of the display unit 100B, the insulating layer 215 and the protective layer 116 are preferably in contact with each other through an opening in the insulating layer 214. In particular, the inorganic insulating film included in the insulating layer 215 and the inorganic insulating film included in the protective layer 116 are preferably in contact with each other. Thus, entry of impurities from the outside into the display portion 162 through the organic insulating film can be inhibited. Accordingly, the reliability of the display unit 100B can be increased.

FIG. 15B illustrates an example in which the protective layer 116 has a three-layer structure. In FIG. 15B, the protective layer 116 includes an inorganic insulating layer 116a over the common electrode 115, an organic insulating layer 116b over the inorganic insulating layer 116a, and an inorganic insulating layer 116c over the organic insulating layer 116b.

An end portion of the inorganic insulating layer 116a and an end portion of the inorganic insulating layer 116c extend beyond an end portion of the organic insulating layer 116b and are in contact with each other. The inorganic insulating layer 116a is in contact with the insulating layer 215 (inorganic insulating layer) through the opening in the insulating layer 214 (organic insulating layer). Accordingly, the light-receiving device 110 and the light-emitting device 190 can be surrounded by the insulating layer 215 and the protective layer 116, whereby the reliability of the light-receiving device 110 and the light-emitting device 190 can be increased.

As described above, the protective layer 116 may have a stacked-layer structure of an organic insulating film and an inorganic insulating film. In that case, an end portion of the inorganic insulating film preferably extends beyond an end portion of the organic insulating film.

In the display unit 100B, the protective layer 116 and the substrate 152 are attached to each other with the adhesive layer 142. The adhesive layer 142 is provided to overlap with the light-receiving device 110 and the light-emitting device 190; that is, the display unit 100B employs a solid sealing structure.

[Display Unit 100C]

Figure 17A:
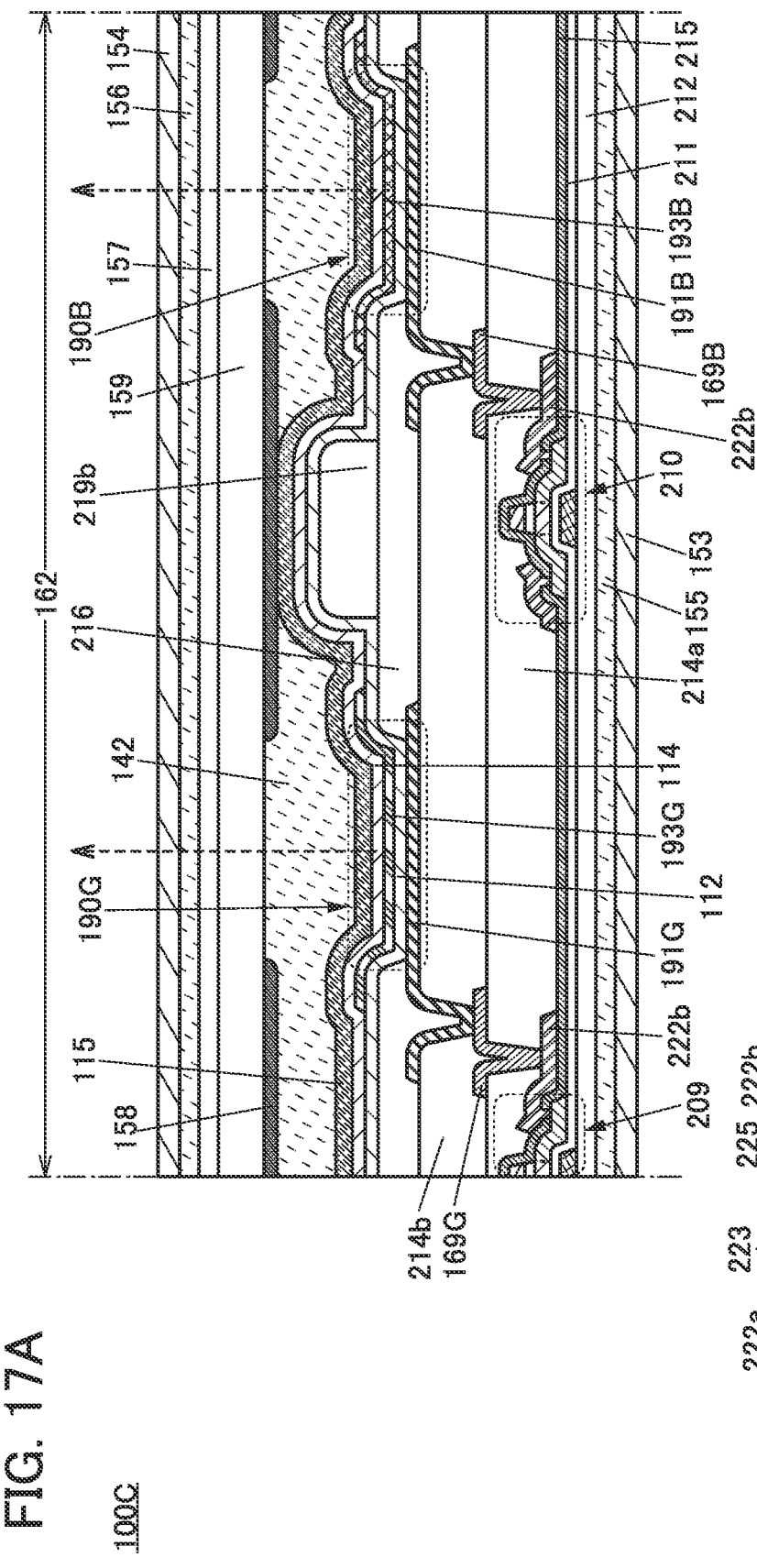
FIG. 17A is a cross-sectional view illustrating an example of a display unit.

FIG. 16 and FIG. 17A are cross-sectional views of a display unit 100C. A perspective view of the display unit 100C is similar to that of the display unit 100A (FIG. 13). FIG. 16 illustrates an example of cross sections of part of a region including the FPC 172, part of the circuit 164, and part of the display portion 162 in the display unit 100C. FIG. 17A illustrates an example of a cross section of part of the display portion 162 in the display unit 100C. FIG. 16 specifically shows an example of a cross section of a region including the light-receiving device 110 and the light-emitting device 190R emitting red light in the display portion 162. FIG. 17A specifically shows an example of a cross section of a region including the light-emitting device 190G emitting green light and the light-emitting device 190B emitting blue light in the display portion 162.

The display unit 100C illustrated in FIG. 16 and FIG. 17A includes a transistor 203, a transistor 207, a transistor 208, a transistor 209, a transistor 210, the light-emitting device 190R, the light-emitting device 190G, the light-emitting device 190B, the light-receiving device 110, and the like between the substrate 153 and the substrate 154.

The resin layer 159 and the common electrode 115 adhere to each other with the adhesive layer 142 provided therebetween, and the display unit 100C employs a solid sealing structure.

The substrate 153 and the insulating layer 212 are attached to each other with the adhesive layer 155. The substrate 154 and an insulating layer 157 are attached to each other with an adhesive layer 156.

To fabricate the display unit 100C, first, a first formation substrate provided with the insulating layer 212, the transistors, the light-receiving device 110, the light-emitting devices, and the like and a second formation substrate provided with the insulating layer 157, the resin layer 159, the light-blocking layer 158, and the like are attached to each other with the adhesive layer 142. Then, the substrate 153 is attached to a surface exposed by separation of the first formation substrate, and the substrate 154 is attached to a surface exposed by separation of the second formation substrate, whereby the components formed over the first formation substrate and the second formation substrate are transferred to the substrate 153 and the substrate 154. The substrate 153 and the substrate 154 are preferably flexible. Accordingly, the display unit 100C can be highly flexible.

The inorganic insulating film that can be used as the insulating layer 211, the insulating layer 213, and the insulating layer 215 can be used as the insulating layer 212 and the insulating layer 157.

The light-emitting device 190R has a stacked-layer structure in which the pixel electrode 191R, the common layer 112, the light-emitting layer 193R, the common layer 114, and the common electrode 115 are stacked in this order from an insulating layer 214b side. The pixel electrode 191R is connected to a conductive layer 169R through an opening provided in the insulating layer 214b. The conductive layer 169R is connected to the conductive layer 222b included in the transistor 208 through an opening provided in an insulating layer 214a. The conductive layer 222b is connected to a low-resistance region 231n through an opening provided in the insulating layer 215. That is, the pixel electrode 191R is electrically connected to the transistor 208. The transistor 208 has a function of controlling the driving of the light-emitting device 190R.

Similarly, the light-emitting device 190G has a stacked-layer structure in which the pixel electrode 191G, the common layer 112, the light-emitting layer 193G, the common layer 114, and the common electrode 115 are stacked in this order from the insulating layer 214b side. The pixel electrode 191G is electrically connected to the low-resistance region 231n of the transistor 209 through a conductive layer 169G and the conductive layer 222b of the transistor 209. That is, the pixel electrode 191G is electrically connected to the transistor 209. The transistor 209 has a function of controlling the driving of the light-emitting device 190G.

The light-emitting device 190B has a stacked-layer structure in which the pixel electrode 191B, the common layer 112, the light-emitting layer 193B, the common layer 114, and the common electrode 115 are stacked in this order from the insulating layer 214b side. The pixel electrode 191B is electrically connected to the low-resistance region 231n of the transistor 210 through a conductive layer 169B and the conductive layer 222b of the transistor 210. That is, the pixel electrode 191B is electrically connected to the transistor 210. The transistor 210 has a function of controlling the driving of the light-emitting device 190B.

The light-receiving device 110 has a stacked-layer structure in which the pixel electrode 181, the common layer 112, the active layer 183, the common layer 114, and the common electrode 115 are stacked in this order from the insulating layer 214b side. The pixel electrode 181 is electrically connected to the low-resistance region 231n of the transistor 207 through a conductive layer 168 and the conductive layer 222b of the transistor 207. That is, the pixel electrode 181 is electrically connected to the transistor 207.

End portions of the pixel electrodes 181, 191R, 191G, and 191B are covered with the partition 216. The pixel electrodes 181, 191R, 191G, and 191B contain a material that reflects visible light, and the common electrode 115 contains a material that transmits visible light.

Light from the light-emitting devices 190R, 190G, and 190B is emitted toward the substrate 154. Light enters the light-receiving device 110 through the substrate 154 and the adhesive layer 142. For the substrate 154, a material having a high visible-light-transmitting property is preferably used.

The pixel electrode 181 and the pixel electrode 191 can be formed using the same material in the same step. The common layer 112, the common layer 114, and the common electrode 115 are shared by the light-receiving device 110 and the light-emitting devices 190R, 190G, and 190B. The light-receiving device 110 and the light-emitting devices of different colors can have common components except the active layer 183 and the light-emitting layer. Thus, the light-receiving device 110 can be incorporated into the display unit 100C without a significant increase in the number of manufacturing steps.

The resin layer 159 and the light-blocking layer 158 are provided on a surface of the insulating layer 157 on the substrate 153 side. The resin layer 159 is provided at the positions overlapping with the light-emitting devices 190R, 190G, and 190B and is not provided at the position overlapping with the light-receiving device 110. The light-blocking layer 158 is provided to cover the surface of the insulating layer 157 on the substrate 153 side, a side surface of the resin layer 159, and a surface of the resin layer 159 on the substrate 153 side. The light-blocking layer 158 has openings at the position overlapping with the light-receiving device 110 and at the positions overlapping with the light-emitting devices 190R, 190G, and 190B. Providing the light-blocking layer 158 can control the range where the light-receiving device 110 senses light. Moreover, providing the light-blocking layer 158 can inhibit direct entry of light into the light-receiving device 110 from the light-emitting devices 190R, 190G, and 190B without via an object. Hence, a sensor with less noise and high sensitivity can be obtained. Since the resin layer 159 is provided, the distance from the light-blocking layer 158 to the light-emitting device of each color is shorter than the distance from the light-blocking layer 158 to the light-receiving device 110. Accordingly, viewing angle dependence of display can be reduced while noise of the sensor is reduced. Thus, both the display quality and imaging quality can be increased.

The structures of the partition 216, the light-blocking layer 219a, and the spacer 219b in the display unit 100C are the same as those in the display unit 10K (see FIG. 7B and FIG. 8A).

In FIG. 16, the partition 216 has an opening between the light-receiving device 110 and the light-emitting device 190R. The light-blocking layer 219a is provided so as to fill the opening. The light-blocking layer 219a is positioned between the light-receiving device 110 and the light-emitting device 190R. The light-blocking layer 219a absorbs light emitted from the light-emitting device 190R. Thus, stray light entering the light-receiving device 110 can be reduced.

The spacer 219b is positioned between the light-emitting device 190G and the light-emitting device 190B. The top surface of the spacer 219b is preferably closer to the light-blocking layer 158 than the top surface of the light-blocking layer 219a is. For example, the sum of the height (thickness) of the partition 216 and the height (thickness) the spacer 219b is preferably larger than the height (thickness) of the light-blocking layer 219a. Thus, the inside of the light-blocking layer 219a can be easily filled with the adhesive layer 142. As illustrated in FIG. 17A, the light-blocking layer 158 may be in contact with the common electrode 115 (or the protective layer) in a portion where the spacer 219b and the light-blocking layer 158 overlap with each other.

The connection portion 204 is provided in a region of the substrate 153 where the substrate 154 does not overlap. In the connection portion 204, the wiring 165 is electrically connected to the FPC 172 through a conductive layer 167, the conductive layer 166, and the connection layer 242. The conductive layer 167 can be obtained by processing the same conductive film as the conductive layer 168. On the top surface of the connection portion 204, the conductive layer 166 obtained by processing the same conductive film as the pixel electrode 181 is exposed. Thus, the connection portion 204 and the FPC 172 can be electrically connected to each other through the connection layer 242.

Each of the transistors 207, 208, 209, and 210 includes the conductive layer 221 functioning as a gate, the insulating layer 211 functioning as a gate insulating layer, a semiconductor layer including a channel formation region 231i and a pair of low-resistance regions 231n, the conductive layer 222a connected to one of the low-resistance regions 231n, the conductive layer 222b connected to the other low-resistance region 231n, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231i. The insulating layer 225 is positioned between the conductive layer 223 and the channel formation region 231i.

The conductive layer 222a and the conductive layer 222b are connected to the corresponding low-resistance regions 231n through openings provided in the insulating layer 215. One of the conductive layers 222a and 222b serves as a source, and the other serves as a drain.

In FIG. 16, the insulating layer 225 overlaps with the channel formation region 231i of the semiconductor layer 231 and does not overlap with the low-resistance regions 231n. The structure illustrated in FIG. 16 is obtained by processing the insulating layer 225 with the conductive layer 223 as a mask, for example. In FIG. 16, the insulating layer 215 is provided to cover the insulating layer 225 and the conductive layer 223, and the conductive layer 222a and the conductive layer 222b are connected to the low-resistance regions 231n through the openings in the insulating layer 215. Furthermore, an insulating layer that covers the transistor may be provided over the conductive layer 222a and the conductive layer 222b.

Figure 17B:
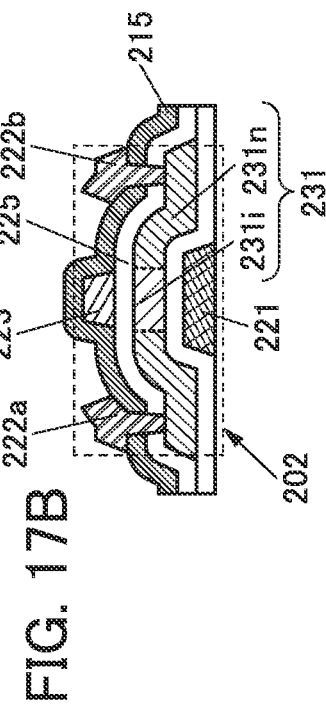
FIG. 17B is a cross-sectional view illustrating an example of a transistor.

FIG. 17B illustrates an example of the transistor 202 in which the insulating layer 225 covers a top surface and a side surface of the semiconductor layer. The conductive layer 222a and the conductive layer 222b are connected to the corresponding low-resistance regions 231n through openings provided in the insulating layer 225 and the insulating layer 215.

As described above, the display unit of this embodiment includes a light-receiving device and a light-emitting device in a display portion, and the display portion has both a function of displaying an image and a function of sensing light. Thus, the size and weight of an electronic device can be reduced as compared to the case where a sensor is provided outside a display portion or outside a display unit. Moreover, an electronic device having more functions can be obtained by a combination of the display unit of this embodiment and a sensor provided outside the display portion or outside the display unit.

In the light-receiving device, at least one of the layers provided between a pair of electrodes can be shared with the light-emitting device (EL device). For example, all the layers in the light-receiving device except the active layer can be common to the layers in the light-emitting device (EL device). In other words, with only the addition of the step of forming the active layer to the manufacturing process of the light-emitting device, the light-emitting device and the light-receiving device can be formed over one substrate. In the light-receiving device and the light-emitting device, their pixel electrodes can be formed using the same material in the same step, and their common electrodes can be formed using the same material in the same step. When a circuit electrically connected to the light-receiving device and a circuit electrically connected to the light-emitting device are formed using the same material in the same process, the manufacturing process of the display unit can be simplified. In such a manner, a display unit that incorporates a light-receiving device and is highly convenient can be manufactured without complicated steps.

The display unit of this embodiment includes a light-emitting device in which holes are easily injected into the light-emitting layer and electrons are less likely to be injected into the light-emitting layer. Such a structure inhibits initial decay of the light-emitting device and achieves an extremely long driving lifetime. Thus, the reliability of the light-emitting device or even the reliability of the display unit can be increased.

In the display unit of this embodiment, on a surface where the light-blocking layer is formed, a component is provided so that the distance from the light-blocking layer to the light-receiving device is long and the distance from the light-blocking layer to the light-emitting device is short. Accordingly, noise of the sensor can be reduced, the imaging resolution can be increased, and viewing angle dependence of display can be reduced. Thus, both the display quality and imaging quality of the display unit can be increased.

This embodiment can be combined with the other embodiments as appropriate. In this specification, in the case where a plurality of structure examples are shown in one embodiment, the structure examples can be combined as appropriate.

Embodiment 2

In this embodiment, a light-emitting device that can be used in the display unit of one embodiment of the present invention will be described with reference to FIGS. 18A to 18D.

Figure 18A:
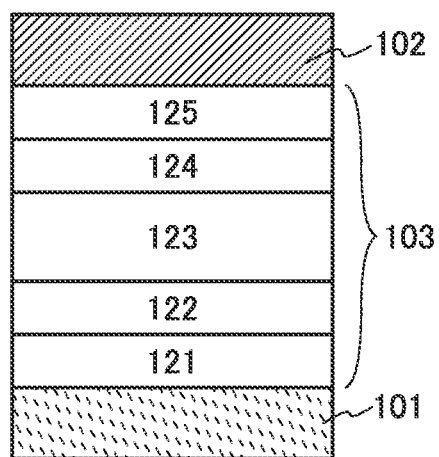
FIGS. 18A to 18D are cross-sectional views each illustrating an example of a light-emitting device.

A light-emitting device illustrated in FIG. 18A includes an anode 101, an EL layer 103, and a cathode 102. The light-emitting device in FIG. 18A has a single structure in which one EL layer is positioned between a pair of electrodes. The EL layer 103 includes a hole-injection layer 121, a hole-transport layer 122, a light-emitting layer 123, an electron-transport layer 124, and an electron-injection layer 125 from the anode 101 side. Although not illustrated in FIGS. 18A to 18D, the light-emitting device may include an optical adjustment layer.

The anode 101, the cathode 102, the hole-injection layer 121, the hole-transport layer 122, the light-emitting layer 123, the electron-transport layer 124, and the electron-injection layer 125 may each have a single-layer structure or a stacked-layer structure.

Figure 18B:
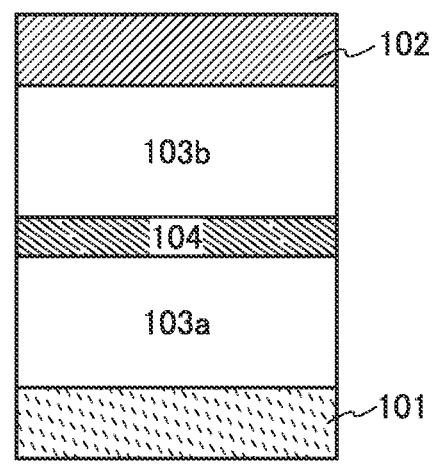

A light-emitting device illustrated in FIG. 18B includes the anode 101, an EL layer 103a, a charge generation layer 104, an EL layer 103b, and the cathode 102. The light-emitting device in FIG. 18B has a tandem structure including the charge generation layer 104 between the two EL layers.

Figure 18C:
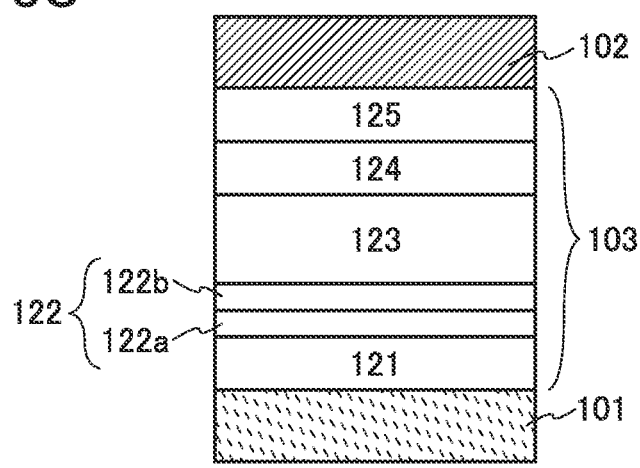
Figure 18D:
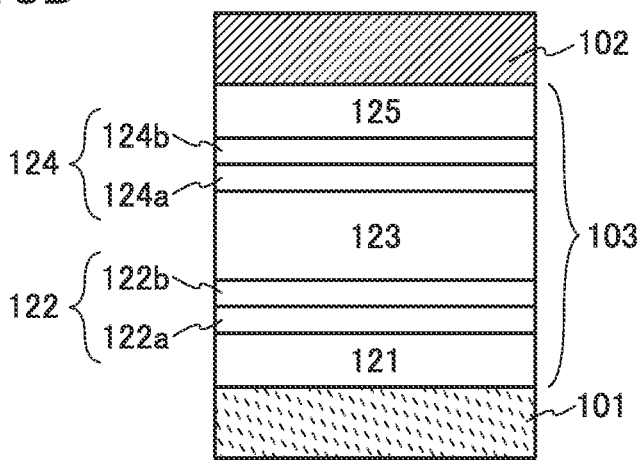

Each of the EL layers in the tandem light-emitting device can have a structure similar to that of an EL layer included in any of single light-emitting devices illustrated in FIGS. 18A, 18C, and 18D, for example.

The charge generation layer 104 has a function of injecting electrons into one of the EL layers 103a and 103b and injecting holes into the other of the EL layers when voltage is applied between the anode 101 and the cathode 102. Thus, in FIG. 18B, when voltage is applied so that the potential of the anode 101 becomes higher than that of the cathode 102, the charge generation layer 104 injects electrons into the EL layer 103a and injects holes into the EL layer 103b.

Varying emission colors of EL layers in a tandem light-emitting device makes it possible for the light-emitting device as a whole to obtain light emission of an intended color. For example, in a light-emitting device including two EL layers, when red light and green light are emitted from one of the EL layers and blue light is emitted from the other EL layer, the light-emitting device as a whole can emit while light. As another example, in a light-emitting device including three EL layers, when blue light is emitted from the first EL layer, green light is emitted from the second EL layer, and red light is emitted from the third EL layer, the light-emitting device as a whole can emit white light. As another example, in a light-emitting device including three EL layers, when blue light is emitted from the first EL layer, yellow, yellow green, or green light and red light are emitted from the second EL layer over the first EL layer, and blue light is emitted from the third EL layer over the second EL layer, the light-emitting device as a whole can emit white light. As another example, in a light-emitting device including four EL layers, when blue light is emitted from the first EL layer, yellow, yellow green, or green light is emitted from one of the second EL layer and the third EL layer over the first EL layer, red light is emitted from the other of the second EL layer and the third EL layer, and blue light is emitted from the fourth EL layer over the second EL layer and the third EL layer, the light-emitting device as a whole can emit while light.

The hole-transport layer 122 included in the light-emitting devices illustrated in FIGS. 18C and 18D has a two-layer structure of a hole-transport layer 122a closer to the hole-injection layer 121 and a hole-transport layer 122b closer to the light-emitting layer 123.

The electron-transport layer 124 included in the light-emitting device in FIG. 18D has a two-layer structure of an electron-transport layer 124a closer to the light-emitting layer 123 and an electron-transport layer 124b closer to the electron-injection layer 125.

At least one of the hole-injection layer, the hole-transport layer, the electron-transport layer, and the electron-injection layer included in the light-emitting device of this embodiment can be a layer common to the light-receiving device. Consequently, the number of manufacturing steps can be reduced as compared to the case where the light-emitting device and the light-receiving device are separately formed, and the light-emitting device and the light-receiving device can be formed on the same plane.

For example, in the light-emitting device of this embodiment, the hole-injection layer, the hole-transport layer, the electron-transport layer, and the electron-injection layer can all be layers common to the light-receiving device. Thus, the light-emitting device and the light-receiving device can be formed on the same plane only by separate formation of the light-emitting layer of the light-emitting device and the active layer of the light-receiving device.

Materials that can be used in the light-emitting device will be described below.

<Electrode>

For the pair of electrodes of the light-emitting device, a metal, an alloy, an electrically conductive compound, a mixture thereof, and the like can be used as appropriate. Specifically, an In—Sn oxide (also referred to as ITO), an In—Si—Sn oxide (also referred to as ITSO), an In—Zn oxide, or an In—W—Zn oxide can be used. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

To fabricate a light-emitting device having a microcavity structure, a reflective electrode and a transflective electrode are used. A single-layer structure or a stacked-layer structure using one or more kinds of desired conductive materials can be employed. The electrodes can be formed by a sputtering method or a vacuum evaporation method.

<Hole-Injection Layer>

The hole-injection layer 121 preferably contains a first compound and a second compound.

The first compound is an electron-accepting material (an acceptor material) and has a property of accepting electrons from the second compound.

The second compound is a hole-transport material. The hole-transport material has a hole-transport property higher than an electron-transport property.

The highest occupied molecular orbital level (HOMO level) of the second compound is preferably relatively low (deep). Specifically, the HOMO level of the second compound is preferably higher than or equal to −5.7 eV and lower than or equal to −5.4 eV. A relatively low HOMO level of the second compound is preferable because hole injection into the hole-transport layer 122 can be easily performed.

As the first compound, an organic compound having an electron-withdrawing group (particularly a cyano group or a halogen group such as a fluoro group) can be used.

As the first compound, an organic acceptor such as a quinodimethane derivative, a chloranil derivative, and a hexaazatriphenylene derivative can be used, for example. Specific examples include 7,7,8,8-tetracyano-2,3,5,6-tetrafluoroquinodimethane (abbreviation: F4-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), and 2-(7-dicyanomethylene-1,3,4,5,6,8,9,10-octafluoro-7H-pyren-2-ylidene)malononitrile. A compound in which electron-withdrawing groups are bonded to a condensed aromatic ring having a plurality of heteroatoms, such as HAT-CN, is preferred because it is thermally stable. A [3]radialene derivative having an electron-withdrawing group (in particular, a cyano group or a halogen group such as a fluoro group) has a very high electron-accepting property and thus is preferred. Specific examples of a [3]radialene derivative having an electron-withdrawing group include α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile].

The second compound preferably has a hole-transport skeleton. A carbazole skeleton, a dibenzofuran skeleton, a dibenzothiophene skeleton, and an anthracene skeleton, with which the HOMO level of the hole-transport material does not become too high (shallow), are preferably used as the hole-transport skeleton.

The second compound preferably has at least one of a carbazole skeleton, a dibenzofuran skeleton, a dibenzothiophene skeleton, and an anthracene skeleton. The second compound may be an aromatic amine having a substituent that includes a dibenzofuran ring or a dibenzothiophene ring, an aromatic monoamine that includes a naphthalene ring, or an aromatic monoamine in which a 9-fluorenyl group is bonded to nitrogen of amine through an arylene group.

The second organic compound having an N,N-bis(4-biphenyl)amino group is preferred because a light-emitting device having a long lifetime can be fabricated.

Examples of the second compound include N-(4-biphenyl)-6,N-diphenylbenzo[b]naphtho[1,2-d]furan-8-amine (abbreviation: BnfABP), N,N-bis(4-biphenyl)-6-phenyl-benzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-BBABnf(II)(4)), N,N-bis[4-biphenyl)benzo[b]naphtho[2,3-d]furan-4-amine (abbreviation: (dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBA-BNB), 4-[4-(2-naphthyl)phenyl]-4',4"-diphenyltriphenylamine (abbreviation: BBABNBi), 4,4'-diphenyl-4"-(6; 1'-binaphthyl-2-yl)triphenylamine (abbreviation: BBAαNβNB), 4,4'-diphenyl-4"-(7; 1'-binaphthyl-2-yl)triphenylamine (abbreviation: BBAαNβNB-03), 4,4'-diphenyl-4"-(7-phenyl)naphthyl-2-yltriphenylamine (abbreviation: BBAPBNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl)triphenylamine (abbreviation: BBAβNaNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)-triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBilBP-02), 4-[4'-(carbazol-9-yl)biphenyl-4-yl]-4'-(2-naphthyl)-4"-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis(4-biphenylyl)-9,9'-spirobi[9H-fluoren]-2-amine (abbreviation: BBASF), N,N-bis(1,1'-biphenyl-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi[9H-fluoren]-4-amine (abbreviation: oFBiSF), N-(4-biphenyl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]spiro-9,9'-bifluoren-2-amine (abbreviation: PCBASF), N-(1,1'-biphenyl-4-yl)-9,9-dimethyl-N-[4-(9-phenyl-9H-carbazol-3-yl)phenyl]-9H-fluoren-2-amine (abbreviation: PCBBiF), 3,3'-(naphthalen-1,4-diyl)bis(9-phenyl-9H-carbazole) (abbreviation: PCzN2), and 4-(10-phenyl-9-anthryl)-4'-(9-phenyl-9H-fluoren-9-yl)triphenylamine (abbreviation: FLPAPA).

<Hole-Transport Layer>

The hole-transport layer 122 transports holes injected by the hole-injection layer 121, to the light-emitting layer 123.

The hole-transport layer 122 preferably contains a third compound.

The third compound is a hole-transport material. As the hole-transport material, a hole-transport material that can be used as the second compound can be used.

The HOMO level of the third compound is preferably lower than or equal to that of the second compound. The difference in the HOMO level between the third compound and the second compound is preferably 0.2 eV or less.

The second compound and the third compound each preferably include at least one of a carbazole skeleton, a dibenzofuran skeleton, a dibenzothiophene skeleton, and an anthracene skeleton.

It is preferable that the second compound and the third compound have the same hole-transport skeleton (especially a dibenzofuran skeleton), in which case holes can be injected smoothly.

It is further preferable that the second compound and the third compound are the same compound, in which case holes can be injected smoothly.

In the case where the hole-transport layer 122 has a stacked-layer structure, each of the layers included in the hole-transport layer 122 transports holes to the light-emitting layer 123.

The hole-transport layer 122a in FIGS. 18C and 18D can have a structure similar to that of the hole-transport layer 122 in FIG. 18A.

The hole-transport layer 122b in FIGS. 18C and 18D (i.e., the layer in the hole-transport layer 122 that is located closest to the light-emitting layer 123) preferably has a function of an electron-blocking layer.

The hole-transport layer 122b preferably contains a fourth compound.

The fourth compound is a hole-transport material. As the hole-transport material, a hole-transport material that can be used as the second compound can be used.

The HOMO level of the fourth compound is preferably lower than that of the third compound. The difference in the HOMO level between the fourth compound and the third compound is preferably 0.2 eV or less.

The second compound, the third compound, and the fourth compound each preferably include at least one of a carbazole skeleton, a dibenzofuran skeleton, a dibenzothiophene skeleton, and an anthracene skeleton.

It is preferable that the second compound, the third compound, and the fourth compound have the same hole-transport skeleton (especially a dibenzofuran skeleton), in which case holes can be injected smoothly.

When the second compound and the third compound (and also the fourth compound) have a small difference in the HOMO level or have a hole-transport skeleton (preferably the same hole-transport skeleton) as described above, holes are smoothly injected into the hole-injection layer and the hole transport layer, thereby preventing an increase in driving voltage and deficiency of holes in the light-emitting layer 123.

<Light-Emitting Layer>

The light-emitting layer contains a light-emitting substance. The light-emitting layer can contain one or more kinds of light-emitting substances. As the light-emitting substance, a substance whose emission color is blue, violet, bluish violet, green, yellowish green, yellow, orange, red, or the like is appropriately used. Alternatively, a substance that emits infrared light can be used as the light-emitting substance.

The light-emitting layer may contain one or more kinds of organic compounds (e.g., a host material or an assist material) in addition to the light-emitting substance (guest material). As one or more kinds of organic compounds, one or both of the hole-transport material and the electron-transport material described in this embodiment can be used. Moreover, as one or more kinds of organic compounds, a bipolar material may be used.

There is no particular limitation on the light-emitting substance that can be used for the light-emitting layer, and it is possible to use a light-emitting substance that converts singlet excitation energy into light in the visible light range or the near-infrared region or a light-emitting substance that converts triplet excitation energy into light in the visible light range or the near-infrared region.

Examples of a light-emitting substance that converts singlet excitation energy into light are substances that exhibit fluorescence (fluorescent materials) such as a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. A pyrene derivative is particularly preferable because it has a high emission quantum yield. Specific examples of the pyrene derivative include N,N-bis(3-methylphenyl)-N,N-bis[3-(9-phenyl-9H-fluoren-9-yl)phenyl]pyrene-1,6-diamine (abbreviation: 1,6mMemFLPAPrn), N,N-diphenyl-N,N-bis[4-(9-phenyl-9H-fluoren-9-yl)phenyl]pyrene-1,6-1,6FLPAPrn), N,N-bis(dibenzofuran-2-yl)-N,N-diphenylpyrene-1,6-diamine (abbreviation: diamine (abbreviation: 1,6FrAPrn), N,N-bis(dibenzothiophen-2-yl)-N,N-diphenylpyrene-1,6-diamine (abbreviation: 1,6ThAPrn), N,N-(pyrene-1,6-diyl)bis[(N-phenylbenzo[b]naphtho[1,2-d]furan)-6-amine] (abbreviation: 1,6BnfAPrn), N,N-(pyrene-1,6-diyl)bis[(N-phenyl-benzo[b]naphtho[1,2-d]furan)-8-amine] (abbreviation: 1,6BnfAPrn-02), and N,N'-(pyrene-1,6-diyl)bis[(6,N-diphenylbenzo[b]naphtho[1,2-d]furan)-8-amine] (abbreviation: 1,6BnfAPrn-03). Condensed aromatic diamine compounds typified by pyrenediamine compounds such as 1,6FLPAPrn, 1,6mMemFLPAPrn, and 1,6BnfAPrn-03 are particularly preferred because of their high hole-trapping properties, high emission efficiency, and high reliability.

In addition, it is possible to use 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl)triphenylamine (abbreviation: PCBAPBA), perylene, 2,5,8, 11-tetra(tert-butyl)perylene (abbreviation: TBP), N,N''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), 3,10-bis[N-(9-phenyl-9H-carbazole-2-yl)-N-phenylamino]naphtho[2,3-b;6,7-b']bisbenzofuran (abbreviation: 3,10PCA2Nbf(IV)-02), 3,10-bis[N-(dibenzofuran-3-yl)-N-phenylamino]naphtho[2,3-b;6,7-b']bisbenzofuran (abbreviation: 3,10FrA2Nbf(IV)-02), and the like.

Examples of a light-emitting substance that converts triplet excitation energy into light include a substance that exhibits phosphorescence (a phosphorescent material) and a thermally activated delayed fluorescent (TADF) material that exhibits thermally activated delayed fluorescence.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine skeleton including an electron-withdrawing group as a ligand; a platinum complex; and a rare earth metal complex As examples of a phosphorescent material which emits blue or green light and whose emission spectrum has a peak wavelength at greater than or equal to 450 nm and less than or equal to 570 nm, the following substances can be given.

Examples include organometallic complexes having a 4H-triazole skeleton, such as tris{2-[5-(2-methylphenyl)-4-(2,6-dimethylphenyl)-4H-1,2,4-triazol-3-yl-κN$^2$]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), tris[4-(3-biphenyl)-5-isopropyl-3-phenyl-4H-1,2,4-triazolato]iridium(III) (abbreviation: [Ir(iPrptz-3b)$_3$]), and tris[3-(5-biphenyl)-5-isopropyl-4-phenyl-4H-1,2,4-triazolato]iridium(III) (abbreviation: [Ir(iPr5btz)$_3$]); organometallic complexes having a 1H-triazole skeleton, such as tris[3-methyl-1-(2-methylphenyl)-5-phenyl-1H-1,2,4-triazolato]iridium(III) (abbreviation: [Ir(Mptz1-mp)$_3$]) and tris(1-methyl-5-phenyl-3-propyl-1H-1,2,4-triazolato)iridium(III) (abbreviation: [Ir(Prptz1-Me)$_3$]); organometallic complexes having an imidazole skeleton, such as fac-tris[1-(2,6-diisopropylphenyl)-2-phenyl-1H-imidazole]iridium(III) (abbreviation: [Ir(iPrpmi)$_3$]) and tris[3-(2,6-dimethylphenyl)-7-methylimidazo[1,2-f]phenanthridinato]iridium(III) (abbreviation: [Ir(dmpimpt-Me)$_3$]); and organometallic complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: [Ir(CF$_3$ppy)$_2$(pic)]), and bis[2-(4',6'-difluorophenyl)pyridinato-N,C$^{2'}$]iridium(III) acetylacetonate (abbreviation: FIr(acac)).

As examples of a phosphorescent material which emits green or yellow light and whose emission spectrum has a peak wavelength at greater than or equal to 495 nm and less than or equal to 590 nm, the following substances can be given.

Examples include organometallic iridium complexes having a pyrimidine skeleton, such as tris(4-methyl-6-phenylpyrimidinato)iridium(III) (abbreviation: [Ir(mppm)$_3$]), tris(4-1-butyl-6-phenylpyrimidinato)iridium(III) (abbreviation: [Ir (tBuppm)₃]), (acetylacetonato)bis(6-methyl-4-phenylpyrimidinato)iridium(III) (abbreviation: [Ir(mppm)₂(acac)]), (acetylacetonato)bis(6-tert-butyl-4-phenylpyrimidinato)iridium(III) (abbreviation: [Ir(tBuppm)₂(acac)]), (acetylacetonato)bis[6-(2-norbornyl)-4-phenylpyrimidinato]iridium(III) (abbreviation: [Ir(nbppm)₂(acac)]), (acetylacetonato)bis[5-methyl-6-(2-methylphenyl)-4-phenylpyrimidinato]iridium(III) (abbreviation: [Ir(mpmppm)₂(acac)]), (acetylacetonato)bis{4,6-dimethyl-2-[6-(2,6-dimethylphenyl)-4-pyrimidinyl-κN³]phenyl-κC}iridium(III) (abbreviation: [Ir(dmppm-dmp)₂(acac)]), and (acetylacetonato)bis(4,6-diphenylpyrimidinato)iridium(III) (abbreviation: [Ir(dppm)₂(acac)]); organometallic iridium complexes having a pyrazine skeleton, such as (acetylacetonato)bis(3,5-dimethyl-2-phenylpyrazinato)iridium(III) (abbreviation: [Ir(mppr-Me)₂(acac)]) and (acetylacetonato)bis(5-isopropyl-3-methyl-2-phenylpyrazinato)iridium(III) (abbreviation: [Ir(mppr-iPr)₂(acac)]); organometallic iridium complexes having a pyridine skeleton, such as tris(2-phenylpyridinato-N,C²')iridium(III) (abbreviation: [Ir(ppy)₃]), bis(2-phenylpyridinato-N,C²')iridium(III) acetylacetonate (abbreviation: [Ir(ppy)₂(acac)]), bis(benzo[h]quinolinato)iridium(III) acetylacetonate (abbreviation: [Ir(bzq)₂(acac)]), tris(benzo[h]quinolinato)iridium(III) (abbreviation: [Ir(bzq)₃]), tris(2-phenylquinolinato-N,C²')iridium(III) (abbreviation: [Ir(pq)₃]), bis(2-phenylquinolinato-N,C²)iridium(III) acetylacetonate (abbreviation: [Ir(pq)₂(acac)]), [2-(4-phenyl-2-pyridinyl-κN)phenyl-κC]bis[2-(2-pyridinyl-κN)phenyl-κC']iridium(III) (abbreviation: Ir(ppy)₂(4dppy)), and bis[2-(2-pyridinyl-κN)phenyl-κC'][2-(4-methyl-5-phenyl-2-pyridinyl-κN)phenyl-κC]; organometallic complexes such as bis(2,4-diphenyl-1,3-oxazolato-N,C²')iridium(III) acetylacetonate (abbreviation: [Ir(dpo)₂(acac)]), bis{2-[4'-(perfluorophenyl)phenyl]pyridinato-N,C²}iridium(III) acetylacetonate (abbreviation: [Ir(p-PF-ph)₂(acac)]), and bis(2-phenylbenzothiazolato-N,C2')iridium(III) acetylacetonate (abbreviation: [Ir(bt)₂(acac)]); and rare earth metal complexes such as tris(acetylacetonato)(monophenanthroline)terbium(III) (abbreviation: [Tb(acac)₃(Phen)]).

As examples of a phosphorescent material which emits yellow or red light and whose emission spectrum has a peak wavelength at greater than or equal to 570 nm and less than or equal to 750 nm, the following substances can be given.

Examples include organometallic complexes having a pyrimidine skeleton, such as (diisobutyrylmethanato)bis[4,6-bis(3-methylphenyl)pyrimidinato]iridium(III) (abbreviation: [Ir(5mdppm)₂(dibm)]), bis[4,6-bis(3-methylphenyl)pyrimidinato](dipivaloylmethanato)iridium(III) (abbreviation: [Ir(5mdppm)₂(dpm)]), bis[4,6-di(naphthalen-1-yl)pyrimidinato](dipivaloylmethanato)iridium(III) (abbreviation: [Ir(dlnpm)₂(dpm)]), and tris(4-1-butyl-6-phenylpyrimidinato)iridium(III) (abbreviation: [Ir(tBuppm)₃]); organometallic complexes having a pyrazine skeleton, such as (acetylacetonato)bis(2,3,5-triphenylpyrazinato)iridium(III) (abbreviation: [Ir(tppr)₂(acac)]), bis(2,3,5-triphenylpyrazinato)(dipivaloylmethanato)iridium(III) (abbreviation: [Ir(tppr)₂(dpm)]), bis{4,6-dimethyl-2-[3-(3,5-dimethylphenyl)-5-phenyl-2-pyrazinyl-κN]phenyl-κC'}(2,6-dimethyl-3,5-heptanedionato-κ²O,O')iridium(III) (abbreviation: [Ir(dmdppr-P)₂(dibm)]), bis{4,6-dimethyl-2-[5-(4-cyano-2,6-dimethylphenyl)-3-(3,5-dimethylphenyl)-2-pyrazinyl-κN]phenyl-κC}(2,2,6,6-tetramethyl-3,5-heptanedionato-κ²O,O)')iridium(III) (abbreviation: [Ir(dmdppr-dmCP)₂(dpm)]), (acetylacetonato)bis[2-methyl-3-phenylquinoxalinato-N,C²']iridium(III) (abbreviation: [Ir(mpq)₂(acac)]), (acetylacetonato)bis(2,3-diphenylquinoxalinato-N,C²')iridium(III) (abbreviation: [Ir(dpq)₂(acac)]), (acetylacetonato)bis[2,3-bis(4-fluorophenyl)quinoxalinato]iridium(III) (abbreviation: [Ir(Fdpq)₂(acac)]), and bis{4,6-dimethyl-2-[5-(5-cyano-2-methylphenyl)-3-(3,5-dimethylphenyl)-2-pyrazinyl-κN]phenyl-κC}(2,2,6,6-tetramethyl-3,5-heptanedionato-κ²O,O')iridium(III) (abbreviation: [Ir(dmdppr-m5CP)₂(dpm)]); organometallic complexes having a pyridine skeleton, such as tris(1-phenylisoquinolinato-N,C²)iridium(III) (abbreviation: [Ir(piq)₃]), bis(1-phenylisoquinolinato-N,C²')iridium(III) acetylacetonate (abbreviation: [Ir(piq)₂(acac)]), and bis[4,6-dimethyl-2-(2-quinolinyl-κN)phenyl-κC'](2,4-pentanedionato-κ²O,O)iridium(III); platinum complexes such as 2,3,7,8,12,13,17,18-octaethyl-21H,23H-porphyrin platinum(II) (abbreviation: [PtOEP]); and rare earth metal complexes such as tris(1,3-diphenyl-1,3-propanedionato)(monophenanthroline)europium(III) (abbreviation: [Eu(DBM)₃(Phen)]) and tris[1-(2-thenoyl)-3,3,3-trifluoroacetonato](monophenanthroline)europium(III) (abbreviation: [Eu(TTA)₃(Phen)]).

As the organic compound (e.g., the host material or the assist material) used in the light-emitting layer, one or more kinds of substances having a larger energy gap than the light-emitting substance can be used.

As an organic compound used in combination with a fluorescent material, it is preferable to use an organic compound that has a high energy level in a singlet excited state and has a low energy level in a triplet excited state.

Although partly overlapping the specific examples described above, specific examples of organic compounds will be shown from the viewpoint of a preferred combination with the light-emitting substance (a fluorescent material and a phosphorescent material).

Examples of organic compounds that can be used in combination with a fluorescent material include condensed polycyclic aromatic compounds such as an anthracene derivative, a tetracene derivative, a phenanthrene derivative, a pyrene derivative, a chrysene derivative, and a dibenzo[g,p]chrysene derivative.

Specific examples of organic compounds (host materials) used in combination with a fluorescent material include 9-phenyl-3-[4-(10-phenyl-9-anthryl)phenyl]-9H-carbazole (abbreviation: PCzPA), 3,6-diphenyl-9-[4-(10-phenyl-9-anthryl)phenyl]-9H-carbazole (abbreviation: DPCzPA), 3-[4-(1-naphthyl)-phenyl]-9-phenyl-9H-carbazole (abbreviation: PCPN), 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), 6,12-dimethoxy-5,11-diphenylchrysene, N,N,N',N',N'',N'',N''',N'''-octaphenyldibenzo[g,p]chrysene-2,7,10,15-tetraamine (abbreviation: DBC1), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'- diyl)diphenanthrene (abbreviation: DPNS2), 1,3,5-tri(1-pyrenyl)benzene (abbreviation: TPB3), 5,12-diphenyltetracene, 5,12-bis(biphenyl-2-yl)tetracene, and 9-(1-naphthyl)-10-[4-(2-naphthyl)phenyl]anthracene (abbreviation: αN-BNPAnth).

As an organic compound used in combination with a phosphorescent material, an organic compound having triplet excitation energy (an energy difference between a ground state and a triplet excited state) which is higher than that of the light-emitting substance is selected.

When a plurality of organic compounds (e.g., a first host material and a second host material (or an assist material)) are used in combination with the light-emitting substance so that an exciplex is formed, the plurality of organic compounds are preferably mixed with a phosphorescent material (in particular, an organometallic complex).

With such a structure, light emission can be efficiently obtained by exciplex-triplet energy transfer (ExTET), which is energy transfer from an exciplex to a light-emitting substance. Note that a combination of the plurality of organic compounds that easily forms an exciplex is preferably employed, and it is particularly preferable to combine a compound that easily accepts holes (a hole-transport material) and a compound that easily accepts electrons (an electron-transport material). When a combination of materials is selected so as to form an exciplex that exhibits light emission whose wavelength overlaps with the wavelength on a lowest-energy-side absorption band of the light-emitting substance, energy can be transferred smoothly and light emission can be obtained efficiently. As the hole-transport material and the electron-transport material, specifically, any of the materials described in this embodiment can be used. With the above structure, high efficiency, low voltage driving, and a long lifetime of the light-emitting device can be achieved at the same time.

In a combination of materials for forming an exciplex, the HOMO level of the electron-transport material is preferably higher than or equal to that of the electron-transport material. In addition, the lowest unoccupied molecular orbital level (LUMO level) of the hole-transport material is preferably higher than or equal to that of the electron-transport material. The LUMO levels and the HOMO levels of the materials can be derived from the electrochemical characteristics (the reduction potentials and the oxidation potentials) of the materials that are measured by cyclic voltammetry (CV).

The formation of an exciplex can be confirmed, for example, by a phenomenon in which the emission spectrum of a mixed film in which the hole-transport material and the electron-transport material are mixed is shifted to the longer wavelength side than the emission spectra of each of the materials (or has another peak on the longer wavelength side) observed by comparison of the emission spectra of the hole-transport material, the electron-transport material, and the mixed film of these materials. Alternatively, the formation of an exciplex can be confirmed by a difference in transient response, such as a phenomenon in which the transient photoluminescence (PL) lifetime of the mixed film has more long-lifetime components or has a larger proportion of delayed components than that of each of the materials, observed by comparison of transient PL of the hole-transport material, the electron-transport material, and the mixed film of these materials.

The transient PL can be rephrased as transient electroluminescence (EL). That is, the formation of an exciplex can also be confirmed by a difference in transient response observed by comparison of the transient EL of the hole-transport material, the electron-transport material, and the mixed film of the materials.

Examples of organic compounds that can be used in combination with a phosphorescent material include an aromatic amine (a compound having an aromatic amine skeleton), a carbazole derivative (a compound having a carbazole skeleton), a dibenzothiophene derivative (a thiophene derivative), a dibenzofuran derivative (a furan derivative), zinc- and aluminum-based metal complexes, an oxadiazole derivative, a triazole derivative, a benzimidazole derivative, a quinoxaline derivative, a dibenzoquinoxaline derivative, a pyrimidine derivative, a triazine derivative, a pyridine derivative, a bipyridine derivative, and a phenanthroline derivative. Specific examples of the aromatic amine, carbazole derivatives, dibenzothiophene derivatives, and dibenzofuran derivatives, which are organic compounds having a high hole-transport property, are given below.

Examples of carbazole derivatives include a bicarbazole derivative (e.g., a 3,3'-bicarbazole derivative) and an aromatic amine having a carbazolyl group.

Specific examples of bicarbazole derivatives (e.g., a 3,3'-bicarbazole derivative) include 3,3'-bis(9-phenyl-9H-carbazole) (abbreviation: PCCP), 9,9'-bis(1,1'-biphenyl-4-yl)-3,3'-bi-9H-carbazole, 9,9'-bis(1,1'-biphenyl-3-yl)-3,3'-bi-9H-carbazole, 9-(1,1'-biphenyl-3-yl)-9'-(1,1'-biphenyl-4-yl)-9H, 9'H-3,3'-bicarbazole (abbreviation: mBPCCBP), 9-(2-naphthyl)-9'-phenyl-9H, and 9'H-3,3'-bicarbazole (abbreviation: BNCCP).

Specific examples of the aromatic amine having a carbazolyl group include PCBA1BP, N-(4-biphenyl)-N-(9,9-dimethyl-9H-fluoren-2-yl)-9-phenyl-9H-carbazol-3-amine (abbreviation: PCBiF), PCBBiF, PCBBi1BP, PCBANB, PCBNBB, 4-phenyldiphenyl-(9-phenyl-9H-carbazol-3-yl)amine (abbreviation: PCA1BP), N,N-bis(9-phenylcarbazol-3-yl)-N,N-diphenylbenzene-1,3-diamine (abbreviation: PCA2B), N,N',N''-triphenyl-N,N',N''-tris(9-phenylcarbazol-3-yl)benzene-1,3,5-triamine (abbreviation: PCA3B), 9,9-dimethyl-N-phenyl-N-[4-(9-phenyl-9H-carbazol-3-yl)phenyl]fluoren-2-amine (abbreviation: PCBAF), PCBASF, 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCZTPN2), 2-[N-(9-phenylcarbazol-3-yl)-N-phenylamino]spiro-9,9'-bifluorene (abbreviation: PCASF), N-[4-(9H-carbazol-9-yl)phenyl]-N-(4-phenyl)phenylaniline (abbreviation: YGA1BP), N,N-bis[4-(carbazol-9-yl)phenyl]-N,N-diphenyl-9,9-dimethylfluorene-2,7-diamine (abbreviation: YGA2F), and 4,4',4''-tris(carbazol-9-yl)triphenylamine (abbreviation: TCTA).

Other examples of the carbazole derivative include 3-[4-(9-phenanthryl)-phenyl]-9-phenyl-9H-carbazole (abbreviation: PCPPn), PCPN, 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 1,3,5-tris[4-(N-carbazolyl)phenyl]benzene (abbreviation: TCPB), and CzPA.

Specific examples of a thiophene derivative (a compound having a thiophene skeleton) and a furan derivative (a compound having a furan skeleton) include compounds having a thiophene skeleton, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV), and 4-{3-[3-(9-phenyl-9H-fluoren-9-yl)phenyl]phenyl}dibenzofuran (abbreviation: mmDBFFLBi-II).

Specific examples of the aromatic amine include 4,4'-bis[N-(1-naphthyl)-N-phenylamino]biphenyl (abbreviation: NPB or α-NPD), N,N-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), BPAFLP, mBPAFLP, N-(9,9-dimethyl-9H-fluoren-2-yl)-N-{9,9-dimethyl-2-[N'-phenyl-N-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 2,7-bis[N-(4-diphenylaminophenyl)-N-phenylamino]-spiro-9,9'-bifluorene (abbreviation: DPA2SF), 4,4',4"-tris[N-(1-naphthyl)-N-phenylamino]triphenylamine (abbreviation: 1'-TNATA), 4,4',4"-tris(N,N-diphenylamino)triphenylamine (abbreviation: TDATA), 4,4',4"-tris[N-(3-methylphenyl)-N-phenylamino]triphenylamine (abbreviation: m-MTDATA), N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), 4,4'-bis(N-{4-[N-(3-methylphenyl)-N'-phenylamino]phenyl}-N-phenylamino)biphenyl (abbreviation: DNTPD), and 1,3,5-tris[N-(4-diphenylaminophenyl)-N-phenylamino]benzene (abbreviation: DPA3B).

As an organic compound having a high hole-transport property, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N-bis(phenyl)benzidine] (abbreviation: Poly-TPD) can also be used.

Specific examples of zinc- and aluminum-based metal complexes, which are organic compounds having a high electron-transport property, include metal complexes having a quinoline skeleton or a benzoquinoline skeleton, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), and bis(8-quinolinolato)zinc(II) (abbreviation: Znq).

Alternatively, a metal complex having an oxazole-based or thiazole-based ligand, such as bis[2-(2-benzoxazolyl)phenolato]zinc(II) (abbreviation: ZnPBO) or bis[2-(2-benzothiazolyl)phenolato]zinc(II) (abbreviation: ZnBTZ), can be used.

Specific examples of an oxadiazole derivative, a triazole derivative, a benzimidazole derivative, a quinoxaline derivative, a dibenzoquinoxaline derivative, and a phenanthroline derivative, which are organic compounds having a high electron-transport property, include 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), 2-{4-[9,10-di(naphthalen-2-yl)-2-anthryl]phenyl}-1-phenyl-1H-benzimidazole (abbreviation: ZADN), 2,2',2"-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), 4,4'-bis(5-methylbenzoxazol-2-yl)stilbene (abbreviation: BzOS), bathophenanthroline (abbreviation: Bphen), bathocuproine (abbreviation: BCP), 2,9-bis(naphthalen-2-yl)-4,7-diphenyl-1,10-phenanthroline (abbreviation: NBphen), 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), and 6-[3-(dibenzothiophen-4-yl)phenyl]dibenzo[f,h]quinoxaline (abbreviation: 6mDBTPDBq-II).

Specific examples of a heterocyclic compound having a diazine skeleton, a heterocyclic compound having a triazine skeleton, and a heterocyclic compound having a pyridine skeleton, which are organic compounds having a high electron-transport property, include 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl)phenyl]-9'-phenyl-2,3'-bi-9H-carbazole (abbreviation: mPCCzPTzn-02), 2-[3'-(9,9-dimethyl-9H-fluorene-2-yl)-1,1'-biphenyl-3-yl]-4,6-diphenyl-1,3,5-triazine (abbreviation: mFBPTzn), 2-[(1,1'-biphenyl)-4-yl]-4-phenyl-6-[9,9'-spirobi(9H-fluoren)-2-yl]-1,3,5-triazine (abbreviation: BP-SFTzn), 2-{3-[3-(benzo[b]naphtho[1,2-d]furan-8-yl)phenyl]phenyl}-4,6-diphenyl-1,3,5-triazine (abbreviation: mBnfBPTzn), 2-{3-[3-(benzo[b]naphtho[1,2-d]furan-6-yl)phenyl]phenyl}-4,6-diphenyl-1,3,5-triazine (abbreviation: mBnfBPTzn-02), 3,5-bis(3-(9H-carbazol-9-yl)phenyl)pyridine (abbreviation: 35DCzPPy), and 1,3,5-tri[3-(3-pyridyl)phenyl]benzene (abbreviation: TmPyPB).

As an organic compound having a high electron-transport property, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can also be used.

A TADF material has a small difference between the S1 level (energy level in a singlet excited state) and the $T_1$ level (energy level in a triplet excited state) and has a function of converting triplet excitation energy into singlet excitation energy by reverse intersystem crossing. Thus, a TADF material can upconvert triplet excitation energy into singlet excitation energy (i.e., reverse intersystem crossing is possible) using a small amount of thermal energy and efficiently generate a singlet excited state. In addition, the triplet excitation energy can be converted into luminescence. Thermally activated delayed fluorescence is efficiently obtained under the condition where the energy difference between the $S_1$ level and the $T_1$ level is greater than or equal to 0 eV and less than or equal to 0.2 eV, preferably greater than or equal to 0 eV and less than or equal to 0.1 eV. Note that "delayed fluorescence" exhibited by the TADF material refers to light emission having the same spectrum as normal fluorescence and an extremely long lifetime. The lifetime is $1 \times 10^{-6}$ seconds or longer, preferably $1 \times 10^{-3}$ seconds or longer.

An exciplex whose excited state is formed of two kinds of substances has an extremely small difference between the $S_1$ level and the $T_1$ level and functions as a TADF material capable of converting triplet excitation energy into singlet excitation energy.

A phosphorescent spectrum observed at low temperatures (e.g., 77 K to 10 K) is used for an index of the $T_1$ level. When the level of energy with a wavelength of the line obtained by extrapolating a tangent to the fluorescent spectrum at a tail on the short wavelength side is the $S_1$ level and the level of energy with a wavelength of the line obtained by extrapolating a tangent to the phosphorescent spectrum at a tail on the short wavelength side is the $T_1$ level, the difference between the $S_1$ level and the $T_1$ level of the TADF material is preferably smaller than or equal to 0.3 eV, further preferably smaller than or equal to 0.2 eV.

The TADF material may be used as a guest material or a host material.

Examples of the TADF material include fullerene, a derivative thereof, an acridine derivative such as proflavine, and eosin. Other examples include a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (abbreviation: $SnF_2$(Proto IX)), a mesoporphyrin-tin fluoride complex (abbreviation: $SnF_2$(Meso IX)), a hematoporphyrin-tin fluoride complex (abbreviation: $SnF_2$(Hemato IX)), a coproporphyrin tetramethyl ester-tin fluoride complex (abbreviation: $SnF_2$(Copro III-4Me)), an octaethylporphyrin-tin fluoride complex (abbreviation: $SnF_2$(OEP)), an etioporphyrin-tin fluoride complex (abbreviation: $SnF_2$(Etio I)), and an octaethylporphyrin-platinum chloride complex (abbreviation: $PtCl_2$OEP).

It is also possible to use a heterocyclic compound having a π-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (abbreviation: PIC-TRZ), PCCzPTzn, 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H, 10'H-spiro[acridin-9,9'-anthracen]-10'-one (abbreviation: ACRSA), 4-(9'-phenyl-3,3'-bi-9H-carbazol-9-yl)benzofuro[3,2-d]pyrimidine (abbreviation: 4PCCzBfpm), 4-[4-(9'-phenyl-3,3'-bi-9H-carbazol-9-yl)phenyl]benzofuro[3,2-d]pyrimidine (abbreviation: 4PCCzPBfpm), or 9-[3-(4,6-diphenyl-1,3,5-triazin-2-yl)phenyl]-9'-phenyl-2,3'-bi-9H-carbazole (abbreviation: mPCCzPTzn-02). Such a heterocyclic compound is preferred because of having high electron-transport and hole-transport properties owing to a π-electron rich heteroaromatic ring and a π-electron deficient heteroaromatic ring. Note that an aromatic ring to which an electron-withdrawing group such as a cyano group is bonded may be used instead of the π-electron deficient heteroaromatic ring. Furthermore, a π-electron deficient skeleton can be used instead of the π-electron deficient heteroaromatic ring. Similarly, a π-electron rich skeleton can be used instead of the π-electron rich heteroaromatic ring.

Among skeletons having the π-electron deficient heteroaromatic ring, a pyridine skeleton, a diazine skeleton (a pyrimidine skeleton, a pyrazine skeleton, and a pyridazine skeleton), and a triazine skeleton are preferred because of their high stability and reliability. In particular, a benzofuropyrimidine skeleton, a benzothienopyrimidine skeleton, a benzofuropyrazine skeleton, and a benzothienopyrazine skeleton are preferred because of their high electron-accepting properties and reliability.

Among skeletons having the π-electron rich heteroaromatic ring, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included. A dibenzofuran skeleton, a dibenzothiophene skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable.

Note that a substance in which a π-electron rich heteroaromatic ring is directly bonded to a π-electron deficient heteroaromatic ring is particularly preferable because both the donor property of the π-electron rich heteroaromatic ring and the acceptor property of the π-electron deficient heteroaromatic ring are improved and the energy difference between the singlet excited state and the triplet excited state becomes small.

As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a boron-containing skeleton such as phenylborane or boranthrene, an aromatic ring or a heteroaromatic ring having a cyano group or a nitrile group, such as benzonitrile or cyanobenzene, a carbonyl skeleton such as benzophenone, a phosphine oxide skeleton, a sulfone skeleton, or the like can be used.

Note that when a TADF material is used as the light-emitting substance, the TADF material can also be used in combination with another organic compound. Specifically, the TADF material can be used in combination with the above-described host material (hole-transport material and electron-transport material). In the case of using the TADF material, the $S_1$ level of the host material is preferably higher than that of the TADF material. In addition, the $T_1$ level of the host material is preferably higher than that of the TADF material.

Alternatively, a TADF material may be used as a host material, and a fluorescent material may be used as a guest material. When the TADF material is used as the host material, triplet excitation energy generated in the TADF material is converted into singlet excitation energy by reverse intersystem crossing and transferred to the light-emitting substance, whereby the emission efficiency of the light-emitting device can be increased. Here, the TADF material functions as an energy donor, and the light-emitting substance functions as an energy acceptor. Therefore, the use of the TADF material as the host material is highly effective in the case where a fluorescent material is used as the guest material. In that case, it is preferable that the $S_1$ level of the TADF material be higher than the $S_1$ level of the fluorescent material in order that high emission efficiency be achieved. Furthermore, the $T_1$ level of the TADF material is preferably higher than the $S_1$ level of the fluorescent material. Therefore, the $T_1$ level of the TADF material is preferably higher than the $T_1$ level of the fluorescent material.

It is preferable to use a TADF material that emits light with a wavelength that overlaps the wavelength of the absorption band on the lowest energy side of the fluorescent material, in which case the excitation energy is smoothly transferred from the TADF material to the fluorescent material and light is emitted with high efficiency.

In addition, in order to efficiently generate singlet excitation energy from the triplet excitation energy by reverse intersystem crossing, carrier recombination preferably occurs in the TADF material. It is also preferable that the triplet excitation energy generated in the TADF material not be transferred to the triplet excitation energy of the fluorescent material. For that reason, the fluorescent material preferably has a protective group around a luminophore (a skeleton that causes light emission) of the fluorescent material. As the protective group, a substituent having no π bond and a saturated hydrocarbon are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent material have a plurality of protective groups. Since substituents having no π bond are poor in carrier transport performance, the TADF material and the luminophore of the fluorescent material can be made away from each other with little influence on carrier transportation or carrier recombination. Here, the luminophore refers to an atomic group (skeleton) that causes light emission in a fluorescent material. The luminophore is preferably a skeleton having a π bond, further preferably includes an aromatic ring, and still further preferably includes a condensed aromatic ring or a condensed heteroaromatic ring. Examples of the condensed aromatic ring and the condensed heteroaromatic ring include a phenanthrene skeleton, a stilbene skeleton, an acridone skeleton, a phenoxazine skeleton, and a phenothiazine skeleton. Specifically, a fluorescent material having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferred because of its high fluorescence quantum yield.

<Electron-Transport Layer>

The electron-transport layer 124 transports electrons injected from the cathode 102, to the light-emitting layer 123.

The electron-transport layer 124 contains an electron-transport material and a first substance.

The electron-transport material has an electron-transport property higher than a hole-transport property.

The electron-transport material used for the electron-transport layer 124 preferably has a highest occupied molecular orbital level (HOMO level) of −6.0 eV or higher.

The electron mobility of the electron-transport material used for the electron-transport layer 124 is preferably higher than or equal to $1\times10^{-7}$ cm$^2$/Vs and lower than or equal to $1\times10^{-5}$ cm$^2$, further preferably higher than or equal to $1\times10^{-7}$ cm$^2$/Vs and lower than or equal to $5\times10^{-5}$ cm$^2$ in the case where the square root of the electric field strength [V/cm] is 600.

The electron mobility when the square root of the electric field strength [V/cm] is 600 is preferably smaller in the electron-transport material used for the electron-transport layer 124 than in the host material of the light-emitting layer 123. The amount of electrons injected into the light-emitting layer 123 can be controlled by the reduction in the electron-transport property of the electron-transport layer 124, whereby the light-emitting layer 123 can be prevented from having excess electrons.

The electron-transport material used for the electron-transport layer 124 preferably has an anthracene skeleton, and further preferably has an anthracene skeleton and a heterocyclic skeleton. The heterocyclic skeleton is preferably a nitrogen-containing five-membered ring skeleton. It is particularly preferred that the nitrogen-containing five-membered ring skeleton include two heteroatoms in a ring, like a pyrazol ring, an imidazole ring, an oxazole ring, or a thiazole ring.

In addition, some of the above-described electron-transport materials that can be used as the host material, or the above-described substances given as materials that can be used as the host material in combination with the above fluorescent material can be used in the electron-transport layer 124.

Examples of the electron-transport material used for the electron-transport layer 124 include 2-{4-[9,10-di(naphthalen-2-yl)-2-anthryl]phenyl}-1-phenyl-1H-benzimidazole (abbreviation: ZADN), 9-(1-naphthyl)-10-[4-(2-naphthyl)phenyl]anthracene (abbreviation: αN-BNPAnth), 9-[4-(10-phenyl-9-anthracenyl)phenyl]-9H-carbazole (abbreviation: CzPA), and 7-[4-(10-phenyl-9-anthryl)phenyl]-7H-dibenzo[c,g]carbazole (abbreviation: cgDBCzPA).

Other examples of the electron-transport material used for the electron-transport layer 124 include the electron-transport materials that can be used in the above-described light-emitting layer and the organic compounds (host materials) that can be used in combination with the fluorescent material.

The first substance is a metal, a metallic salt, a metal oxide, or an organometallic salt.

Examples of the metal include an alkali metal, an alkaline earth metal, and a rare earth metal. Specific examples include Li, Na, K, Rb, Cs, Mg, Ca, Sr, and Ba.

Examples of the metallic salt include halides of the above metals and carbonates of the above metals. Specific examples include LiF, NaF, KF, RbF, CsF, MgF$_2$, CaF$_2$, SrF$_2$, BaF$_2$, LiCl, NaCl, KCl, RbCl, CsCl, MgCl$_2$, CaCl$_2$, SrCl$_2$, BaCl$_2$, LizCO$_3$, and Cs$_2$CO$_3$.

Examples of the metal oxide are oxides of the above metals. Specific examples include Li$_2$O, Na$_2$O, Cs$_2$O, MgO, and CaO.

Examples of the organometallic salt are organometallic complexes.

The first substance is preferably an organometallic complex containing an alkali metal or an alkaline earth metal.

The first substance is preferably an organometallic complex including a ligand containing nitrogen and oxygen, and an alkali metal or an alkaline earth metal.

The first substance is preferably an organometallic complex including a quinolinol ligand, and an alkali metal or an alkaline earth metal.

Examples of the organometallic complex include 8-(quinolinolato)lithium (abbreviation: Liq), 8-hydroxyquinoline sodium salt (abbreviation: Naq), 8-hydroxyquinoline potassium (abbreviation: Kq), bis(8-quinolinolato)magnesium (abbreviation: Mgq$_2$), and bis(8-quinolinolato)zinc(II) (abbreviation: Znq$_2$).

As the first substance, Liq is particularly preferable.

As illustrated in FIG. 18D, the electron-transport layer 124 may include the electron-transport layer 124a closer to the light-emitting layer 123 and the electron-transport layer 124b closer to the cathode 102. The electron-transport layer 124a and the electron-transport layer 124b preferably have a different concentration ratio of the electron-transport material to the first substance. For example, the concentration of the first substance is preferably higher in the electron-transport layer 124a than in the electron-transport layer 124b.

<Electron-Injection Layer>

The electron-injection layer 125 increases the injection efficiency of electrons from the cathode 102. The difference between the work function of the material of the cathode 102 and the LUMO level of the material used for the electron-injection layer 125 is preferably small (within 0.5 eV).

The electron-injection layer 125 can be formed using an alkali metal, an alkaline earth metal, or a compound thereof, such as lithium, cesium, lithium fluoride (LiF), cesium fluoride (CsF), calcium fluoride ($CaF_2$), 8-(quinolinolato) lithium (abbreviation: Liq), 2-(2-pyridyl)phenolatolithium (abbreviation: LiPP), 2-(2-pyridyl)-3-pyridinolato lithium (abbreviation: LiPPy), 4-phenyl-2-(2-pyridyl)phenolato lithium (abbreviation: LiPPP), lithium oxide ($LiO_x$), or cesium carbonate. A rare earth metal compound like erbium fluoride ($ErF_3$) can also be used. Electride may also be used for the electron-injection layer. An example of the electride includes a substance in which electrons are added at high concentration to calcium oxide-aluminum oxide. Any of the above-described substances used for the electron-transport layer can also be used.

A composite material containing an electron-transport material and a donor material (an electron-donating material) may be used for the electron-injection layer. Such a composite material is excellent in an electron-injection property and an electron-transport property because electrons are generated in the organic compound by the electron donor. The organic compound here is preferably a material excellent in transporting the generated electrons; specifically, any of the above electron-transport materials (e.g., the metal complexes and the heteroaromatic compounds) can be used, for example. As the electron donor, a substance showing an electron-donating property with respect to the organic compound is used. Specifically, an alkali metal, an alkaline earth metal, and a rare earth metal are preferable, and lithium, cesium, magnesium, calcium, erbium, ytterbium, and the like are given. In addition, an alkali metal oxide and an alkaline earth metal oxide are preferable, and lithium oxide, calcium oxide, barium oxide, and the like are given. Alternatively, a Lewis base such as magnesium oxide can be used. Further alternatively, an organic compound such as tetrathiafulvalene (abbreviation: TTF) can be used.

<Charge Generation Layer>

The charge generation layer 104 has a function of injecting electrons into the EL layer 103a and injecting holes into the EL layer 103b when voltage is applied between the anode 101 and the cathode 102.

The charge generation layer 104 may contain a hole-transport material and an acceptor material or contain an electron-transport material and a donor material. Forming the charge generation layer 104 with such a structure can suppress an increase in the driving voltage that would be caused when the EL layers are stacked.

The hole-transport material, the acceptor material, the electron-transport material, and the donor material can be any of the corresponding materials described above.

For fabrication of the light-emitting device of this embodiment, a vacuum process such as an evaporation method or a solution process such as a spin coating method or an ink-jet method can be used. When an evaporation method is used, a physical vapor deposition method (PVD method) such as a sputtering method, an ion plating method, an ion beam evaporation method, a molecular beam evaporation method, or a vacuum evaporation method, a chemical vapor deposition method (CVD method), or the like can be used. Specifically, the functional layers (the hole-injection layer, the hole-transport layers, the light-emitting layer, the electron-transport layers, and the electron-injection layer) included in the EL layer can be formed by an evaporation method (e.g., a vacuum evaporation method), a coating method (e.g., a dip coating method, a die coating method, a bar coating method, a spin coating method, or a spray coating method), a printing method (e.g., an ink-jet method, screen printing (stencil), offset printing (planography), flexography (relief printing), gravure printing, or micro-contact printing), or the like.

The materials of the functional layers included in the light-emitting device are not limited to the above-described materials. For example, as the materials of the functional layers, a high molecular compound (e.g., an oligomer, a dendrimer, and a polymer), a middle molecular compound (a compound between a low molecular compound and a high molecular compound with a molecular weight of 400 to 4000), or an inorganic compound (e.g., a quantum dot material) may be used. The quantum dot material may be a colloidal quantum dot material, an alloyed quantum dot material, a core-shell quantum dot material, a core quantum dot material, or the like.

[Light Emission Model in Light-Emitting Device]

A light emission model of the light-emitting device of this embodiment will be described.

Here, a light emission model of a light-emitting device is described using the hole-transport layer 122, the light-emitting layer 123, and the electron-transport layer 124 in FIG. 18A. The light emission model can also apply to a light-emitting device having a structure other than that in FIG. 18A.

Figure 19A:
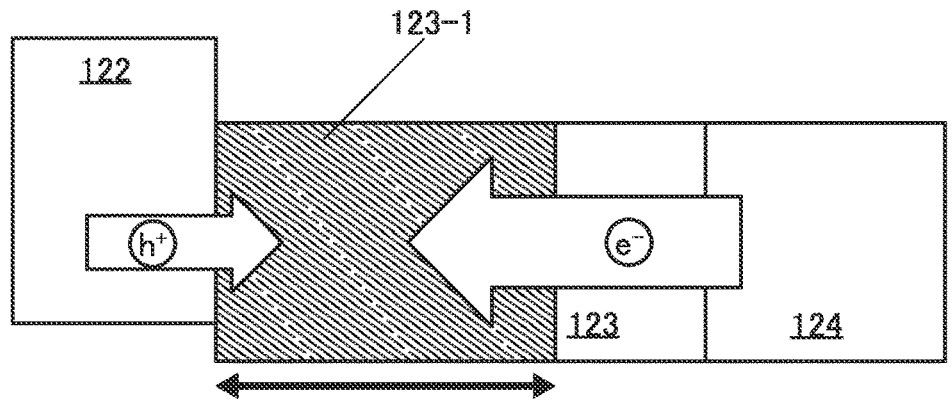
FIGS. 19A to 19C are conceptual diagrams illustrating light emission models of light-emitting devices.

When the light-emitting layer 123 is in a state of having excess electrons, a light-emitting region 123-1 is formed in a limited region of the light-emitting layer 123, as illustrated in FIG. 19A. In other words, the width of the light-emitting region 123-1 in the light-emitting layer 123 is small. Therefore, electrons ($e^-$) and holes ($h^+$) are recombined intensively in the limited region of the light-emitting layer 123, which accelerates degradation. In addition, the lifetime or emission efficiency may be reduced when electrons that have not been recombined in the light-emitting layer 123 pass through the light-emitting layer 123.

Figure 19B:
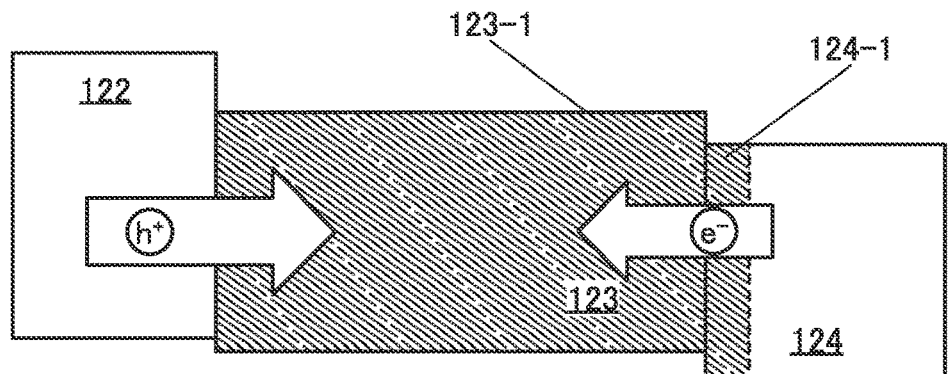
Figure 19C:
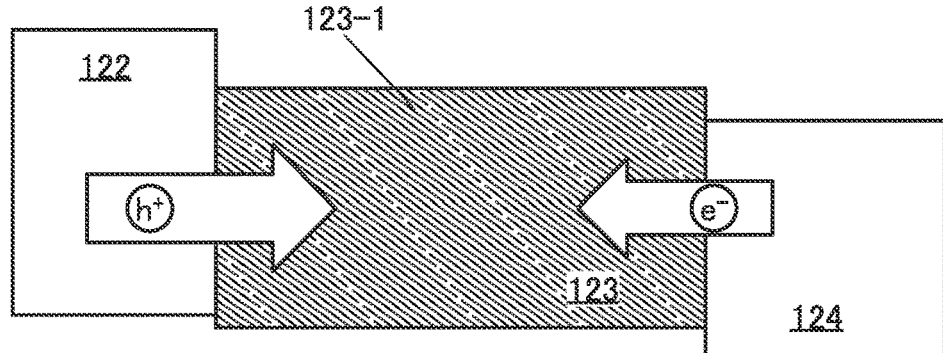

Meanwhile, in the light-emitting device of one embodiment of the present invention, the width of the light-emitting region 123-1 in the light-emitting layer 123 can be increased because of a low electron-transport property of the electron-transport layer 124 (FIGS. 19B and 19C).

Increasing the width of the light-emitting region 123-1 enables an electron-hole recombination region in the light-emitting layer 123 to be dispersed. Consequently, a light-emitting device with a long lifetime and high emission efficiency can be provided.

At the initial stage of driving of the light-emitting device of one embodiment of the present invention, a recombination region may extend to the electron-transport layer 124, as illustrated in FIG. 19B. In FIG. 19B, a recombination region in the electron-transport layer 124 is denoted by a region 124-1. Specifically, in the light-emitting device of one embodiment of the present invention, the light-emitting region 123-1 (i.e., the recombination region) may be formed in the entire light-emitting layer 123 and the recombination region may also be formed in the electron-transport layer 124, because a hole injection barrier is small at the initial stage of driving and the electron-transport property of the electron-transport layer 124 is relatively low.

Since the HOMO level of the electron-transport material contained in the electron-transport layer 124 is −6.0 eV or more, which is comparatively high, some of holes may reach the electron-transport layer 124 and recombination may be caused also in the electron-transport layer 124. Note that this phenomenon sometimes occurs when the difference in the HOMO level between the host material (or the assist material) contained in the light-emitting layer 123 and the electron-transport material contained in the electron-transport layer 124 is 0.2 eV or less.

As illustrated in FIG. 19C, the carrier balance changes as the driving time of the light-emitting device of one embodiment of the present invention increases, and thus recombination is less likely to occur in the electron-transport layer 124. The recombination in the electron-transport layer 124 is inhibited while the light-emitting region 123-1 is formed in the entire light-emitting layer 123, whereby the energy of recombined carriers can contribute effectively to light emission. Accordingly, the luminance may increase compared to that at the initial stage of driving. This luminance increase cancels out the rapid luminance reduction at the initial stage of driving of the light-emitting device, which is known as the initial decay. Thus, the light-emitting device can have a long driving lifetime with a small initial decay. Note that in this specification and the like, the structure of the above-described light-emitting device may be referred to as a Recombination-Site Tailoring Injection structure (ReSTI structure).

Figure 19D:
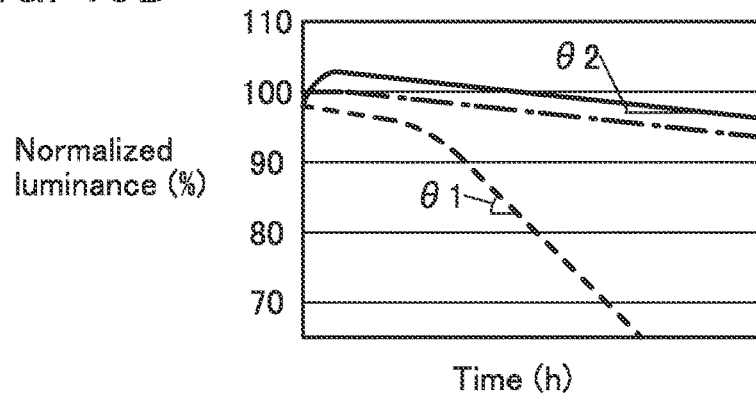
FIG. 19D shows normalized luminance of light-emitting devices over time.

Here, normalized luminance over time of light-emitting devices of this embodiment and a comparative light-emitting device will be described with reference to FIG. 19D. In FIG. 19D, a thick solid line and a thick dashed-dotted line are decay curves of normalized luminance of the light-emitting devices of this embodiment, and a solid dashed line is a decay curve of normalized luminance of the comparative light-emitting device.

As shown in FIG. 19D, the slope of the decay curve of normalized luminance is different between the light-emitting devices of this embodiment and the comparative light-emitting device. Specifically, a slope θ2 of the decay curve of the light-emitting device of this embodiment is smaller than a slope θ1 of the decay curve of the comparative light-emitting device.

As shown in FIG. 19D, the light-emitting device of one embodiment of the present invention may have a local maximum value (indicated by the thick solid line) in the decay curve of luminance obtained in a driving test under a condition with a fixed current density. In other words, the light-emitting device of one embodiment of the present invention may show a behavior such that the luminance increases with time. This behavior can cancel out rapid degradation at the initial stage of driving (i.e., initial decay). Note that the light-emitting device of one embodiment of the present invention is not limited to the above; for example, as indicated by the solid dashed-dotted line in FIG. 19D, the luminance does not have a local maximum value, that is, the slope of the decay curve can be smaller without the luminance increase. Thus, the light-emitting device having the structure showing the behavior can have a small initial decay and an extremely long driving lifetime.

Note that a differential value of the decay curve having the local maximum value is 0 in a part. Therefore, a light-emitting device having a decay curve whose differential value is 0 in a part can be referred to as a light-emitting device of one embodiment of the present invention.

In the light-emitting device of one embodiment of the present invention, the mix ratio (concentrations) of the electron-transport material and the first substance in the electron-transport layer 124 preferably varies in the thickness direction. Specifically, the mix ratio (concentrations) of the electron-transport material and the metal, metallic salt, metal oxide, or organometallic complex preferably varies.

The concentration of the first substance in the electron-transport layer 124 can be estimated from the amount of atoms and molecules detected by time-of-flight secondary ion mass spectrometry (ToF-SIMS). In portions that contain the same two kinds of materials with different mix ratios, values measured by ToF-SIMS correspond to the amounts of targeted atoms or molecules. Therefore, comparing the detected amounts of the electron-transport material and the organometallic complex allows estimation of their mix ratio.

The amount of the first substance contained in the electron-transport layer 124 is preferably smaller on the cathode 102 side than on the anode 101 side. In other words, the electron-transport layer 124 is preferably formed so that the concentration of the first substance increases from the cathode 102 side to the anode 101 side. That is, in the electron-transport layer 124, a portion with a low concentration of the electron-transport material is positioned closer to the light-emitting layer 123 than a portion with a high concentration of the electron-transport material is. In other words, in the electron-transport layer 124, a portion with a high concentration of the first substance is positioned closer to the light-emitting layer 123 than a portion with a low concentration of the first substance is.

In the electron-transport layer 124, the electron mobility of the portion with a high concentration of the electron-transport material (the portion with a low concentration of the first substance) is preferably higher than or equal to $1\times10^{-7}$ cm$^2$/Vs and lower than or equal to $5\times10^{-5}$ cm$^2$/Vs when the square root of the electric field strength [V/cm] is 600.

Figure 20A:
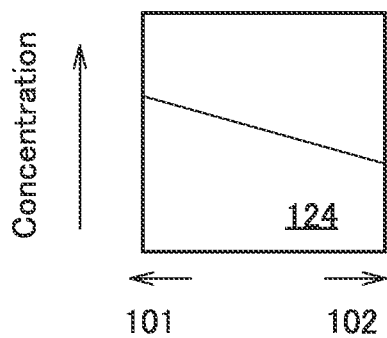
FIGS. 20A to 20D each show the concentration of a first substance in an electron-transport layer.
Figure 20B:
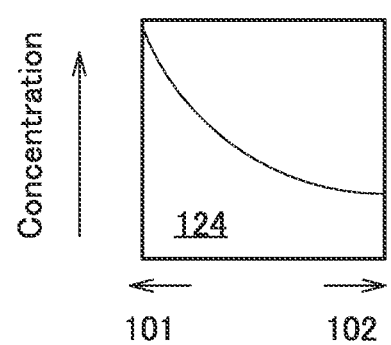
Figure 20C:
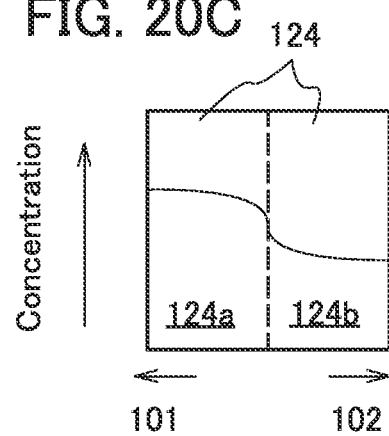
Figure 20D:
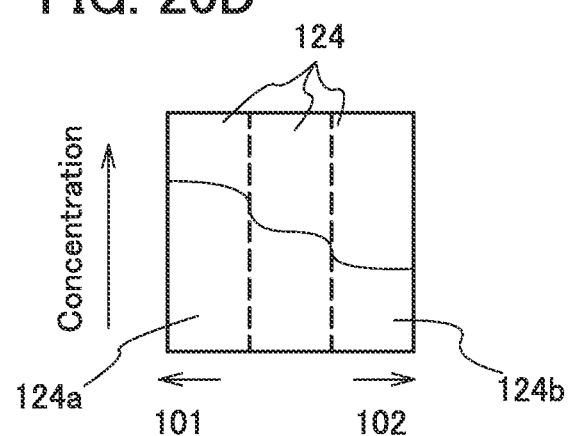

For example, the amount (concentration) of the first substance in the electron-transport layer 124 can be as shown in each of FIGS. 20A to 20D. FIGS. 20A and 20B show the case where no clear boundary exists in the electron-transport layer 124, and FIGS. 20C and 20D show the case where a clear boundary exists in the electron-transport layer 124.

In the case where no clear boundary exists in the electron-transport layer 124, the concentrations of the electron-transport material and the first substance change continuously as shown in FIGS. 20A and 20B. Meanwhile, in the case where a clear boundary exists in the electron-transport layer 124, the concentrations of the electron-transport material and the first substance change in a step-like manner as shown in FIGS. 20C and 20D. The case where the concentrations of the electron-transport material and the first substance change in a step-like manner suggests that the electron-transport layer 124 is formed of a plurality of layers. For example, FIG. 20C shows the case where the electron-transport layer 124 has a two-layer structure, and FIG. 20D shows the case where the electron-transport layer 124 has a three-layer structure. Note that in FIGS. 20C and 20D, a dashed line indicates a boundary region between layers.

A change in carrier balance in the light-emitting device of one embodiment of the present invention is probably caused by a change in electron mobility of the electron-transport layer 124.

In the light-emitting device of one embodiment of the present invention, the concentration of the first substance varies in the electron-transport layer 124. The electron-transport layer 124 includes a region with a high concentration of the first substance between a region with a low concentration of the first substance and the light-emitting layer 123. That is, the region with a low concentration of the first substance is closer to the cathode 102 than the region with a high concentration of the first substance is.

The light-emitting device of one embodiment of the present invention having the above structure has an extremely long lifetime. In particular, the time it takes for the luminance to decrease to 95% given that the initial luminance is 100% (the time can be referred to as LT95) can be extremely long.

This embodiment can be combined with the other embodiments as appropriate.

Embodiment 3

In this embodiment, the display unit of one embodiment of the present invention will be described with reference to FIGS. 21A and 21B and FIGS. 22A and 22B.

Pixel Circuit Example 1

In the display unit of one embodiment of the present invention, a display portion includes first pixel circuits including a light-receiving device and second pixel circuits including a light-emitting device. The first pixel circuits and the second pixel circuits are arranged in a matrix.

Figure 21A:
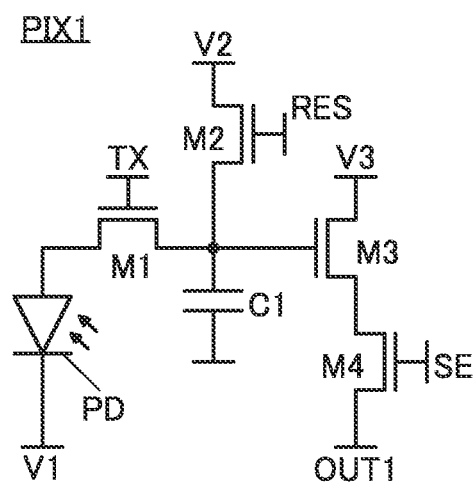
FIGS. 21A and 21B are circuit diagrams each illustrating an example of a pixel circuit.
Figure 21B:
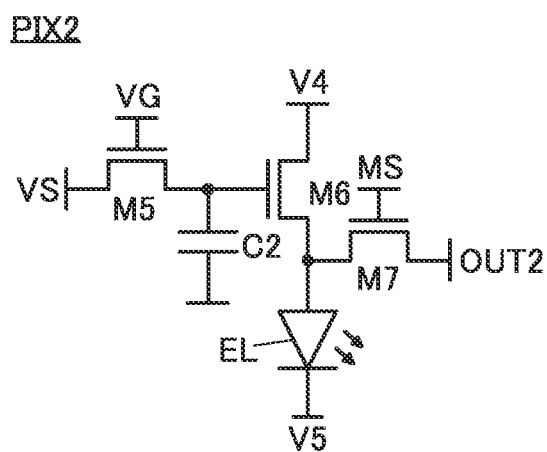

FIG. 21A illustrates an example of the first pixel circuit including a light-receiving device. FIG. 21B illustrates an example of the second pixel circuit including a light-emitting device.

A pixel circuit PIX1 illustrated in FIG. 21A includes the light-receiving device PD, a transistor M1, a transistor M2, a transistor M3, a transistor M4, and a capacitor C1. Here, a photodiode is used as an example of the light-receiving device PD.

A cathode of the light-receiving device PD is electrically connected to a wiring V1, and an anode of the light-receiving device PD is electrically connected to one of a source and a drain of the transistor M1. A gate of the transistor M1 is electrically connected to a wiring TX, and the other of the source and the drain of the transistor M1 is electrically connected to one electrode of the capacitor C1, one of a source and a drain of the transistor M2, and a gate of the transistor M3. A gate of the transistor M2 is electrically connected to a wiring RES, and the other of the source and the drain of the transistor M2 is electrically connected to a wiring V2. One of a source and a drain of the transistor M3 is electrically connected to a wiring V3, and the other of the source and the drain of the transistor M3 is electrically connected to one of a source and a drain of the transistor M4. A gate of the transistor M4 is electrically connected to a wiring SE, and the other of the source and the drain of the transistor M4 is electrically connected to a wiring OUT1.

A constant potential is supplied to the wiring V1, the wiring V2, and the wiring V3. When the light-receiving device PD is driven with a reverse bias, the wiring V2 is supplied with a potential lower than the potential of the wiring V1. The transistor M2 is controlled by a signal supplied to the wiring RES and has a function of resetting the potential of a node connected to the gate of the transistor M3 to a potential supplied to the wiring V2. The transistor M1 is controlled by a signal supplied to the wiring TX and has a function of controlling the timing at which the potential of the node changes, in accordance with a current flowing through the light-receiving device PD. The transistor M3 functions as an amplifier transistor for outputting a signal corresponding to the potential of the node. The transistor M4 is controlled by a signal supplied to the wiring SE and functions as a selection transistor for reading an output corresponding to the potential of the node by an external circuit connected to the wiring OUT1.

A pixel circuit PIX2 illustrated in FIG. 21B includes a light-emitting device EL, a transistor M5, a transistor M6, a transistor M7, and a capacitor C2. Here, a light-emitting diode is used as an example of the light-emitting device EL. In particular, an organic EL device is preferably used as the light-emitting device EL.

A gate of the transistor M5 is electrically connected to a wiring VG, one of a source and a drain of the transistor M5 is electrically connected to a wiring VS, and the other of the source and the drain of the transistor M5 is electrically connected to one electrode of the capacitor C2 and a gate of the transistor M6. One of a source and a drain of the transistor M6 is electrically connected to a wiring V4, and the other is electrically connected to an anode of the light-emitting device EL and one of a source and a drain of the transistor M7. A gate of the transistor M7 is electrically connected to a wiring M5, and the other of the source and the drain of the transistor M7 is electrically connected to a wiring OUT2. A cathode of the light-emitting device EL is electrically connected to a wiring V5.

A constant potential is supplied to the wiring V4 and the wiring V5. The anode of the light-emitting device EL can be set to a high potential, and the cathode can be set to a lower potential than the anode. The transistor M5 is controlled by a signal supplied to the wiring VG and functions as a selection transistor for controlling a selection state of the pixel circuit PIX2. The transistor M6 functions as a driving transistor that controls a current flowing through the light-emitting device EL in accordance with a potential supplied to the gate of the transistor M6. When the transistor M5 is on, a potential supplied to the wiring VS is supplied to the gate of the transistor M6, and the luminance of the light-emitting device EL can be controlled in accordance with the potential. The transistor M7 is controlled by a signal supplied to the wiring M5 and has a function of outputting a potential between the transistor M6 and the light-emitting device EL to the outside through the wiring OUT2.

The wiring V1, to which the cathode of the light-receiving device PD is electrically connected, and the wiring V5, to which the cathode of the light-emitting device EL is electrically connected, can be provided in the same layer and have the same potential.

Here, a transistor in which a metal oxide (an oxide semiconductor) is used in a semiconductor layer where a channel is formed is preferably used as the transistors M1, M2, M3, and M4 included in the pixel circuit PIX1 and the transistors M5 M6, and M7 included in the pixel circuit PIX2.

A transistor using a metal oxide having a wider band gap and a lower carrier density than silicon can achieve an extremely low off-state current. Such a low off-state current enables retention of charges accumulated in a capacitor that is connected in series with the transistor for a long time. Therefore, it is particularly preferable to use a transistor including an oxide semiconductor as the transistors M1, M2, and M5 each of which is connected in series with the capacitor C1 or the capacitor C2. Moreover, the use of transistors including an oxide semiconductor as the other transistors can reduce the manufacturing cost.

Alternatively, transistors using silicon as a semiconductor in which a channel is formed can be used as the transistors M1 to M7. In particular, the use of silicon with high crystallinity, such as single crystal silicon or polycrystalline silicon, is preferable because high field-effect mobility is achieved and higher-speed operation is possible.

Alternatively, a transistor including an oxide semiconductor may be used as at least one of the transistors M1 to M7, and transistors including silicon may be used as the other transistors.

Although n-channel transistors are shown in FIGS. 21A and 21B, p-channel transistors can alternatively be used.

The transistors included in the pixel circuit PIX1 and the transistors included in the pixel circuit PIX2 are preferably formed side by side over the same substrate. It is particularly preferable that the transistors included in the pixel circuit PIX1 and the transistors included in the pixel circuit PIX2 be periodically arranged in one region.

One or more layers including the transistor and/or the capacitor are preferably provided to overlap with the light-receiving device PD or the light-emitting device EL. Thus, the effective area of each pixel circuit can be reduced, and a high-definition light-receiving portion or display portion can be achieved.

[Pixel Circuit Example 2]

Figure 22A:
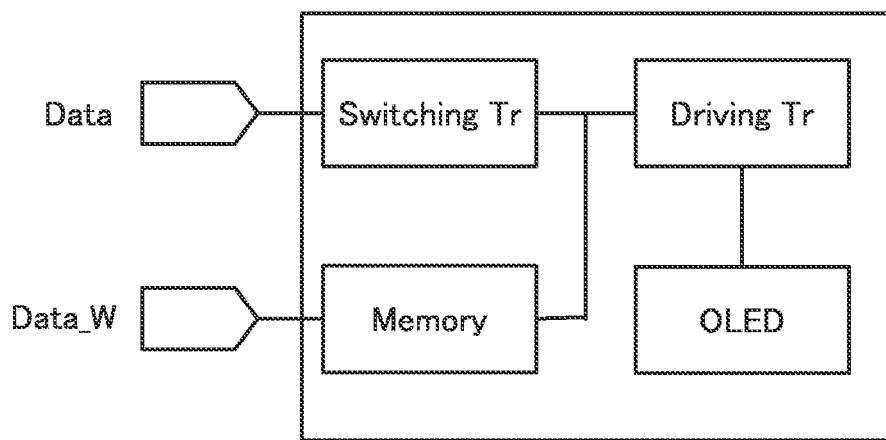
FIG. 22A is a block diagram illustrating an example of a pixel.

FIG. 22A is a block diagram of a pixel. The pixel illustrated in FIG. 22A includes a memory (Memory) in addition to a switching transistor (Switching Tr), a driving transistor (Driving Tr), and a light-emitting device (OLED).

The memory is supplied with data Data_W. By supplying the data Data_W in addition to display data Data to the pixel, the amount of current flowing through the light-emitting device is increased, and the display unit can have high luminance.

The display unit of one embodiment of the present invention captures images in such a manner that light emitted from the light-emitting device as a light source is used and light reflected by a subject is detected by the light-receiving device. The light-emitting device used as the light source is driven on the basis of the display data Data and the data Data_W, whereby the light-emitting device can emit light with high luminance. Higher luminance of the light-emitting device results in a higher S/N ratio. Accordingly, the light detection sensitivity of the light-emitting device can be increased.

Figure 22B:
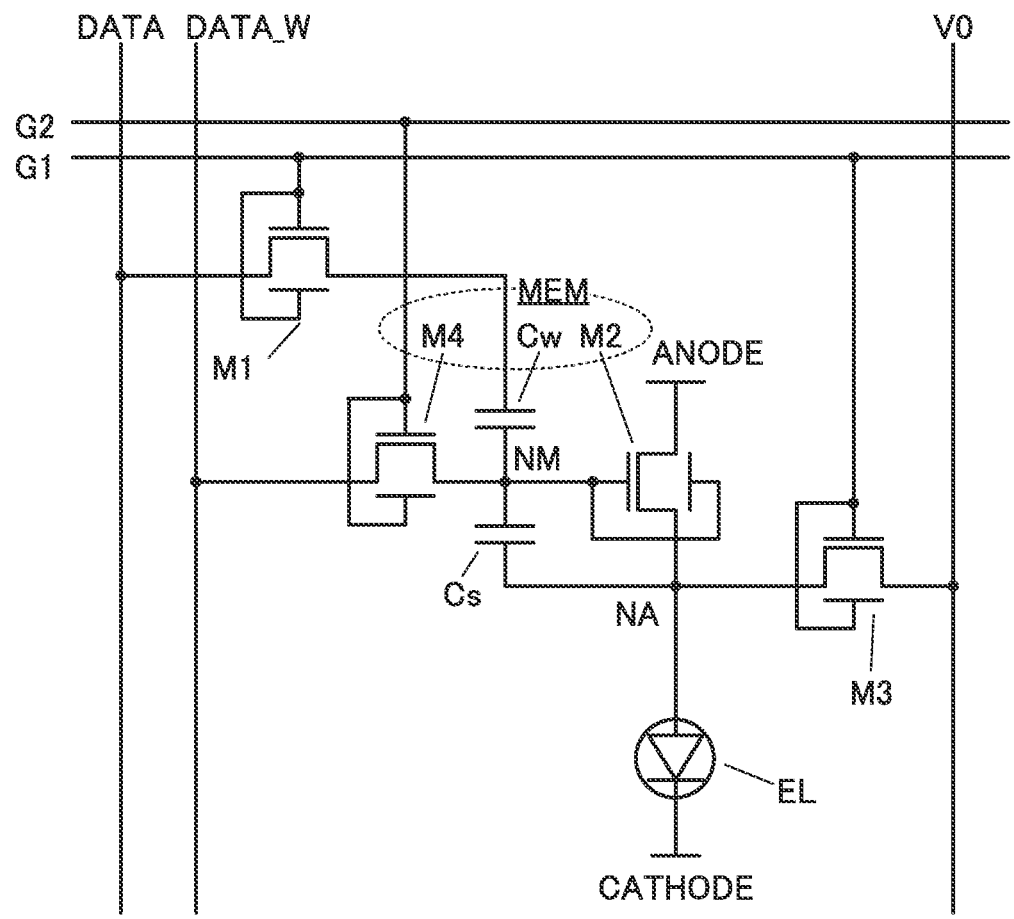
FIG. 22B is a circuit diagram illustrating an example of a pixel circuit.

FIG. 22B is a specific circuit diagram of the pixel circuit.

The pixel illustrated in FIG. 22B includes the transistor M1, the transistor M2, the transistor M3, the transistor M4, a capacitor Cs, a capacitor Cw, and the light-emitting device EL.

One of the source and the drain of the transistor M1 is electrically connected to one electrode of the capacitor Cw. The other electrode of the capacitor Cw is electrically connected to one of the source and the drain of the transistor M4. The one of the source and the drain of the transistor M4 is electrically connected to the gate of the transistor M2. The gate of the transistor M2 is electrically connected to one electrode of the capacitor Cs. The other electrode of the capacitor Cs is electrically connected to one of the source and the drain of the transistor M2. The one of the source and the drain of the transistor M2 is electrically connected to one of the source and the drain of the transistor M3. The one of the source and the drain of the transistor M3 is electrically connected to one electrode of the light-emitting device EL. The transistors illustrated in FIG. 22B each include a back gate electrically connected to its gate; however, the connection of the back gate is not limited thereto. The transistor does not necessarily include the back gate.

Here, a node to which the other electrode of the capacitor Cw, the one of the source and the drain of the transistor M4, the gate of the transistor M2, and the one electrode of the capacitor Cs are connected is referred to as a node NM. Moreover, a node to which the other electrode of the capacitor Cs, the one of the source and the drain of the transistor M2, the one of the source and the drain of the transistor M3, and the one electrode of the light-emitting device EL are connected is referred to as a node NA.

The gate of the transistor M1 is electrically connected to a wiring G1. The gate of the transistor M3 is electrically connected to the wiring G1. The gate of the transistor M4 is electrically connected to a wiring G2. The other of the source and the drain of the transistor M1 is electrically connected to a wiring DATA. The other of the source and the drain of the transistor M3 is electrically connected to a wiring V0. The other of the source and the drain of the transistor M4 is electrically connected to a wiring DATA_W.

The other of the source and the drain of the transistor M2 is electrically connected to a wiring ANODE (the high potential side). The other electrode of the light-emitting device EL is electrically connected to a wiring CATHODE (the low potential side).

The wiring G1 and the wiring G2 can function as a signal line for controlling the operation of the corresponding transistor. The wiring DATA can function as a signal line for supplying an image signal to the pixel. The wiring DATA_W can function as a signal line for writing data to a memory circuit MEM. The wiring DATA_W can function as a signal line for supplying a correction signal to the pixel. The wiring V0 functions as a monitor line for obtaining the electrical characteristics of the transistor M4. Supply of a specific potential from the wiring V0 to the other electrode of the capacitor Cs through the transistor M3 enables stable writing of an image signal.

The memory circuit MEM is formed of the transistors M2, the transistor M4, and the capacitor Cw. The node NM is a storage node; when the transistor M4 is turned on, a signal supplied to the wiring DATA_W can be written to the node NM. The use of a transistor with an extremely low off-state current as the transistor M4 allows the potential of the node NM to be retained for a long time.

As the transistor M4, a transistor containing a metal oxide in its channel formation region (hereinafter referred to as an OS transistor) can be used, for example. Thus, the off-state current of the transistor M4 can be extremely low, and the potential of the node NM can be retained for a long time. In this case, OS transistors are preferably used as the other transistors included in the pixel. For the specific example of the metal oxide, Embodiment 1 can be referred to.

An OS transistor has a large energy gap and thus has an extremely low off-state current. Unlike in a transistor in which Si is included in the channel formation region (hereinafter referred to as a Si transistor), impact ionization, avalanche breakdown, short-channel effects, and the like do not occur in an OS transistor; accordingly, a highly reliable circuit can be configured.

Furthermore, a Si transistor may be used as the transistor M4. In this case, Si transistors are preferably used as the other transistors included in the pixel.

Examples of the Si transistor include a transistor containing amorphous silicon, a transistor containing crystalline silicon (typically, low-temperature polysilicon), and a transistor containing single crystal silicon.

Alternatively, one pixel may include both an OS transistor and a Si transistor.

In the pixel, a signal written to the node NM is capacitively coupled to an image signal supplied from the wiring DATA, and the resulting data can be output to the node NA. Note that the transistor M1 can have a function of selecting a pixel.

In other words, when an intended correction signal is stored in the node NM in advance, the correction signal can be added to the supplied image signal. Note that the correction signal is sometimes attenuated by a component on the transmission path; hence, the signal is preferably produced in consideration of the attenuation.

When the light-emitting device is made to emit light with the use of the image signal and the correction signal, the amount of current flowing through the light-emitting device can be increased, and high luminance can be achieved. A voltage higher than the output voltage of a source driver can be applied as the gate voltage of the driving transistor, so that power consumption of the source driver can be reduced. Since high-luminance light can be used for a light source, the sensitivity of the sensor can be increased.

This embodiment can be combined with the other embodiments as appropriate.

Embodiment 4

In this embodiment, electronic devices of one embodiment of the present invention will be described with reference to FIGS. 23A and 23B, FIGS. 24A to 24D, and FIGS. 25A to 25F.

An electronic device of this embodiment includes the display unit of one embodiment of the present invention. For example, the display unit of one embodiment of the present invention can be used in a display portion of the electronic device. The display unit of one embodiment of the present invention has a function of sensing light, and thus can perform biological authentication with the display portion or detect a touch or a near touch on the display portion. That is, the light-receiving device included in the display unit of one embodiment of the present invention can function as a touch sensor or part of a touch panel, thereby improving the functionality and convenience of the electronic device, for example.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 23A:
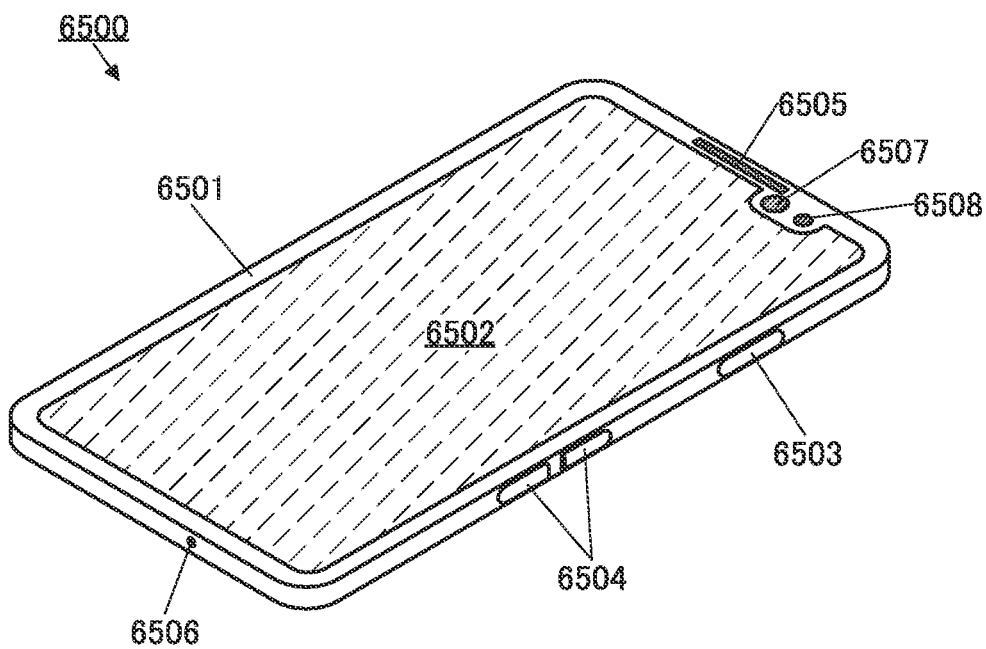
FIGS. 23A and 23B illustrate an example of an electronic device.

An electronic device 6500 in FIG. 23A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display unit of one embodiment of the present invention can be used in the display portion 6502.

Figure 23B:
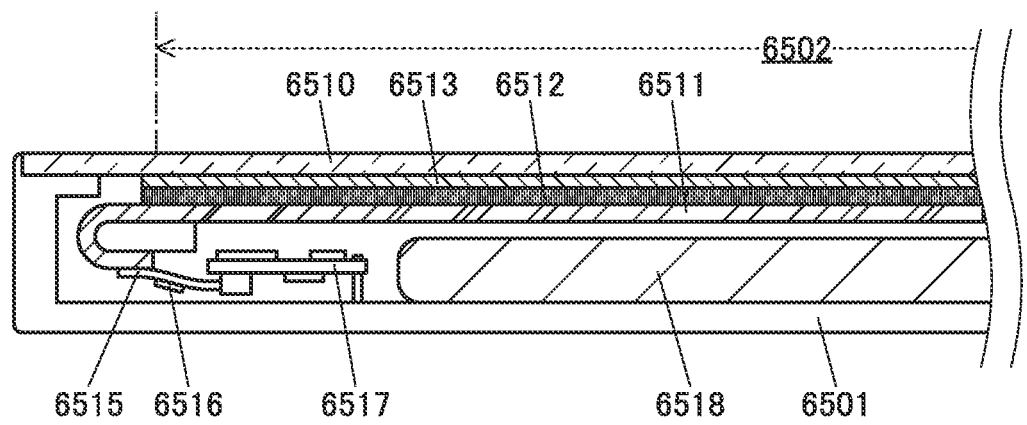

FIG. 23B is a schematic cross-sectional view including an end portion of the housing 6501 on the microphone 6506 side.

A protective component 6510 having a light-transmitting property is provided on the display surface side of the housing 6501. A display panel 6511, an optical component 6512, a touch sensor panel 6513, a printed circuit board 6517, a battery 6518, and the like are provided in a space surrounded by the housing 6501 and the protective component 6510.

The display panel 6511, the optical component 6512, and the touch sensor panel 6513 are fixed to the protective component 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be provided. Since the display panel 6511 is extremely thin, the battery 6518 with high capacity can be mounted with the thickness of the electronic device controlled. An electronic device with a narrow frame can be obtained when part of the display panel 6511 is folded back so that the portion connected to the FPC 6515 is positioned on the rear side of a pixel portion.

Figure 24A:
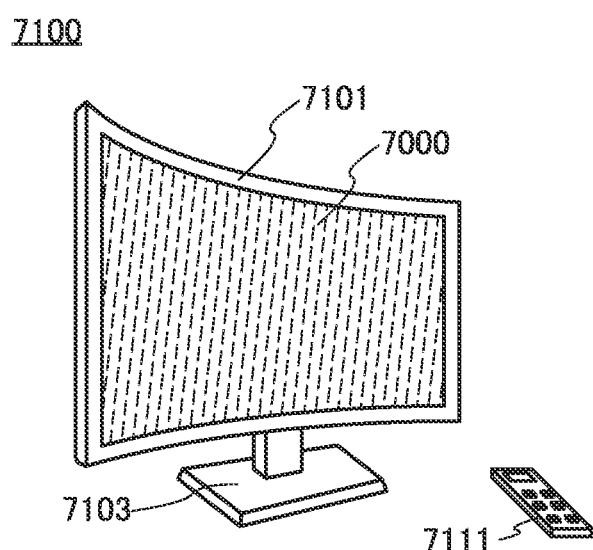
FIGS. 24A to 24D illustrate examples of electronic devices.

FIG. 24A illustrates an example of a television device. In a television device 7100, a display portion 7000 is incorporated in a housing 7101. Here, a structure in which the housing 7101 is supported by a stand 7103 is illustrated.

The display unit of one embodiment of the present invention can be used in the display portion 7000.

The television device 7100 illustrated in FIG. 24A can be operated with an operation switch provided in the housing 7101 or a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With a touch panel or operation keys provided in the remote controller 7111, channels and volume can be controlled, and videos displayed on the display portion 7000 can be controlled.

Note that the television device 7100 is provided with a receiver, a modem, and the like. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 24B:
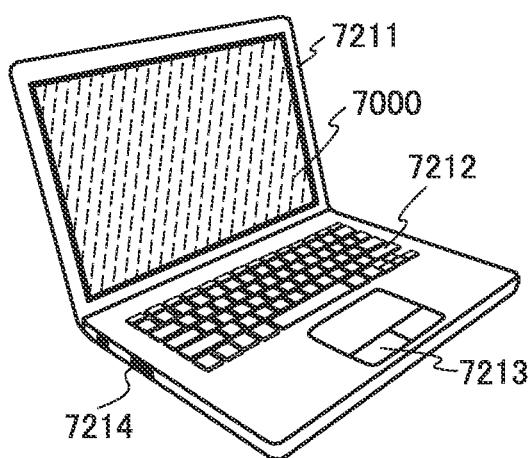

FIG. 24B illustrates an example of a laptop personal computer. A laptop personal computer 7200 includes a housing 7211, a keyboard 7212, a pointing device 7213, an external connection port 7214, and the like. The display portion 7000 is incorporated in the housing 7211.

The display unit of one embodiment of the present invention can be used in the display portion 7000.

Figure 24C:
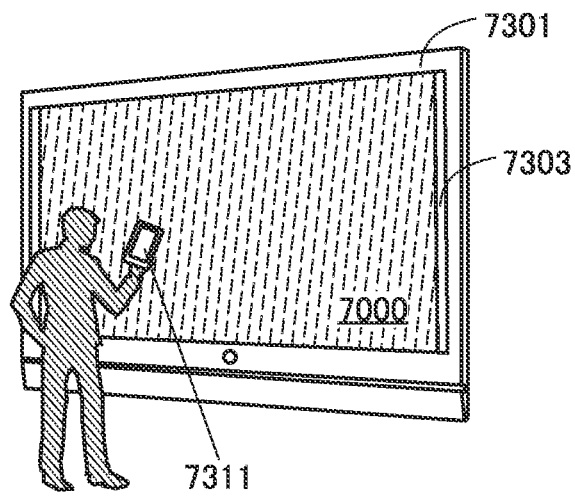
Figure 24D:
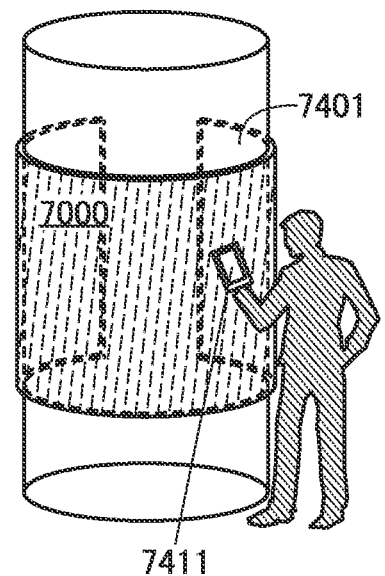

FIGS. 24C and 24D illustrate examples of digital signage.

Digital signage 7300 illustrated in FIG. 24C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 24D illustrates digital signage 7400 mounted on a cylindrical pillar 7401. The digital signage 7400 includes the display portion 7000 provided along a curved surface of the pillar 7401.

The display unit of one embodiment of the present invention can be used in the display portion 7000 illustrated in each of FIGS. 24C and 24D.

A larger area of the display portion 7000 can increase the amount of data that can be provided at a time. The larger display portion 7000 attracts more attention, so that the effectiveness of the advertisement can be increased, for example.

It is preferable to use a touch panel in the display portion 7000 because a device with such a structure does not just display still or moving images on the display portion 7000 but can be operated by users intuitively. Moreover, for an application for providing information such as route information or traffic information, usability can be enhanced by intuitive operation.

It is preferable that the digital signage 7300 or the digital signage 7400 work with an information terminal 7311 or an information terminal 7411 such as a user's smartphone through wireless communication, as illustrated in FIGS. 24C and 24D. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of people can join in and enjoy the game concurrently.

Electronic devices illustrated in FIGS. 25A to 25F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIGS. 25A to 25F have a variety of functions. For example, the electronic devices can have a function of displaying a variety of data (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may include a camera or the like and have a function of taking a still image or a moving image and storing the taken image in a recording medium (an external recording medium or a recording medium incorporated in the camera), a function of displaying the taken image on the display portion, or the like.

The electronic devices illustrated in FIGS. 25A to 25F are described in detail below.

Figure 25A:
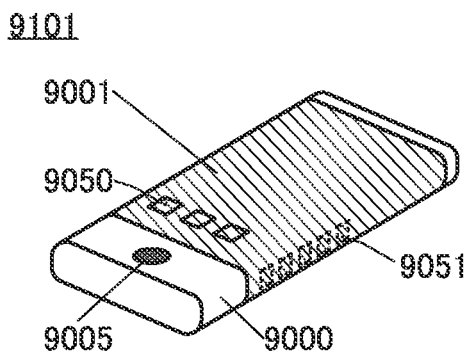
FIGS. 25A to 25F illustrate examples of electronic devices.

FIG. 25A is a perspective view illustrating a portable information terminal 9101. The portable information terminal 9101 can be used as a smartphone, for example. Note that the portable information terminal 9101 may be provided with the speaker 9003, the connection terminal 9006, the sensor 9007, or the like. The portable information terminal 9101 can display text and image information on its plurality of surfaces. FIG. 25A shows an example where three icons 9050 are displayed. Information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the reception strength of an antenna. Alternatively, the icon 9050 or the like may be displayed at the position where the information 9051 is displayed.

Figure 25C:
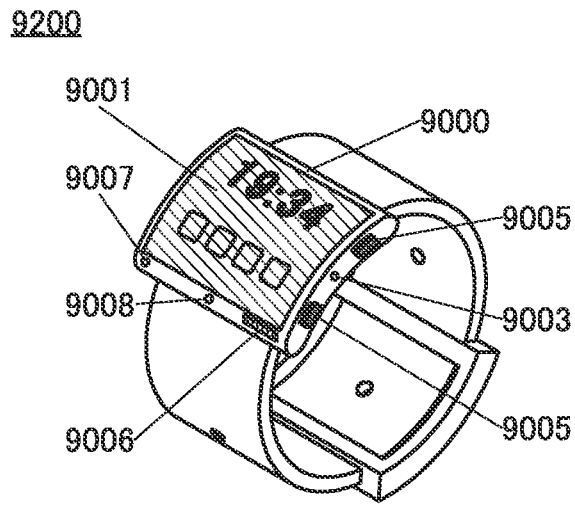
Figure 25B:
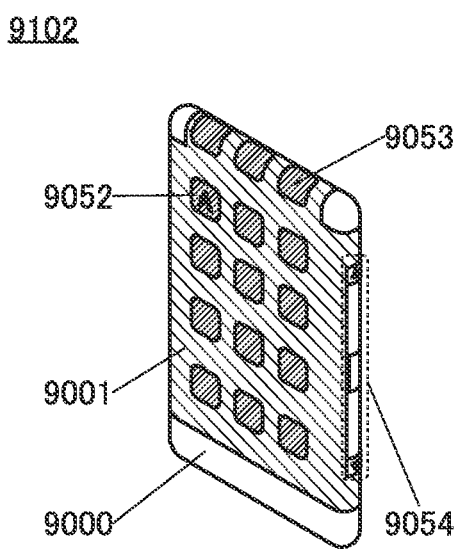

FIG. 25B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, the user can check the information 9053 displayed at a position that can be observed from above the portable information terminal 9102, with the portable information terminal 9102 put in a breast pocket of his/her clothes. The user can see the display without taking out the portable information terminal 9102 from the pocket and decide whether to answer the call, for example.

FIG. 25C is a perspective view illustrating a watch-type portable information terminal 9200. The portable information terminal 9200 can be used as a smart watch, for example. The display surface of the display portion 9001 is curved, and display can be performed along the curved display surface. Furthermore, for example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

Figure 25D:
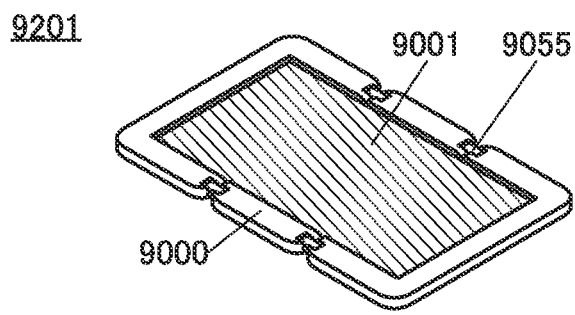
Figure 25E:
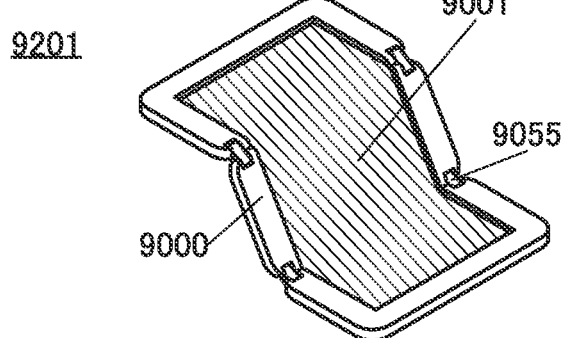
Figure 25F:
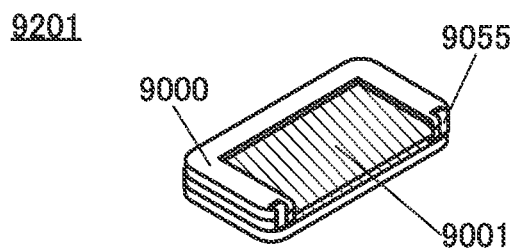

FIGS. 25D, 25E, and 25F are perspective views of a foldable portable information terminal 9201 that is opened, that is shifted from the opened state to the folded state or from the folded state to the opened state, and that is folded, respectively. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature of greater than or equal to 0.1 mm and less than or equal to 150 mm.

This embodiment can be combined with the other embodiments as appropriate.

Reference Example

In this reference example, methods for calculating the HOMO level, the LUMO level, and the electron mobility of an organic compound in the display unit of one embodiment of the present invention will be described.

The HOMO level and the LUMO level can be calculated through a cyclic voltammetry (CV) measurement.

In this reference example, an electrochemical analyzer (ALS model 600A or 600C, produced by BAS Inc.) was used as the measurement apparatus. A solution for the CV measurement was prepared in the following manner: tetra-n-butylammonium perchlorate (n-Bu$_4$NClO$_4$, produced by Tokyo Chemical Industry Co., Ltd., catalog No. T0836) as a supporting electrolyte was dissolved in dehydrated dimethylformamide (DMF, produced by Sigma-Aldrich Co. LLC., 99.8%, catalog No. 22705-6) as a solvent at a concentration of 100 mmol/L, and the object to be measured was dissolved therein at a concentration of 2 mmol/L. A platinum electrode (PTE platinum electrode manufactured by BAS Inc.) was used as a working electrode, another platinum electrode (Pt counter electrode for VC-3 (5 cm), manufactured by BAS Inc.) was used as an auxiliary electrode, and an Ag/Ag$^+$ electrode (RE7 reference electrode for nonaqueous solvent, manufactured by BAS Inc.) was used as a reference electrode. The measurement was conducted at room temperature (20° C. to 25° C.). The scan speed in the CV measurement was set to 0.1 V/sec, and an oxidation potential Ea [V] and a reduction potential Ec [V] with respect to the reference electrode were measured. The potential Ea was an intermediate potential of an oxidation-reduction wave, and the potential Ec was an intermediate potential of a reduction-oxidation wave. Here, the potential energy of the reference electrode used in this reference example with respect to the vacuum level is known to be −4.94 [eV]; the HOMO level and the LUMO level can be calculated by the following formulae: HOMO level [eV]=−4.94−Ea and LUMO level [eV]=−4.94−Ec.

The electron mobility can be measured by an impedance spectroscopy (IS) method.

As a method of measuring the carrier mobility of an EL material, a time-of-flight (TOF) method, a method using I-V characteristics of a space-charge-limited current (SCLC), or the like has been known for a long time. The TOF method needs a sample with a much larger thickness than that of an actual organic EL device. The SCLC method has a disadvantage in that electric field strength dependence of carrier mobility cannot be obtained, for example. Since an organic film required for the measurement employing the IS method is thin (approximately several hundreds of nanometers), the organic film can be formed of a relatively small amount of EL materials, whereby the mobility can be measured with a thickness close to the thickness of a film in an actual organic EL device. In this method, the electric field strength dependence of the carrier mobility can also be measured.

In the IS method, a micro sinusoidal voltage signal (V=V$_0$[exp(jωt)]) is applied to an EL device, and the impedance (Z=V/I) of the EL device is obtained from a phase difference between the current amplitude of a response current signal (I=I$_0$exp[j(ωt+φ)]) and the input signal. When the micro sinusoidal voltage signal that is changed from a high frequency voltage to a low frequency voltage is applied to the EL device, components having various relaxation times that contribute to the impedance can be separated and measured.

Here, admittance Y(=1/Z), which is the reciprocal of the impedance, can be represented by conductance G and susceptance B as shown in the following formula (1).

[Formula 1]

$$Y = \frac{1}{Z} = G + jB \quad (1)$$

In addition, by a single injection model, calculation of the following formulae (2) and (3) can be performed. Here, g in the formula (4) is differential conductance. In the formulae, C represents capacitance, θ represents a transit angle (ωT), ω represents angular frequency, and T represents transit time. For the analysis, the current equation, the Poisson equation and the current continuity equation are used, and a diffusion current and a trap state are ignored.

[Formula 2]

$$G = \frac{g\theta^3}{6} \frac{\theta - \sin\theta}{(\theta - \sin\theta)^2 + \left(\frac{\theta^2}{2} + \cos\theta - 1\right)^2} \quad (2)$$

$$B = \omega C = \frac{g\theta^3}{6} \frac{\frac{\theta^2}{2} + \cos\theta - 1}{(\theta - \sin\theta)^2 + \left(\frac{\theta^2}{2} + \cos\theta - 1\right)^2} \quad (3)$$

$$g = \frac{9}{4}\varepsilon\mu\frac{V_0}{d^3} \quad (4)$$

A method of calculating mobility from the frequency characteristics of capacitance is a −ΔB method. A method of calculating mobility from the frequency characteristics of conductance is a ωΔG method.

In practice, an electron-only device is first fabricated using the material whose electron mobility is intended to be calculated. The electron-only device is a device designed such that only electrons flow therein as carriers. In this specification, a method of calculating mobility from the frequency characteristics of capacitance (the −ΔB method) is described.

Figure 26:
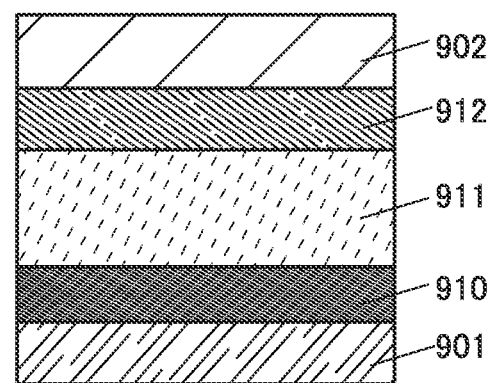
FIG. 26 illustrates a structure of an electron-only device.

FIG. 26 illustrates a structure of an electron-only device fabricated for the measurement, and Table 1 shows its specific components. The electron-only device fabricated in this reference example includes a first layer 910, a second layer 911, and a third layer 912 between a first electrode 901 (anode) and a second electrode 902 (cathode). The material whose electron mobility is intended to be calculated is used as a material for the second layer 911. In this reference example, the electron mobility of a film formed by co-evaporation of 2-{4-[9,10-di(naphthalen-2-yl)-2-anthryl]phenyl}-1-phenyl-1H-benzimidazole (abbreviation: ZADN) and 8-(quinolinolato)lithium (abbreviation: Liq) in a weight ratio of 1:1 was measured. In this reference example, the electron mobility was also measured for 7-[4-(10-phenyl-9-anthryl)phenyl]-7H-dibenzo[c,g]carbazole (abbreviation: cgDBCzPA) and 2-[3'-(dibenzothiophen-4-yl)biphenyl-3-yl]dibenzo[f,h]quinoxaline (abbreviation: 2mDBTBPDBq-II).

TABLE 1

| First electrode (anode) | | | First layer | Second layer | Third layer | Second electrode (cathode) |
|---|---|---|---|---|---|---|
| 100 nm | 50 nm | 100 nm | 1 nm | 200 nm | 1 nm | 100 nm |
| APC | ITSO | Al | Liq | ZADN:Liq (0.5:0.5) | Liq | Al |

Figure 27:
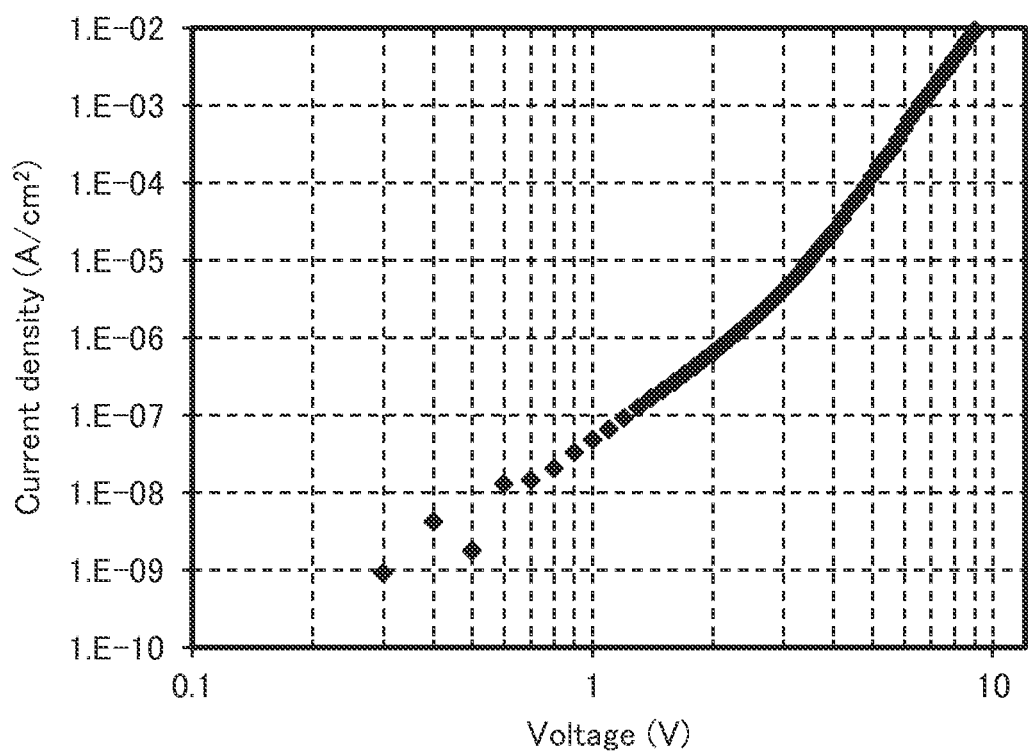
FIG. 27 shows current density-voltage characteristics of an electron-only device.

FIG. 27 shows the current density-voltage characteristics of the electron-only device using the film formed by co-evaporation of ZADN and Liq as the second layer 911.

Figure 28:
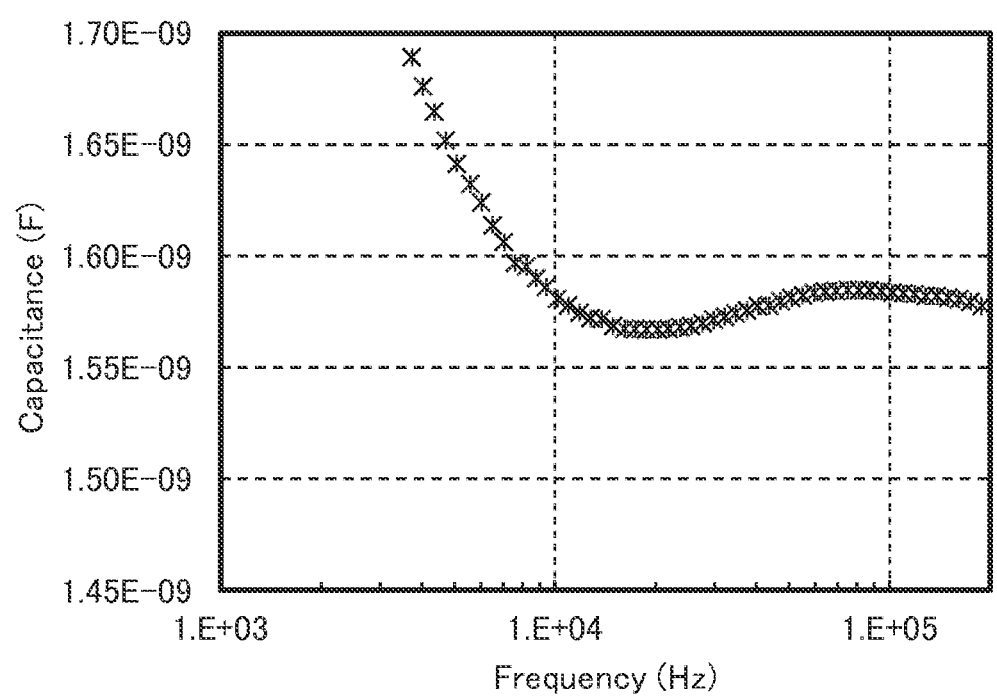
FIG. 28 shows frequency characteristics of capacitance (calculated at a DC voltage of 7.0 V when the ratio of ZADN to Liq is 1:1.

The impedance was measured under the conditions where the AC voltage was 70 mV and the frequency was from 1 Hz to 3 MHz with a DC voltage in the range of 5.0 V to 9.0 V applied. Here, capacitance is calculated from the admittance (the above formula (1)), which is the reciprocal of the obtained impedance. FIG. 28 shows the frequency characteristics of the calculated capacitance C when the applied voltage was 7.0 V.

The frequency characteristics of the capacitance C are obtained from a phase difference in current, which is caused because a space charge generated by carriers injected by the micro voltage signal cannot completely follow the micro AC voltage. The transit time of the carriers in the film is defined by time T it takes for the injected carriers to reach the counter electrode, and is represented by the following formula (5).

[Formula 3]

$$T = \frac{4}{3} \frac{L^2}{\mu V_0} \quad (5)$$

A negative susceptance change ($-\Delta B$) corresponds to a value ($-\omega \Delta C$) that is obtained by multiplying a capacitance change $-\Delta C$ by an angular frequency $\omega$. The formula (3) shows that there is a relation between peak frequency on the lowest frequency side $f_{max}$ ($=\omega_{max}/2\pi$) and the transit time T as represented in the following formula (6).

[Formula 4]

$$T = \frac{4.5}{2\pi f'_{max}} \quad (6)$$

Figure 29:
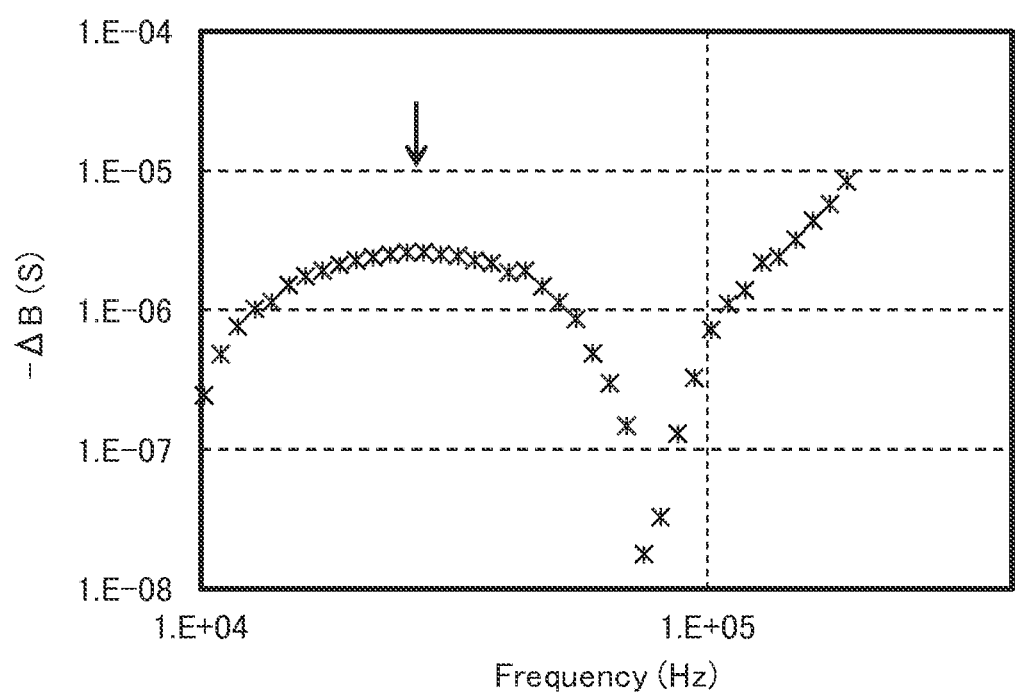
FIG. 29 shows frequency characteristics of $-\Delta B$ at a DC voltage of 7.0 V when the ratio of ZADN to Liq is 1:1.

FIG. 29 shows the frequency characteristics of $-\Delta B$ calculated from the above measurement (i.e., $-\Delta B$ when the DC voltage was 7.0 V). The peak frequency on the lowest frequency side $f_{max}$ is indicated by an arrow in FIG. 29.

The transit time T is obtained from $f_{max}$ obtained from the above measurement and analysis (the formula (6)); thus, in this example, the electron mobility at a DC voltage of 7.0 V can be obtained from the above formula (5). Through the same measurement with the DC voltage in the range of 5.0 V to 9.0 V, the electron mobility at each voltage (electric field strength) can be calculated, so that the electric field strength dependence of the mobility can also be measured.

Figure 30:
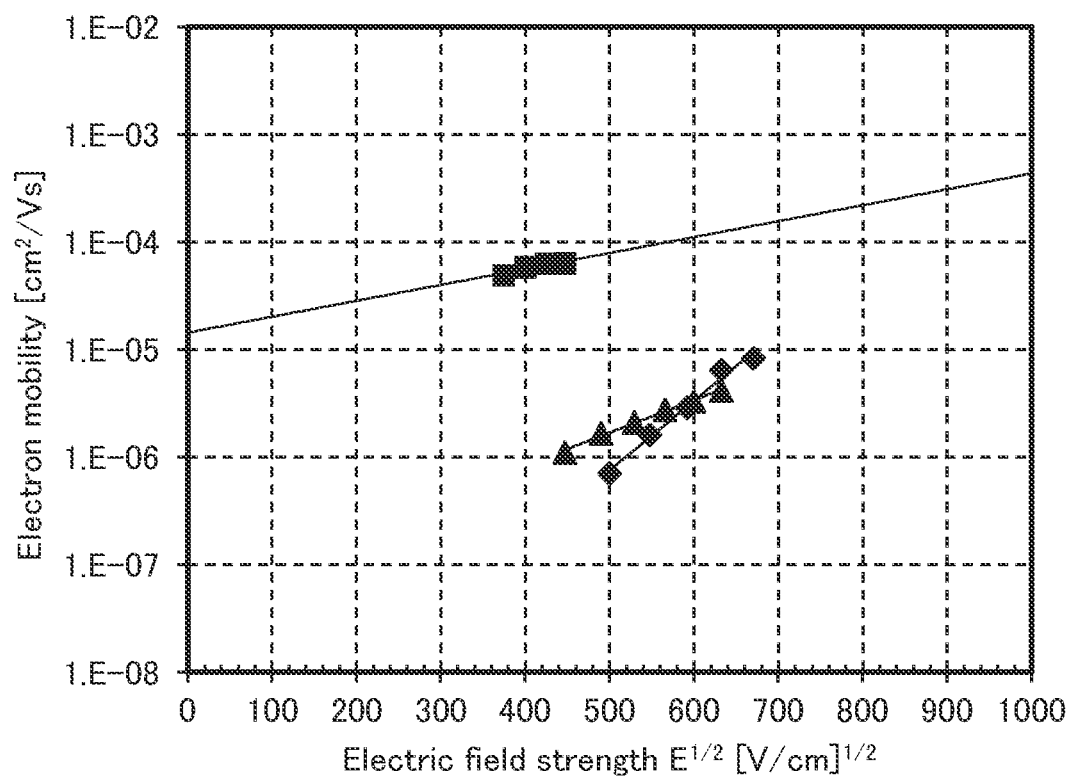
FIG. 30 shows electric field strength dependence of electron mobility of organic compounds.

FIG. 30 shows the electric field strength dependence of the electron mobility of the organic compounds, which was eventually obtained by the above calculation method. Table 2 shows the electron mobility read from FIG. 30 in the case where the square root of the electric field strength [V/cm] was 600 [V/cm]$^{1/2}$. In FIG. 30, a square represents the result of cgDBCzPA, a triangle represents the result of 2mDBTBPDBq-II, and a rhombus represents the result of the film formed by co-evaporation of ZADN and Liq.

TABLE 2

| | Electron mobility (cm$^2$/Vs) |
|---|---|
| cgDBCzPA | $7.7 \times 10^{-5}$ |
| 2mDBTBPDBq-II | $2.2 \times 10^{-5}$ |
| ZADN:Liq (1:1) | $3.5 \times 10^{-6}$ |

The electron mobility can be calculated in the above manner. Note that the following reference can be referred to for the details of the measurement method: T. Okachi et al., *Japanese Journal of Applied Physics*, Vol. 47, No. 12, pp. 8965-8972, 2008.

This application is based on Japanese Patent Application Serial No. 2019-126332 filed with Japan Patent Office on Jul. 5, 2019, the entire contents of which are hereby incorporated by reference.

What is claimed is:

1. A display unit comprising:
    a light-receiving device comprising:
        a first pixel electrode;
        an active layer over the first pixel electrode; and
        a common electrode over the active layer;
    a light-emitting device comprising:
        a second pixel electrode;
        a light-emitting layer over the second pixel electrode;
        an electron-transport layer over the light-emitting layer; and
        the common electrode over the electron-transport layer;
    a partition covering an edge of the first pixel electrode and an edge of the second pixel electrode; and
    a light-blocking layer between the light-receiving device and the light-emitting device,
    wherein the light-receiving device and the light-emitting device are adjacent to each other,
    wherein the partition is in contact with the first pixel electrode and the second pixel electrode,
    wherein the light-blocking layer is interposed between the partition and the common electrode,
    wherein the electron-transport layer comprises a first region and a second region,
    wherein each of the first region and the second region comprises an electron-transport material and a first substance,
    wherein the first region has a different concentration of the first substance from the second region, and
    wherein the first substance is one of a metal, a metallic salt, a metal oxide and an organometallic complex.

2. The display unit according to claim 1,
    wherein the first region is positioned between the light-emitting layer and the second region, and
    wherein the first region has a higher concentration of the first substance than the second region.

3. The display unit according to claim 1,
    wherein the electron-transport material has a highest occupied molecular orbital level higher than or equal to $-6.0$ eV, and
    wherein the electron-transport material has an electron mobility higher than or equal to $1 \times 10^{-7}$ cm$^2$/Vs and lower than or equal to $5 \times 10^{-5}$ cm$^2$/Vs when a square root of electric field strength is 600 (V/cm)$^{1/2}$.

4. The display unit according to claim 1,
wherein the light-emitting device further comprises a hole-injection layer,
wherein the hole-injection layer is in contact with one of the second pixel electrode and the common electrode,
wherein the one of the second pixel electrode and the common electrode is an anode,
wherein the hole-injection layer comprises a first compound and a second compound,
wherein the first compound has a property of accepting electrons from the second compound, and
wherein the second compound has a highest occupied molecular orbital level higher than or equal to −5.7 eV and lower than or equal to −5.4 eV.

5. The display unit according to claim 1,
wherein the light-receiving device further comprises the electron-transport layer over the active layer.

6. The display unit according to claim 1,
wherein the light-receiving device and the light-emitting device further comprise a common layer,
wherein the common layer is positioned over the first pixel electrode and the second pixel electrode,
wherein a first portion of the common layer and the active layer overlap each other, and
wherein a second portion of the common layer and the light-emitting layer overlap each other.

7. The display unit according to claim 6, wherein the light-blocking layer is interposed between the partition and the common layer.

8. The display unit according to claim 1, wherein the light-emitting device emits blue light.

9. The display unit according to claim 1, wherein the light-emitting device is a fluorescent device.

10. A display module comprising:
the display unit according to claim 1; and
one of a connector and an integrated circuit.

11. An electronic device comprising:
the display module according to claim 10; and
at least one of an antenna, a battery, a housing, a camera, a speaker, a microphone and an operation button.

* * * * *